United States Patent
Ahn et al.

(10) Patent No.: US 10,038,157 B2
(45) Date of Patent: Jul. 31, 2018

(54) WHITE ORGANIC LIGHT EMITTING DEVICE

(71) Applicant: LG Display Co., Ltd., Seoul (KR)

(72) Inventors: So Yeon Ahn, Seoul (KR); Chang Wook Han, Seoul (KR); Hong Seok Choi, Seoul (KR); Seung Ryong Joung, Gimpo-si (KR); Jung Soo Park, Seoul (KR); Min Gyu Lee, Daegu (KR)

(73) Assignee: LG Display Co., Ltd., Seoul (KR)

( * ) Notice: Subject to any disclaimer, the term of this patent is extended or adjusted under 35 U.S.C. 154(b) by 27 days.

(21) Appl. No.: 15/417,161

(22) Filed: Jan. 26, 2017

(65) Prior Publication Data

US 2017/0141338 A1   May 18, 2017

Related U.S. Application Data

(62) Division of application No. 14/720,405, filed on May 22, 2015, now Pat. No. 9,705,102.

(30) Foreign Application Priority Data

May 26, 2014  (KR) .................. 10-2014-0063238
Aug. 1, 2014  (KR) .................. 10-2014-0099121
Apr. 23, 2015  (KR) .................. 10-2015-0057516

(51) Int. Cl.
*H01L 51/00* (2006.01)
*H01L 51/50* (2006.01)
(Continued)

(52) U.S. Cl.
CPC .......... *H01L 51/504* (2013.01); *H01L 27/322* (2013.01); *H01L 27/3209* (2013.01);
(Continued)

(58) Field of Classification Search
CPC .................. H01L 51/504; H01L 27/3209
(Continued)

(56) References Cited

U.S. PATENT DOCUMENTS 7,862,906 B2   1/2011   Abe
2006/0040132 A1   2/2006   Liao et al.
(Continued)

FOREIGN PATENT DOCUMENTS

CN   101006594 A   7/2007
CN   104347807 A   2/2015
(Continued)

OTHER PUBLICATIONS

Office Action for Chinese Patent Application No. CN 201510272176.7, dated Jan. 6, 2017, 37 Pages.
(Continued)

*Primary Examiner* — Igwe U Anya
(74) *Attorney, Agent, or Firm* — Fenwick & West LLP

(57) ABSTRACT

Disclosed is a white organic light emitting device. The white organic light emitting device includes a first emission part between a first electrode and a second electrode, a second emission part on the first emission part, and a third emission part on the second emission part. At least one of the first to third emission parts includes at least two emission layers including a red emission layer, and a position of the red emission layer is set to enhance a color reproduction rate and at least one of red efficiency, green efficiency, and blue efficiency.

27 Claims, 23 Drawing Sheets

(51) Int. Cl.
 *H01L 51/52* (2006.01)
 *H01L 27/32* (2006.01)
(52) U.S. Cl.
 CPC ...... *H01L 51/5044* (2013.01); *H01L 51/5278* (2013.01); *H01L 2251/552* (2013.01)
(58) Field of Classification Search
 USPC .......................................................... 257/40
 See application file for complete search history.

(56) References Cited

U.S. PATENT DOCUMENTS

| | | | |
|---|---|---|---|
| 2007/0001587 A1 | 1/2007 | Hatwar et al. | |
| 2007/0126350 A1* | 6/2007 | Lee .................... | H01L 51/5036 |
| | | | 313/506 |
| 2007/0273270 A1* | 11/2007 | Jinde .................. | H01L 51/0054 |
| | | | 313/504 |
| 2008/0297036 A1 | 12/2008 | Noh et al. | |
| 2010/0090238 A1 | 4/2010 | Mori et al. | |
| 2011/0073844 A1 | 3/2011 | Pieh et al. | |
| 2013/0281693 A1 | 10/2013 | Inoue et al. | |
| 2014/0183499 A1* | 7/2014 | Kim .................... | H01L 27/3213 |
| | | | 257/40 |
| 2014/0191216 A1* | 7/2014 | Matsumoto ......... | H01L 51/5284 |
| | | | 257/40 |
| 2014/0312325 A1* | 10/2014 | Jang ..................... | H01L 27/322 |
| | | | 257/40 |
| 2015/0001506 A1 | 1/2015 | Kim et al. | |
| 2015/0034923 A1 | 2/2015 | Kim et al. | |
| 2015/0060812 A1* | 3/2015 | Kim .................... | H01L 51/5044 |
| | | | 257/40 |
| 2015/0155519 A1* | 6/2015 | Lee .................... | H01L 51/5265 |
| | | | 257/40 |
| 2015/0280159 A1 | 10/2015 | Kim et al. | |

FOREIGN PATENT DOCUMENTS

| | | |
|---|---|---|
| CN | 104953036 A | 9/2015 |
| EP | 2833407 A2 | 2/2015 |
| EP | 2846372 A1 | 3/2015 |
| KR | 20080105640 | 12/2008 |
| KR | 20110035048 | 4/2011 |
| KR | 20140032315 | 3/2014 |
| KR | 20140032315 A * | 3/2014 |
| WO | WO 2007/005200 A1 | 1/2007 |

OTHER PUBLICATIONS

Office Action for U.S. Appl. No. 14/720,405, dated Jun. 16, 2016, 15 Pages.

* cited by examiner

WHITE ORGANIC LIGHT EMITTING DEVICE

CROSS-REFERENCE TO RELATED APPLICATIONS

This application is a divisional of U.S. application Ser. No. 14/720,405, filed on May 22, 2015, which claims the benefit of the Korean Patent Application No. 10-2014-0063238 filed on May 26, 2014, Korean Patent Application No. 10-2014-0099121 filed on Aug. 1, 2014, and Korean Patent Application No. 10-2015-0057516 filed on Apr. 23, 2015, all of which are hereby incorporated by reference as if fully set forth herein.

BACKGROUND

Field of the Invention

The present invention relates to an organic light emitting device, and more particularly, to a white organic light emitting device for enhancing color purity, an emission intensity, a luminance, and a color reproduction rate of a device.

Discussion of the Related Art

Recently, as society advances to the information-oriented society, the field of display apparatuses which visually express an electrical information signal is rapidly advancing. Flat panel display (FPD) apparatuses, having excellent performance in terms of thinness, lightness, and low power consumption, have been developed.

Examples of the FPD apparatuses include LCD apparatuses, plasma display panel (PDP) apparatuses, field emission display (FED) apparatuses, organic light emitting display apparatuses, etc.

In particular, the organic light emitting display apparatuses are self-emitting devices. In comparison with other FPD apparatuses, the organic light emitting display apparatuses have a fast response time, high emission efficiency, high luminance, and a wide viewing angle.

An organic light emitting device includes an organic emission layer which is formed between two electrodes. An electron and a hole are injected from the two electrodes into the organic emission layer, and an exciton is generated by combining the electron with the hole. The organic light emitting device is a device using the principle that light is emitted when the generated exciton is dropped from an excited state to a ground state.

SUMMARY

In a related art organic light emitting device, emission characteristic and lifetime are limited due to an emission structure and a material of an organic emission layer. Therefore, various methods for enhancing an efficiency of an emission layer in a white organic light emitting device are proposed.

In one method, a structure may be provided where white light is emitted by stacking two emission layers having a complementary color relationship. However, in the structure, a difference between a peak wavelength range of each emission layer and a transmissive area of a color filter occurs when white light passes through the color filter. For this reason, a color range capable of expression is narrowed, and consequently, it is difficult to realize a desired color reproduction rate.

For example, when a blue emission layer and a yellow emission layer are stacked, a peak wavelength is provided in a blue wavelength range and a yellow wavelength range, and thus, white light is emitted. When the white light passes through red, green, and blue color filters, a transmittance of the blue wavelength range is lowered compared to a red or green wavelength range, and for this reason, emission efficiency and a color reproduction rate are lowered.

Moreover, an emission efficiency of a yellow phosphorescence emission layer is relatively higher than that of a blue fluorescence emission layer, and thus, panel efficiency and a color reproduction rate are reduced due to an efficiency difference between a phosphorescence emission layer and a fluorescence emission layer.

Furthermore, a transmittance ratio is lowered when adjusting a color filter for increasing a color reproduction rate, and for this reason, panel efficiency is lowered.

Therefore, the inventors recognize the above-described problems, and have experimented on various methods for increasing an emission efficiency of an emission layer and a color reproduction rate of a device. Through various experiments, the inventors have invented a white organic light emitting device having a new structure for enhancing color purity, luminance, and a color reproduction rate.

Accordingly, the present invention is directed to provide a white organic light emitting device that substantially obviates one or more problems due to limitations and disadvantages of the related art.

An aspect of the present invention is directed to provide a white organic light emitting device in which color purity and a color reproduction rate are enhanced by applying a structure having three emission peaks to three emission parts.

Another aspect of the present invention is directed to provide a white organic light emitting device for enhancing emission intensity, luminance, and a color reproduction rate.

The objects of the present invention are not limited to the aforesaid, but other objects not described herein will be clearly understood by those skilled in the art from descriptions below.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided a white organic light emitting device including: a first emission part between a first electrode and a second electrode; a second emission part on the first emission part; and a third emission part on the second emission part, wherein at least one of the first to third emission parts includes at least two emission layers having a red emission layer, and a position of the red emission layer is set to enhance a color reproduction rate and at least one of red efficiency, green efficiency, and blue efficiency.

The at least two emission layers may include the red emission layer and a blue emission layer.

When the first emission part may include the at least two emission layers, the blue emission layer may be closer to the first electrode than the red emission layer.

A color viewing angle may be more enhanced in a case, where the blue emission layer is closer to the first electrode than the red emission layer, than a case where the red emission layer is closer to the first electrode than the blue emission layer.

When the third emission part includes the at least two emission layers, the blue emission layer may be closer to the second electrode than the red emission layer.

A color viewing angle may be more enhanced in a case, where the blue emission layer is closer to the second electrode than the red emission layer, than a case where the red emission layer is closer to the second electrode than the blue emission layer.

The first emission part or the third emission part may have two emission peaks, the two emission peaks are within a range of 440 nm to 480 nm and within a range of 600 nm to 650 nm.

The blue emission layer may include at least one of a blue emission layer, a deep blue emission layer, and a sky blue emission layer.

A host in the red emission layer may include a host having a shorter wavelength range than a wavelength range of red so that an emission efficiency of each of the blue emission layer and the red emission layer is enhanced and a driving voltage is reduced.

An energy gap between a host and a dopant in the red emission layer may be greater than an energy gap between a host and a dopant in the blue emission layer, so that an emission efficiency of each of the blue emission layer and the red emission layer is enhanced and a driving voltage is reduced.

An energy gap of the host in the blue emission layer may be 2.8 eV to 3.2 eV, and an energy gap of the dopant in the blue emission layer may be 2.6 eV to 3.0 eV.

An energy gap of the host in the red emission layer may be 2.6 eV to 3.0 eV, and an energy gap of the dopant in the red emission layer may be 1.8 eV to 2.2 eV.

The energy gap between the host and the dopant in the blue emission layer may be equal to or less than 0.4 eV, and the energy gap between the host and the dopant in the red emission layer may be greater than 0.4 eV and 1.2 eV or less.

The second emission part may include at least one of a green emission layer and a yellow-green emission layer.

An emission peak of the green emission layer may be within a range of 510 nm to 570 nm, and an emission peak of the yellow-green emission layer may be within a range of 540 nm to 580 nm.

The green emission layer may be at a shorter wavelength than a wavelength of the yellow-green emission layer to enhance green efficiency.

The first emission part may have an emission peak which is within a range of 440 nm to 480 nm, and the second emission part may have an emission peak which is within a range of 510 nm to 580 nm.

The first emission part may have an emission peak which is within a range of 510 nm to 580 nm, and the second emission part may have an emission peak which is within a range of 440 nm to 480 nm.

The second emission part may have an emission peak which is within a range of 510 nm to 580 nm, and the third emission part may have an emission peak which is within a range of 440 nm to 480 nm.

The second emission part may have an emission peak which is within a range of 440 nm to 480 nm, and the third emission part may have an emission peak which is within a range of 510 nm to 580 nm.

In another aspect of the present invention, there is provided a white organic light emitting device including: a first emission part between a first electrode and a second electrode; a second emission part on the first emission part; and a third emission part on the second emission part, wherein at least one of the first to third emission parts includes an emission layer having a red emission layer to enhance emission efficiency and a color reproduction rate or a color viewing angle, and the first to third emission parts have a three-emission region-three emission peak (TER-TEP) structure having three or more emission peaks.

The first emission part may include the red emission layer and a blue emission layer.

A color viewing angle may be more enhanced in a case, where the blue emission layer is closer to the first electrode than the red emission layer, than a case where the red emission layer is closer to the first electrode than the blue emission layer.

A host in the red emission layer may include a host having a shorter wavelength range than a wavelength range of red so that an emission efficiency of each of the blue emission layer and the red emission layer is enhanced and a driving voltage is reduced.

An energy gap between a host and a dopant in the red emission layer may be greater than an energy gap between a host and a dopant in the blue emission layer, so that an emission efficiency of each of the blue emission layer and the red emission layer is enhanced and a driving voltage is reduced.

An energy gap of the host in the blue emission layer may be 2.8 eV to 3.2 eV, and an energy gap of the dopant in the blue emission layer may be 2.6 eV to 3.0 eV.

An energy gap of the host in the red emission layer may be 2.6 eV to 3.0 eV, and an energy gap of the dopant in the red emission layer may be 1.8 eV to 2.2 eV.

The energy gap between the host and the dopant in the blue emission layer may be equal to or less than 0.4 eV, and the energy gap between the host and the dopant in the red emission layer may be greater than 0.4 eV and 1.2 eV or less.

The first emission part has two emission peaks, the two emission peaks may be within a range of 440 nm to 480 nm and within a range of 600 nm to 650 nm.

The second emission part may have an emission peak which is within a range of 510 nm to 580 nm, and the third emission part may have an emission peak which is within a range of 440 nm to 480 nm.

The second emission part may have an emission peak which is within a range of 440 nm to 480 nm, and the third emission part may have an emission peak which is within a range of 510 nm to 580 nm.

The third emission part may include the red emission layer and a blue emission layer.

A color viewing angle may be more enhanced in a case, where the blue emission layer is closer to the second electrode than the red emission layer, than a case where the red emission layer is closer to the second electrode than the blue emission layer.

The third emission part may have two emission peaks, the two emission peaks are within a range of 440 nm to 480 nm and within a range of 600 nm to 650 nm.

The first emission part may have an emission peak which is within a range of 440 nm to 480 nm, and the second emission part may have an emission peak which is within a range of 510 nm to 580 nm.

The first emission part may have an emission peak which is within a range of 510 nm to 580 nm, and the second emission part may have an emission peak which is within a range of 440 nm to 480 nm.

In another aspect of the present invention, there is provided a white organic light emitting device including: a first emission part between a first electrode and a second electrode; and a second emission part on the first emission part, wherein at least one of the first and second emission parts includes at least two emission layers having a red emission layer, and a position of the red emission layer is set to enhance a color reproduction rate and at least one of red efficiency, green efficiency, and blue efficiency.

The first emission part may be configured with at least two emission layers, and the at least two emission layers comprise the red emission layer and a blue emission layer.

A color viewing angle may be more enhanced in a case where the blue emission layer is closer to the first electrode than the red emission layer, than a case where the red emission layer is closer to the first electrode than the blue emission layer.

The first emission part may have two emission peaks which respectively are within a range of 440 nm to 480 nm and within a range of 600 nm to 650 nm.

A host in the red emission layer may include a host having a shorter wavelength range than a wavelength range of the red emission layer so that an emission efficiency of each of the blue emission layer and the red emission layer is enhanced and a driving voltage is reduced.

An energy gap between a host and a dopant in the red emission layer may be greater than an energy gap between a host and a dopant in the blue emission layer, so that an emission efficiency of each of the blue emission layer and the red emission layer is enhanced and a driving voltage is reduced.

An energy gap of the host in the blue emission layer may be 2.8 eV to 3.2 eV, and an energy gap of the dopant in the blue emission layer may be 2.6 eV to 3.0 eV.

An energy gap of the host in the red emission layer may be 2.6 eV to 3.0 eV, and an energy gap of the dopant in the red emission layer may be 1.8 eV to 2.2 eV.

The energy gap between the host and the dopant in the blue emission layer may be equal to or less than 0.4 eV, and the energy gap between the host and the dopant in the red emission layer may be greater than 0.4 eV and 1.2 eV or less.

An emission peak of the second emission part may be within a range of 510 nm to 580 nm.

In another aspect of the present invention, there is provided a white organic light emitting device including: a first emission part between a first electrode and a second electrode; and a second emission part on the first emission part, wherein at least one of the first and second emission parts includes an emission layer including a red emission layer to enhance an emission efficiency and a color reproduction rare or color viewing angle, and the first and second emission parts have a two-emission region-three emission peak (TER-TEP) structure having three or more emission peaks The first emission part may include at least two emission layers, and the at least two emission layers comprise the red emission layer and a blue emission layer.

A color viewing angle may be more enhanced in a case, where the blue emission layer is closer to the first electrode than the red emission layer, than a case where the red emission layer is closer to the first electrode than the blue emission layer.

The first emission part may have two emission peaks which respectively are within a range of 440 nm to 480 nm and within a range of 600 nm to 650 nm.

A host in the red emission layer may include a host having a shorter wavelength range than a wavelength range of the red emission layer so that an emission efficiency of each of the blue emission layer and the red emission layer is enhanced and a driving voltage is reduced.

An energy gap between a host and a dopant in the red emission layer may be greater than an energy gap between a host and a dopant in the blue emission layer, so that an emission efficiency of each of the blue emission layer and the red emission layer is enhanced and a driving voltage is reduced.

An energy gap of the host in the blue emission layer may be 2.8 eV to 3.2 eV, and an energy gap of the dopant in the blue emission layer may be 2.6 eV to 3.0 eV.

An energy gap of the host in the red emission layer may be 2.6 eV to 3.0 eV, and an energy gap of the dopant in the red emission layer may be 1.8 eV to 2.2 eV.

The energy gap between the host and the dopant in the blue emission layer may be equal to or less than 0.4 eV, and the energy gap between the host and the dopant in the red emission layer may be greater than 0.4 eV and 1.2 eV or less.

An emission peak of the second emission part may be within a range of 510 nm to 580 nm.

Details of embodiments are included in a detailed description and the drawings.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Figure 1:
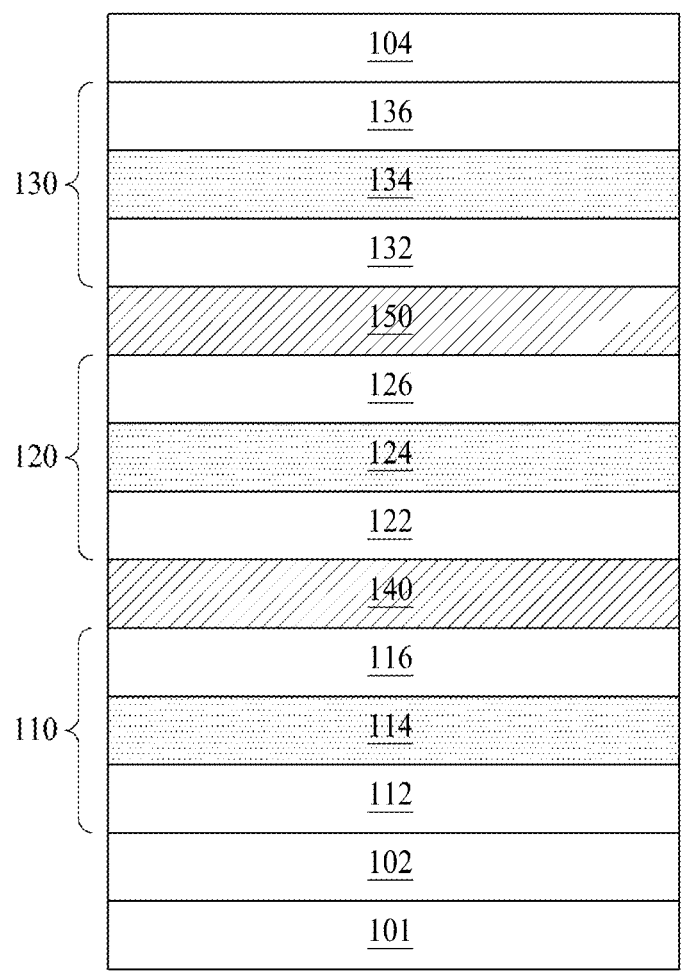
FIG. 1 is a diagram illustrating a white organic light emitting device according to a first embodiment of the present invention.

Reference will now be made in detail to the exemplary embodiments of the present invention, examples of which are illustrated in the accompanying drawings. Wherever possible, the same reference numbers will be used throughout the drawings to refer to the same or like parts.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known function or configuration is determined to unnecessarily obscure the important point of the present invention, the detailed description will be omitted. In a case where "comprise", "have", and "include" described in the present specification are used, another part may be added unless "only" is used. The terms of a singular form may include plural forms unless referred to the contrary.

In construing an element, the element is construed as including an error range although there is no explicit description.

In describing a position relationship, for example, when a position relation between two parts is described as "on", "over", "under", and "next", one or more other parts may be disposed between the two parts unless "just" or "direct" is used.

In describing a time relationship, for example, when the temporal order is described as "after", "subsequent", "next", and "before", a case which is not continuous may be included unless "just" or "direct" is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, embodiments of the present invention will be described in detail with reference to the accompanying drawings.

FIG. 1 is a diagram illustrating a white organic light emitting device 100 according to a first embodiment of the present invention.

The white organic light emitting device 100 illustrated in FIG. 1 includes substrate 101, first and second electrodes 102 and 104 and a first emission part 110, a second emission part 120 and a third emission part130 between the first and second electrodes 102 and 104.

The first electrode 102 is an anode that supplies a hole, and may be formed of indium tin oxide (ITO) or indium zinc oxide (IZO) which is a transparent conductive material such as transparent conductive oxide (TCO). However, the present embodiment is not limited thereto.

The second electrode 104 is a cathode that supplies an electron, and may be formed of gold (Au), silver (Ag), aluminum (Al), molybdenum (Mo), or magnesium (Mg) which is a metal material, or may be formed of an alloy thereof. However, the present embodiment is not limited thereto.

Each of the first electrode 102 and the second electrode 104 may be referred to as an anode or a cathode.

The first emission part 110 may include a first hole transport layer (HTL) 112, a first emission layer (EML) 114, and a first electron transport layer (ETL) 116 which are disposed on the first electrode 102.

The first EML 114 may be configured with a blue emission layer.

The second emission part 120 may include a second HTL 122, a first EML 124, and a second ETL 126.

The first EML 124 of the second emission part 120 may be configured with a yellow-green emission layer.

A first charge generation layer (CGL) 140 may be further formed between the first emission part 110 and the second emission part 120. The first CGL 140 may adjust a balance of charges between the first emission part 110 and the second emission part 120. The first CGL 140 may include an N-type CGL and a P-type CGL.

The third emission part 130 may include a third ETL 136, a first EML 134, and a third HTL 132 which are disposed under the second electrode 104.

The first EML 134 of the third emission part 130 may be configured with a blue emission layer.

A second CGL 150 may be further formed between the second emission part 120 and the third emission part 130. The second CGL 150 may adjust a balance of electrical charges between the second emission part 120 and the third emission part 130. The second CGL 150 may include an N-type CGL and a P-type CGL.

In such a structure, in the yellow-green emission layer which is the first EML 124 of the second emission part 120, a red area and a green area should all emit light, and for this reason, an emission efficiency of each of the red area and the green area is lowered. Particularly, since an emission intensity of the red area which is a long-wavelength area is low, red efficiency is further lowered.

Furthermore, a wavelength where a transmittance ratio of a color layer is the maximum does not match an emission peak of the yellow-green emission layer, and for this reason, red efficiency and green efficiency are lowered.

Moreover, in a white organic light emitting device which realizes red, green, and blue by using the color layer, a color purity of red is reduced. This is because an emission intensity of a short-wavelength range which reduces color purity is greater than that of a long-wavelength range, and for this reason, a color purity of red is reduced.

Moreover, when an emission part including a red emission layer is further provided in a structure of FIG. 1 so as to increase red efficiency, a thickness of a device increases, causing an increase in a driving voltage.

Therefore, the inventors have invented a white organic light emitting device, having a new structure where one emission part includes two emission layers, for improving red efficiency and green efficiency and improving a color reproduction rate (or color gamut) which is lowered due to a reduction in color purities of red and green.

Therefore, the inventors have invented a structure which has maximum emission efficiency because two emission layers having different emission peaks are provided in one emission part.

According to the present embodiment, in an organic light emitting device including three emission parts, at least one emission part may be configured with two emission layers including a red emission layer, and the two emission layers may include a blue emission layer and the red emission layer. Also, one of the three emission parts may be configured with a green emission layer. Alternatively, in an organic light emitting device including two emission parts, at least one emission part may be configured with two emission layers including a red emission layer, and the two emission layers may include a blue emission layer and the red emission layer. Also, through various experiments, the inventors have recognized that when at least one emission part is configured with two emission layers including a red emission layer, an emission intensity of an emission layer or a color viewing angle change rate is affected by a position of the red emission layer. Therefore, in the present embodiment, a position of a red emission layer may be set so as to enhance a color viewing angle change rate and at least one of red efficiency, green efficiency, and blue efficiency. This will be described in detail with reference to FIGS. 2 to 7.

Figure 2:
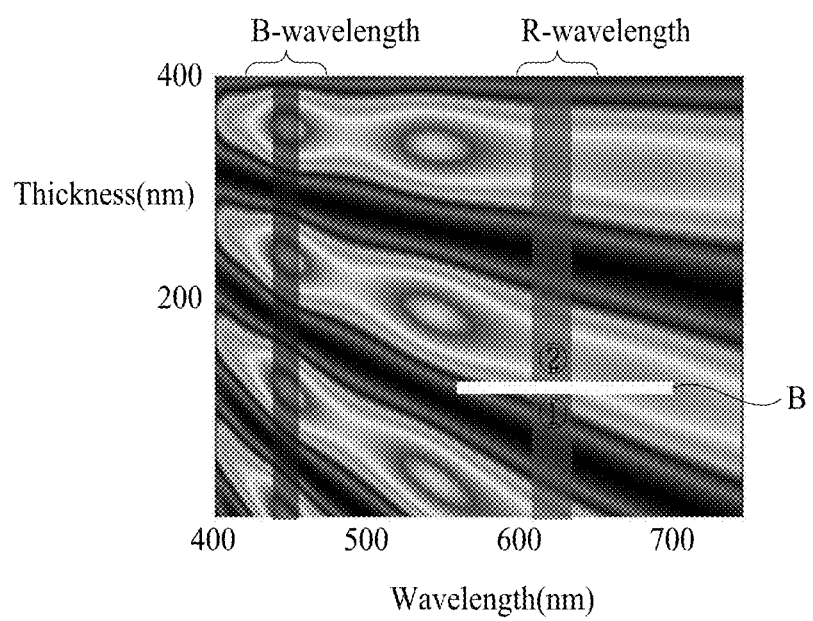
FIG. 2 is a diagram illustrating an emission position of an emission layer according to a second embodiment of the present invention.

FIG. 2 is a diagram illustrating an emission position of an emission layer according to a second embodiment of the present invention.

In FIG. 2, the abscissa axis indicates a wavelength range (nm) of light, and the ordinate axis indicates a thickness (nm) of organic layers configuring an emission part. The thickness does not limit the scope of the present invention. Also, FIG. 2 may be referred to as a contour map.

FIG. 2 illustrates a position of a red emission layer when a first emission part is configured with two emission layers including a red emission layer.

In FIG. 2, a position of a blue emission layer configuring the first emission part is referred to by B. An emission peak of an emission area of the blue emission layer may be within a range of 440 nm to 480 nm, and the range is referred to by B-wavelength. Also, an emission peak of an emission area of the red emission layer may be within a range of 600 nm to 650 nm, and the range is referred to by R-wavelength.

A position of the red emission layer configuring the first emission part may be a position which satisfies the B-wavelength range and the R-wavelength range. Therefore, the position of the red emission layer may be ① position below the position B of the blue emission layer or may be ② position above the position B of the blue emission layer.

Moreover, the inventors have checked emission intensity and an emission curve which are shown with respect to a positon of a red emission layer when one emission part includes a blue emission layer and a red emission layer. This is illustrated in FIG. 3.

Figure 3:
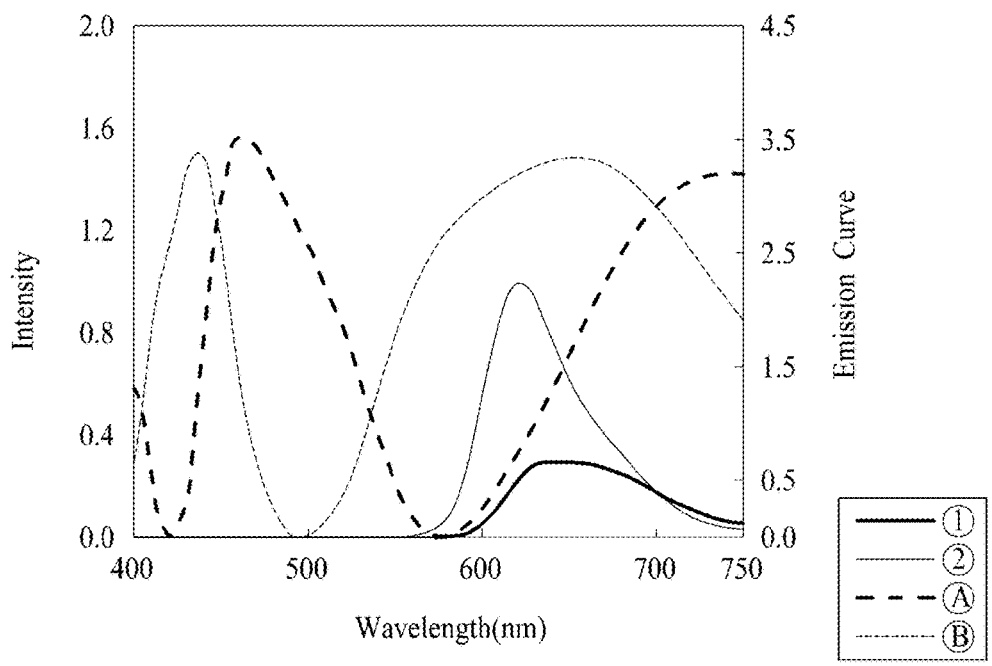
FIG. 3 is a diagram illustrating emission intensity and an emission curve at the emission position of the emission layer according to the second embodiment of the present invention.

In FIG. 3, the abscissa axis indicates a wavelength range (nm) of light, the left ordinate axis indicates emission intensity, and the right ordinate axis indicates an emission curve. FIG. 3 illustrates an electroluminescence (EL) spectrum and the emission curve. The emission intensity may be a numerical value which is expressed as a relative value with respect to a maximum value of the EL spectrum.

FIG. 3 is a diagram illustrating emission intensity and an emission curve of a red emission layer with respect to a wavelength at ① position below a blue emission layer and ② position above the blue emission layer when a first emission part is configured with the red emission layer and the blue emission layer.

As illustrated in FIG. 3, it can be seen that emission intensity further increases at ② position than ① position in a range of 600 nm to 650 nm which is a range of an emission peak of an emission area of the red emission layer.

Ⓐ refers to an emission curve at ① position, and Ⓑ refers to an emission curve at ② position. As illustrated, in the emission curve Ⓑ, it can be seen that emission intensity increases at 600 nm to 650 nm which is the emission peak of the emission area of the red emission layer. On the other hand, it can be seen that an emission intensity of the emission curve Ⓐ decreases at 600 nm to 650 nm in comparison with the emission curve Ⓑ.

Therefore, as a result of an EL spectrum and an emission curve corresponding to emission intensity, it can be seen that in the first emission part, ② position above the blue emission layer is more suitable for a position of the red emission layer for a device structure.

Moreover, the inventors have checked that when one emission part is configured with a blue emission layer and a red emission layer, a color viewing angle change rate based on a viewing angle is affected by a position of the red emission layer. This is illustrated in FIG. 4.

Figure 4:
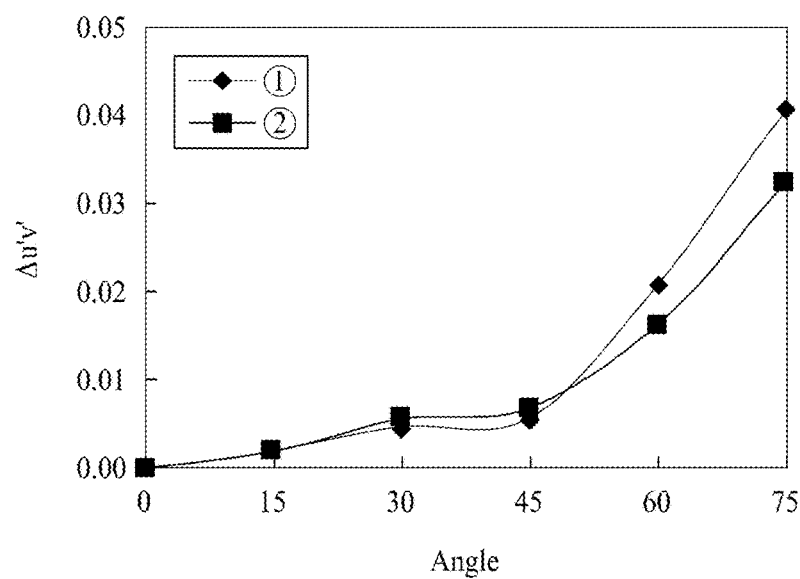
FIG. 4 is a diagram illustrating a color viewing angle based on a change in a viewing angle at the emission position of the emission layer according to the second embodiment of the present invention.

In FIG. 4, the abscissa axis indicates a viewing angle, and the ordinate axis indicates a color viewing angle change rate "Δu'v'". As illustrated in FIG. 4, the color viewing angle change rate has been measured at 0 degrees, 15 degrees, 30 degrees, 45 degrees, and 60 degrees while looking at a device from the front.

FIG. 4 illustrates a case where a first emission part is configured with two emission layers. As illustrated in FIG. 4, it can be seen that the color viewing angle change rate "Δu'v'" based on a viewing angle is lower at ② position than ① position, and thus, a change in white is small. For example, when a viewing angle is 60 degrees, the color viewing angle change rate "Δu'v'" is 0.0207 at ① position, and the color viewing angle change rate "Δu'v'" is 0.0162 at ② position. That is, it can be seen that the color viewing angle change rate "Δu'v'" is lower at ② position than ① position.

Therefore, as a result of the color viewing angle change rate "Δu'v'" based on a viewing angle, it can be seen that in the first emission part 110, when the red emission layer is disposed on the blue emission layer, the color viewing angle change rate "Δu'v'" is low. Also, it can be seen that since the color viewing angle change rate "Δu'v'" based on a viewing angle is low, a color change of white is small. Also, it can be seen that since the color viewing angle change rate "Δu'v'" based on a viewing angle is low, a color is prevented from being moved, and an influence of the color viewing angle change rate "Δu'v'" on display quality is small.

As described above with reference to FIGS. 2 to 4, in a case where the first emission part is configured with the two emission layers including the red emission layer, when the blue emission layer is disposed closer to the first electrode than the red emission layer, a color viewing angle change rate and at least one among red efficiency, green efficiency, and blue efficiency are enhanced.

Figure 5:
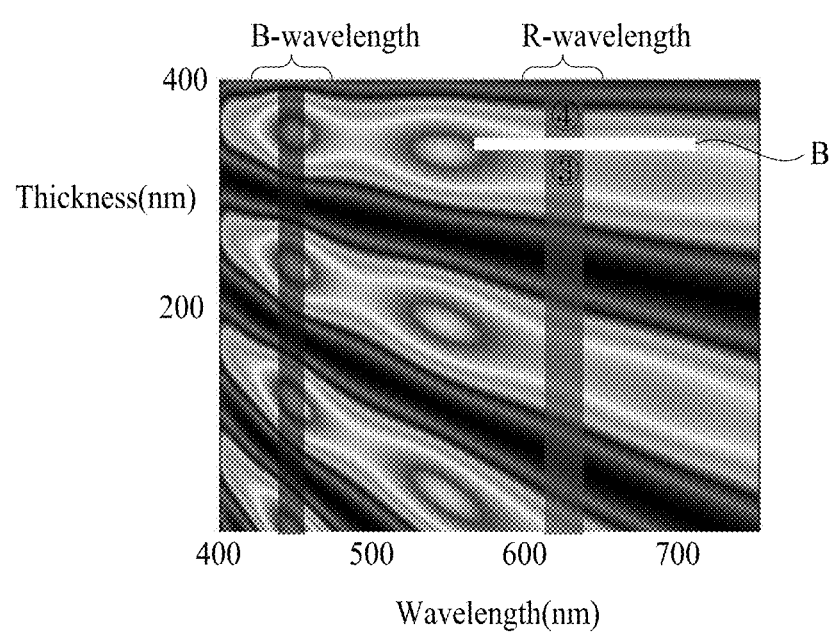
FIG. 5 is a diagram illustrating an emission position of an emission layer according to a third embodiment of the present invention.

FIG. 5 illustrates a position of a red emission layer when a third emission part is configured with two emission layers including a red emission layer, according to a third embodiment of the present invention.

In FIG. 5, the abscissa axis indicates a wavelength range (nm) of light, and the ordinate axis indicates a thickness (nm) of organic layers configuring an emission part. The thickness does not limit the scope of the present invention. Also, FIG. 5 may be referred to as a contour map.

In FIG. 5, a position of the blue emission layer is referred to by B. An emission peak of an emission area of the blue emission layer may be within a range of 440 nm to 480 nm, and the range is referred to by B-wavelength. Also, an emission peak of an emission area of the red emission layer may be within a range of 600 nm to 650 nm, and the range is referred to by R-wavelength.

A position of the red emission layer configuring the third emission part may be a position which satisfies the B-wavelength range and the R-wavelength range. Therefore, the position of the red emission layer may be ③ position below the position B of the blue emission layer or may be ④ position above the position B of the blue emission layer.

Moreover, the inventors have checked emission intensity and an emission curve which are shown with respect to a positon of a red emission layer when one emission part includes a blue emission layer and a red emission layer. This is illustrated in FIG. 6.

Figure 6:
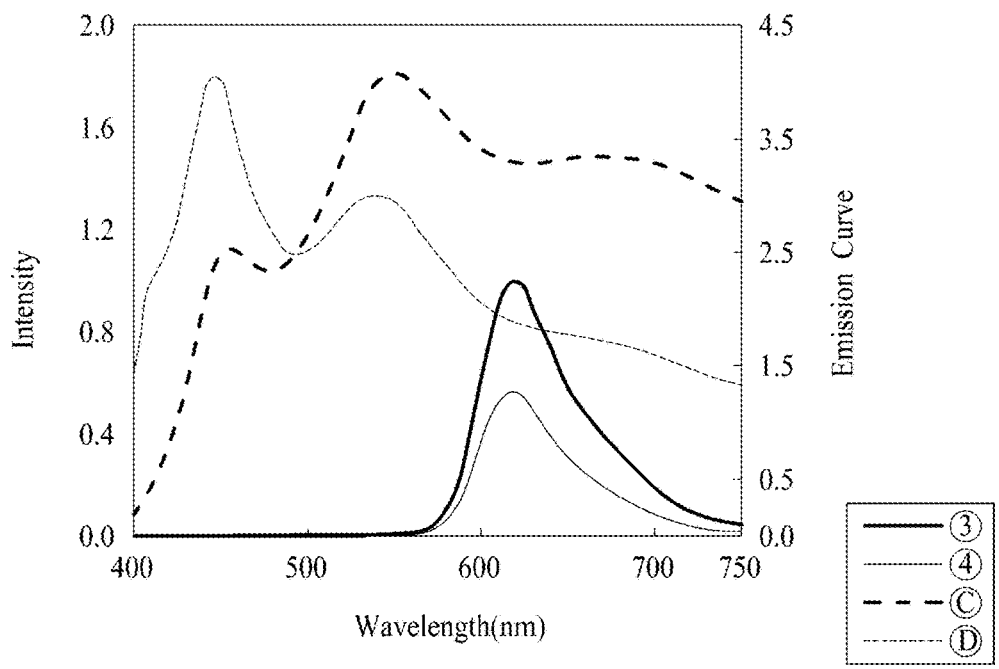
FIG. 6 is a diagram illustrating emission intensity and an emission curve at the emission position of the emission layer according to the third embodiment of the present invention

In FIG. 6, the abscissa axis indicates a wavelength range (nm) of light, the left ordinate axis indicates emission intensity, and the right ordinate axis indicates an emission curve. FIG. 6 illustrates an EL spectrum and the emission curve. The emission intensity may be a numerical value which is expressed as a relative value with respect to a maximum value of the EL spectrum.

FIG. 6 is a diagram illustrating emission intensity and an emission curve of a red emission layer with respect to a wavelength at ③ position below a blue emission layer and ④ position above the blue emission layer when a third emission part is configured with the red emission layer and the blue emission layer.

As illustrated in FIG. 6, it can be seen that emission intensity further increases at ③ position than ④ position in a range of 600 nm to 650 nm which is a range of an emission peak of an emission area of the red emission layer.

Ⓒ refers to an emission curve at ③ position, and Ⓓ refers to an emission curve at ④ position. As illustrated, in the emission curve Ⓒ, it can be seen that emission intensity increases at 600 nm to 650 nm which is the emission peak of the emission area of the red emission layer. On the other hand, it can be seen that an emission intensity of the emission curve Ⓓ decreases at 600 nm to 650 nm in comparison with the emission curve Ⓒ.

Therefore, as a result of emission intensity and an emission curve, it can be seen that in the third emission part, ③ position above the blue emission layer is more suitable for a position of the red emission layer for a device structure.

Moreover, the inventors have checked that when one emission part is configured with a blue emission layer and a red emission layer, a color viewing angle change rate based on a viewing angle is affected by a position of the red emission layer. This is illustrated in FIG. 7.

Figure 7:
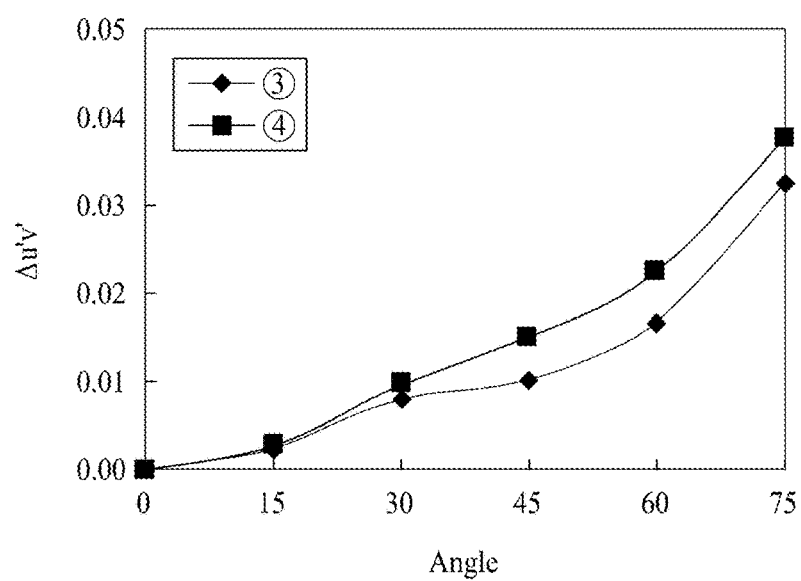
FIG. 7 is a diagram illustrating a color viewing angle based on a change in a viewing angle at the emission position of the emission layer according to the third embodiment of the present invention.

In FIG. 7, the abscissa axis indicates a viewing angle, and the ordinate axis indicates a color viewing angle change rate "Δu'v'". As illustrated in FIG. 7, the color viewing angle change rate has been measured at 0 degrees, 15 degrees, 30 degrees, 45 degrees, and 60 degrees while looking at a device from the front.

FIG. 7 illustrates a case where a third emission part is configured with two emission layers. As illustrated in FIG. 7, it can be seen that the color viewing angle change rate "Δu'v'" based on a viewing angle is lower at ③ position than ④ position, and thus, a change in white is small. For example, when a viewing angle is 60 degrees, the color viewing angle change rate "Δu'v'" is 0.0167 at ③ position, and the color viewing angle change rate "Δu'v'" is 0.0224 at ④ position. That is, it can be seen that the color viewing angle change rate "Δu'v'" is lower at ③ position than ④ position.

Therefore, as a result of the color viewing angle change rate "Δu'v'" based on a viewing angle, it can be seen that in the third emission part 110, when the red emission layer is disposed on the blue emission layer, the color viewing angle change rate "Δu'v'" is low. Also, it can be seen that since the color viewing angle change rate "Δu'v'" based on a viewing angle is low, a color change of white is small. Also, it can be seen that since the color viewing angle change rate "Δu'v'" based on a viewing angle is low, a color is prevented from being moved, and an influence of the color viewing angle change rate "Δu'v'" on display quality is small.

As described above with reference to FIGS. 5 to 7, in a case where the third emission part is configured with the two emission layers including the red emission layer, when the blue emission layer is disposed closer to the second electrode than the red emission layer, emission intensity increases, and thus, a color viewing angle change rate and at least one of red efficiency, green efficiency, and blue efficiency are enhanced.

As described above with reference to FIGS. 2 to 7, when one emission part is configured with two emission layers (for example, the blue emission layer and the red emission layer), positions or order of the blue emission layer and the red emission layer have been checked in the first emission part or the third emission part. When one emission part is configured with two emission layers, it can be seen that positions of the two emission layers should be set in consideration of an emission curve of an emission area of an emission layer, an emission intensity of the emission layer, and a color viewing angle change rate based on a viewing angle.

Moreover, a white organic light emitting device where one emission part includes two emission layers will be described below in detail with reference to the following embodiments.

Figure 8:
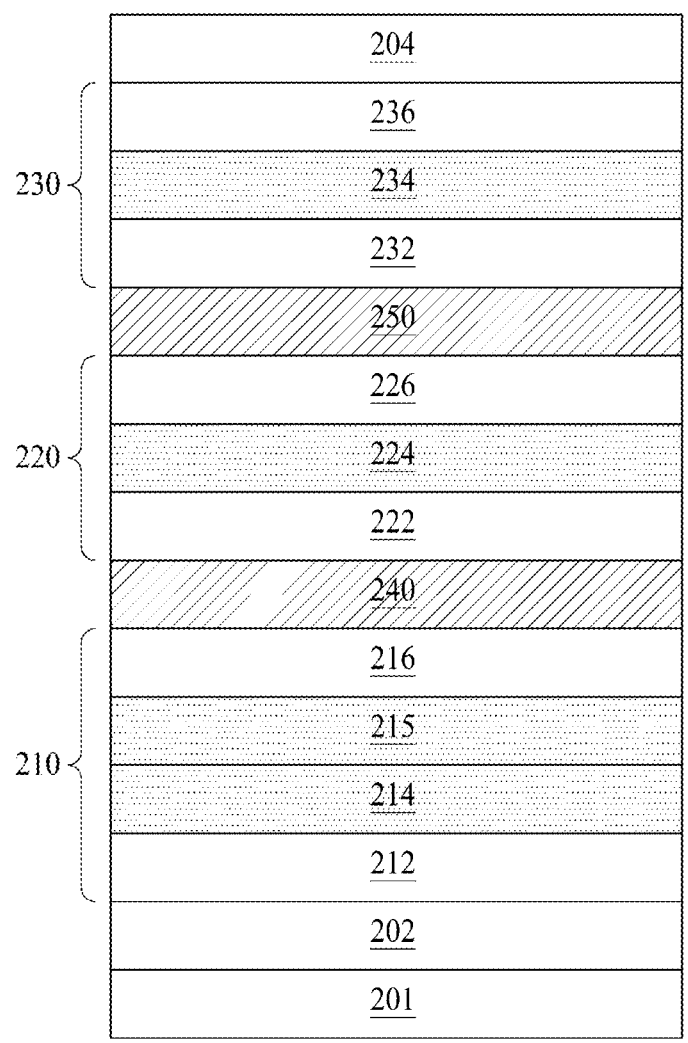
FIG. 8 is a diagram illustrating a white organic light emitting device according to a fourth embodiment of the present invention.

FIG. 8 is a diagram illustrating a white organic light emitting device 200 according to a fourth embodiment of the present invention.

The white organic light emitting device 200 illustrated in FIG. 8 includes a substrate 201, first and second electrodes 202 and 204, and a first emission part 210, a second emission part and a third emission part 230 disposed between the first and second electrodes 202 and 204.

The substrate 201 may be formed of an insulating material or a material having flexibility. The substrate 201 may be formed of glass, metal, or plastic, but is not limited thereto. When an organic light emitting display apparatus is a flexible organic light emitting display apparatus, the substrate 201 may be formed of a flexible material such as plastic.

The first electrode 202 is an anode that supplies a hole, and may be formed of indium tin oxide (ITO) or indium zinc oxide (IZO) which is a transparent conductive material such as transparent conductive oxide (TCO). However, the present embodiment is not limited thereto.

The second electrode 204 is a cathode that supplies an electron, and may be formed of gold (Au), silver (Ag), aluminum (Al), molybdenum (Mo), or magnesium (Mg) which is a metal material, or may be formed of an alloy thereof. However, the present embodiment is not limited thereto.

Each of the first electrode 202 and the second electrode 204 may be referred to as an anode or a cathode.

The first emission part 210 may include a first HTL 212, a first EML 214, and a first ETL 216 which are disposed on the first electrode 202.

Although not shown, an HIL may be further formed on the first electrode 202. The HIL enables a hole, supplied from the first electrode 202, to be smoothly injected. The first HTL 212 may supply a hole, supplied from the HIL, to the first EML 214. The first ETL 216 may supply an electron, supplied from the first CGL 240, to the first EML 214.

The HIL may be formed of 4,4',4"-tris(3-methylphenyl-phenylamino)triphenylamine (MTDATA), copper phthalocyanine (CuPc), poly(3,4-ethylenedioxythiphene, polystyrene sulfonate) (PEDOT/PSS), but is not limited thereto.

A hole supplied through the HIL and an electron supplied through the first ETL 216 may be recombined in the first EML 214 to emit light.

The first HTL 212 may be formed of two or more layers or two or more materials. The first HTL 212 may be formed at least one among NPD(N,N'-bis(naphthalene-1-yl)-N,N'-bis(phenyl)-2,2'-dimethylbenzidine), TPD(N,N-bis-(3-methylphenyl)-N,N-bis-(phenyl)-benzidine), and Spiro-TAD(2,2',7,7'-tetrakis(N,N -diphenylamino)-9,9'-spirofluorene), but is not limited thereto.

The first ETL 216 may be formed of two or more layers or two or more materials. The first ETL 216 may be formed at least one among PBD(2-(4-biphenyl)-5-(4-tert-butylphenyl)-1,3,4-oxadiazole), TAZ(3-(4-biphenyl)-4-phenyl-5-tert-butylphenyl-1,2,4-triazole), BAlq(Bis(2-methyl-8-quinolinolate)-4-(phenylphenolato)aluminium), Liq(8-hydroxyquinolinolato-lithium), and TPBi(2,2',2"-(1,3,5-benzinetriyl)-tris(1-phenyl-1-H-benzimidazole), but is not limited thereto.

A hole blocking layer (HBL) may be further formed on the first EML 214. The HBL prevents a hole, injected into the first EML 214, from being transferred to the first ETL 216 and thus enhances a combination of an electron and a hole in the first EML 214, thereby enhancing an emission efficiency of the first EML 214. The first ETL 216 and the HBL may be provided as one layer or single layer.

An electron blocking layer (EBL) may be further formed under the first EML 214. The EBL prevents an electron, injected into the first EML 214, from being transferred to the first HTL 212 and thus enhances a combination of an electron and a hole in the first EML 214, thereby enhancing an emission efficiency of the first EML 214. The first HTL 212 and the EBL may be provided as one layer or single layer.

The second emission part 220 may include a second HTL 222, a first EML 224, and a second ETL 226.

Although not shown, an EIL may be further formed on the second ETL 226. Also, an HIL may be further formed.

The second HTL 222 may be formed of the same material as that of the first HTL 212, but is not limited thereto.

The second HTL 222 may be formed of two or more layers or two or more materials.

The second ETL 226 may be formed of the same material as that of the first ETL 216, but is not limited thereto.

The second ETL 226 may be formed of two or more layers or two or more materials.

An HBL may be further formed on the first EML 224. The HBL prevents a hole, injected into the first EML 224, from being transferred to the second ETL 226 and thus enhances a combination of an electron and a hole in the first EML 224, thereby enhancing an emission efficiency of the first EML 224. The second ETL 226 and the HBL may be provided as one layer or single layer.

An EBL may be further formed under the first EML 224. The EBL prevents an electron, injected into the first EML 224, from being transferred to the second HTL 222 and thus enhances a combination of an electron and a hole in the first EML 224, thereby enhancing an emission efficiency of the first EML 224. The second HTL 222 and the EBL may be provided as one layer or single layer.

A first CGL 240 may be further formed between the first emission part 210 and the second emission part 220. The first CGL 240 may adjust a balance of charges between the first emission part 210 and the second emission part 220. The first CGL 240 may include an N-type CGL and a P-type CGL.

The N-type CGL may be formed as an organic layer on which alkali metal such as lithium (Li), sodium (Na), potassium (K), or cesium (Cs) or alkali earth metal such as magnesium (Mg), strontium (Sr), barium (Ba), or radium (Ra) is doped, but is not limited thereto.

The P-type CGL may be formed as an organic layer including a P-type dopant, but is not limited thereto.

The first CGL 240 may be formed of a single layer.

The third emission part 230 may include a third ETL 236, a first EML 234, and a third HTL 232 which are disposed under the second electrode 204.

Although not shown, an EIL may be further formed on the third ETL 236. Also, an HIL may be further formed.

The third HTL 232 may be formed of TPD(N,N'-bis(3-methylphenyl)-N,N'-bis(phenyl)-benzidine) or NPB(N,N-bis(naphthalen-1-yl)-N,N'-bis(phenyl)-benzidine), but is not limited thereto.

The third HTL 232 may be formed of two or more layers or two or more materials.

The third ETL 236 may be formed of oxadiazole, phenanthroline, benzoxazole, or benzthiazole, but is not limited thereto.

The third ETL 236 may be formed of two or more layers or two or more materials.

An HBL may be further formed on the first EML 234. The HBL prevents a hole, injected into the first EML 234, from being transferred to the third ETL 236 and thus enhances a combination of an electron and a hole in the first EML 234, thereby enhancing an emission efficiency of the first EML 234. The third ETL 236 and the HBL may be provided as one layer or single layer.

An EBL may be further formed under the first EML 234. The EBL prevents an electron, injected into the third EML 234, from being transferred to the third HTL 232 and thus enhances a combination of an electron and a hole in the first EML 234, thereby enhancing an emission efficiency of the first EML 234. The third HTL 232 and the EBL may be provided as one layer or single layer.

A second CGL 250 may be further formed between the second emission part 220 and the third emission part 230. The second CGL 250 may adjust a balance of charges between the second emission part 220 and the third emission part 230. The second CGL 250 may include an N-type CGL and a P-type CGL.

The N-type CGL may inject an electron into the second emission part 220, and the P-type CGL may inject a hole into the third emission part 230.

The N-type CGL may be formed as an organic layer on which alkali metal such as lithium (Li), sodium (Na), potassium (K), or cesium (Cs) or alkali earth metal such as magnesium (Mg), strontium (Sr), barium (Ba), or radium (Ra) is doped, but is not limited thereto.

The P-type CGL may be formed as an organic layer including a P-type dopant, but is not limited thereto. The first CGL 240 may be formed of the same material as that of the N-CGL and the P-CGL of the second CGL 250, but is not limited thereto. The second CGL 250 may be formed of a single layer.

The first EML 214 of the first emission part 210 may be formed as a blue emission layer, and the second EML 215 may be formed as a red emission layer. As described above with reference to FIGS. 2 to 7, in consideration of emission intensity or an emission curve and a color viewing angle change rate, the red emission layer 215 which is further included in the first emission part 210 may be disposed on the blue emission layer 214. Therefore, the blue emission layer which is the first EML 214 may be disposed closer to the first electrode 202 than the red emission layer which is the second EML 215, and thus, a color viewing angle and at least one of red efficiency, green efficiency, and blue efficiency are enhanced.

The first EML 214 of the first emission part 210 may be formed as a deep blue emission layer or a sky blue emission layer in addition to the blue emission layer.

An emission peak of an emission area of the blue emission layer which is the first EML 214 may be within a range of 440 nm to 480 nm. Also, an emission peak of an emission area of the red emission layer which is the second EML 215 may be within a range of 600 nm to 650 nm. Therefore, an emission peak of an emission area of the first emission part 210 may be within a range of 440 nm to 650 nm.

The first EML 224 of the second emission part 220 may be formed as a green emission layer. An emission peak of an emission area of the first EML 224 may be within a range of 510 nm to 570 nm.

When the green emission layer is applied, a green wavelength range having a short wavelength may be realized unlike a yellow-green emission layer, and thus, colors are prevented from being mixed due to an overlap between a red wavelength range and a yellow-green wavelength range, a color purity of each of red and green is prevented from being reduced due to color mixing.

Alternatively, the first EML 224 of the second emission part 220 may be formed as a blue emission layer. The first EML 224 may be formed as a deep blue emission layer or a sky blue emission layer in addition to the blue emission layer.

The first EML 234 of the third emission part 230 may be formed as a blue emission layer. The first EML 234 may be formed as a deep blue emission layer or a sky blue emission layer in addition to the blue emission layer. An emission peak of an emission area of the first EML 234 may be within a range of 440 nm to 480 nm. Alternatively, the first EML 234 of the third emission part 230 may be formed as a green emission layer.

When the first EML 234 of the third emission part 230 is formed as a blue emission layer, the first EML 224 of the second emission part 220 may be formed as a green emission layer. In this case, the second emission part 220 may have an emission peak which is within a range of 510 nm to 570 nm, and the third emission part 230 may have an emission peak which is within a range of 440 nm to 480 nm.

Alternatively, when the first EML 234 of the third emission part 230 is formed as a green emission layer, the first EML 224 of the second emission part 220 may be formed as a blue emission layer. In this case, the second emission part 220 may have an emission peak which is within a range of 440 nm to 480 nm, and the third emission part 230 may have an emission peak which is within a range of 510 nm to 570 nm.

Therefore, the white organic light emitting device according to the fourth embodiment of the present invention has a structure, showing three emission peaks, where the first emission part may be configured with a red emission layer and a blue emission layer so as to improve an efficiency of the red emission layer, the second emission part may be configured with a green emission layer so as to improve an efficiency of the green emission layer, and the third emission part may be configured with a blue emission layer. That is, the white organic light emitting device has a three emission region-three emission peak (TER-TEP) structure which is a structure which has three emission peaks based on the three emission parts. Accordingly, according to the present embodiment, emission efficiency, color purity, and a color reproduction rate or a color viewing angle are enhanced by applying the TER-TEP structure. Also, most luminance of an organic light emitting display apparatus is obtained from green, and thus, when the second EML is configured with one emission layer (i.e., a green emission layer), a luminance of the organic light emitting display apparatus is further enhanced.

Here, since the first emission part is configured with a blue emission layer and a red emission layer, an emission peak of an emission area of the blue emission layer is within a range of 440 nm to 480 nm, and an emission peak of an emission area of the red emission layer is within a range of 600 nm to 650 nm. Also, since the second emission part is configured with a green emission layer, an emission peak of an emission area of the green emission layer is within a range of 510 nm to 570 nm. Also, since the third emission part is configured with a blue emission layer, an emission peak of an emission area of the blue emission layer is within a range of 440 nm to 480 nm. Therefore, since each of the first and third emission parts is configured with the blue emission layer, the emission peaks of the blue emission layers are shown as one emission peak at 440 nm to 480 nm, and thus, the TER-TEP structure having three emission peaks is provided due to the first to third emission parts.

Alternatively, since the first emission part is configured with a blue emission layer and a red emission layer, an emission peak of an emission area of the blue emission layer is within a range of 440 nm to 480 nm, and an emission peak of an emission area of the red emission layer is within a range of 600 nm to 650 nm. Also, since the second emission part is configured with a green emission layer, an emission peak of an emission area of the green emission layer is within a range of 510 nm to 570 nm. Also, since the third emission part is configured with a blue emission layer, an emission peak of an emission area of the blue emission layer is within a range of 440 nm to 480 nm. Therefore, since each of the first and third emission parts is configured with the blue emission layer, the emission peaks of the blue emission layers are shown as two emission peaks at 440 nm to 480 nm, or the emission peaks of the blue emission layers are shown as two different emission peaks at 440 nm to 480 nm. Accordingly, four emission peaks are provided due to the first to third emission parts. That is, due to the three emission parts, the TER-TEP structure includes a structure having four emission peaks.

The white organic light emitting device according to the fourth embodiment of the present invention may be applied to a bottom emission type, but is not limited thereto. The white organic light emitting device according to the fourth embodiment of the present invention may be applied to a top emission type or a dual emission type. In the top emission type or the dual emission type, positions of emission layers may be changed based on a characteristic or a structure of a device. As described above, when two emission layers including a red emission layer are provided, an emission intensity or a color viewing angle change rate of an emission layer is affected by a position of the red emission layer. Therefore, in the white organic light emitting device, the position of the red emission layer may be set based on an emission intensity or a color viewing angle change rate of an emission layer so as to enhance a color viewing angle and at least one of red efficiency, green efficiency, and blue efficiency.

In an organic light emitting display apparatus including the white organic light emitting device according to the fourth embodiment of the present invention, a plurality of gate lines and a plurality of data lines which respectively define a plurality of pixel areas by intersections therebetween and a plurality of power lines which extend in parallel with the gate lines or the data lines may be disposed on the substrate 201, a switching thin film transistor (TFT) which is connected to a corresponding gate line and a corresponding data line and a driving TFT connected to the switching TFT may be disposed in each of the plurality of pixel areas. The driving TFT may be connected to the first electrode 202.

Figure 9:
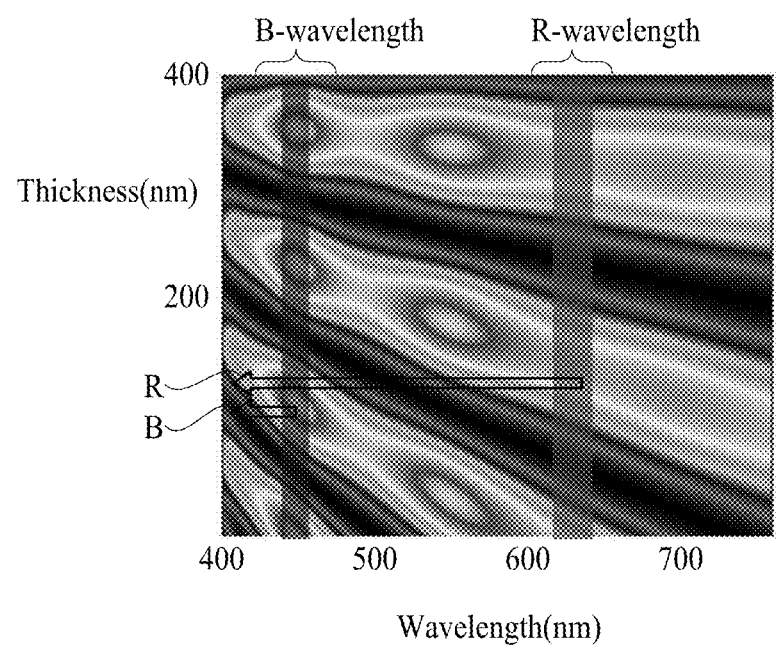
FIG. 9 is a diagram illustrating an emission position of an emission layer according to a fourth embodiment of the present invention.

FIG. 9 is a diagram illustrating an emission position of an emission layer according to a fourth embodiment of the present invention.

In FIG. 9, the abscissa axis indicates a wavelength range (nm) of light, and the ordinate axis indicates a thickness (nm) of organic layers configuring an emission part. The thickness does not limit the scope of the present invention. Also, FIG. 9 may be referred to as a contour map.

FIG. 9 illustrates a red emission layer which is disposed on a blue emission layer when the first emission part 210 is configured with the red emission layer. In FIG. 9, the blue emission layer is referred to by B, and the red emission layer is referred to by R. The first emission part 210 may be configured with a deep blue emission layer or a sky blue emission layer in addition to the blue emission layer.

As illustrated in FIG. 9, when light is emitted at 440 nm to 480 nm (B-wavelength) which is an emission peak of an emission area of the blue emission layer and at 600 nm to 650 nm (R-wavelength) which is an emission peak of an emission area of the red emission layer, maximum efficiency is obtained in a white area of the contour map. Therefore, it can be seen that when the red emission layer is disposed on the blue emission layer, light is emitted at the B-wavelength and the R-wavelength which are emission peaks of desired emission areas.

Figure 10:
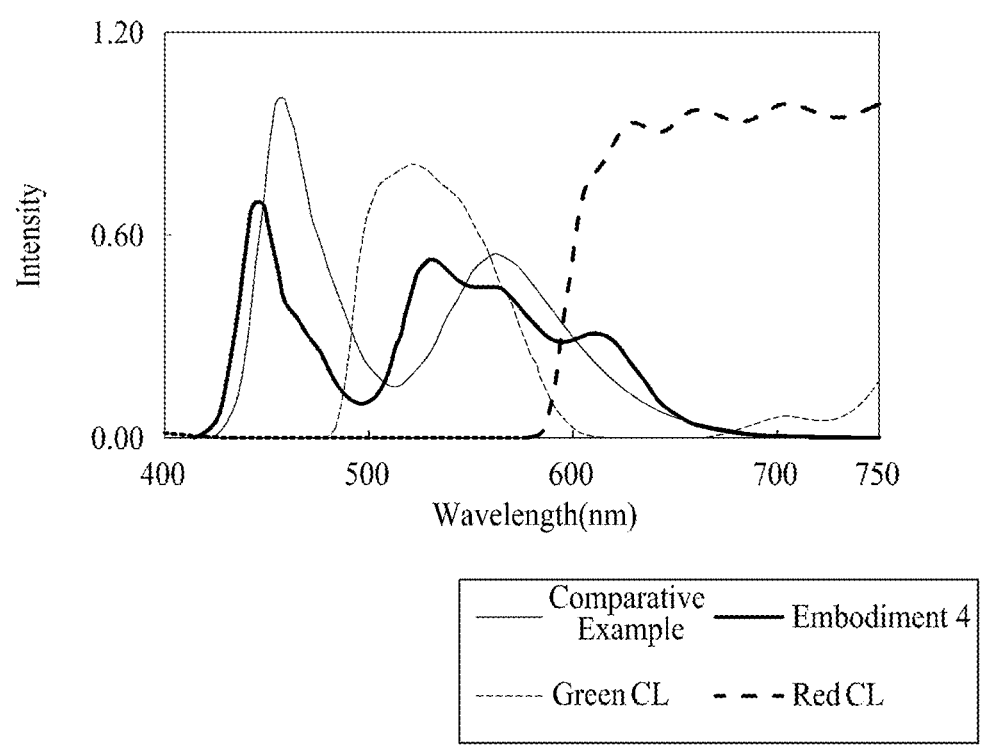
FIG. 10 is a diagram illustrating emission intensities of the white organic light emitting device according to the fourth embodiment of the present invention and a comparative example.

FIG. 10 is a diagram illustrating emission intensities of the white organic light emitting device according to the fourth embodiment of the present invention and a comparative example.

In FIG. 10, the abscissa axis indicates a wavelength range (nm) of light, and the ordinate axis indicates emission intensity. The emission intensity may be a numerical value which is expressed as a relative value with respect to a maximum value of the EL spectrum.

In FIG. 10, in the comparative example, a first EML of a first emission part may be configured with a blue emission layer, a first EML of a second emission part may be configured with a yellow-green emission layer, and a first EML of a third emission part may be configured with a blue emission layer.

In an embodiment 4, as illustrated in FIG. 8, the first EML 214 of the first emission part 210 may be configured with a blue emission layer, and a red emission layer which is the second EML 215 may be disposed on the blue emission layer. The first emission part 210 may include the first EML 214 which is configured with a deep blue emission layer or a sky blue emission layer in addition to the blue emission layer.

Moreover, the first EML 224 of the second emission part 220 may be configured with a green emission layer, and the first EML 234 of the third emission part 230 may be configured with a blue emission layer. The third emission part 230 may include the first EML 234 which is configured with a deep blue emission layer or a sky blue emission layer in addition to the blue emission layer. When the first EML 234 is configured with the deep blue emission layer, a color purity of the first EML 234 is further enhanced than that of the blue emission layer or the sky blue emission layer.

In FIG. 10, the comparative example is illustrated as a thin solid line, and the embodiment 4 is illustrated as a thick solid line. Also, a graph illustrated as a green color layer (CL) shows a wavelength where a transmittance of the green color layer is the maximum, and a graph illustrated as a red color layer (CL) shows a wavelength where a transmittance of the red color layer is the maximum.

As illustrated in FIG. 10, in the comparative example, it can be seen that emission intensity is shown at 440 nm to 480 nm which is an emission peak of an emission area of a blue emission layer, and emission intensity is shown at 540 nm to 580 nm which is an emission peak of an emission area of a yellow-green emission layer.

In the comparative example, a wavelength where a transmittance of the green color layer is the maximum does not match a wavelength of an emission peak of an emission area of the yellow-green emission layer. Therefore, red efficiency and green efficiency are reduced. Also, it can be seen that emission intensity is reduced in a wavelength range representing a transmittance of the green color layer in comparison with the embodiment 4.

Therefore, in the comparative example, colors are mixed because a yellow-green wavelength range overlaps a red wavelength range, and thus, it is difficult to realize desired green and red. For this reason, it is difficult to implement a desired white organic light emitting device. Also, in the comparative example, it can be seen that an emission intensity of a red emission layer is low, and thus, an efficiency of the red emission layer is low.

Moreover, in the comparative example, only yellow-green and blue corresponding to two emission peaks are shown in three emission parts, and yellow-green should realize red and green, causing a reduction in a color purity of each of red and green. For this reason, it is difficult to implement a desired white organic light emitting device.

In the embodiment 4, it can be seen that emission intensity is shown at 440 nm to 480 nm which is an emission peak of an emission area of a blue emission layer, emission intensity is shown at 510 nm to 570 nm which is an emission peak of an emission area of a green emission layer, and emission intensity is shown at 600 nm to 650 nm which is an emission peak of an emission area of a red emission layer. That is, it can be seen that three emission peaks are shown. Also, since the red emission layer is further provided, an emission intensity of the red emission layer increases, and thus, red efficiency and a color purity of red are enhanced. Here, due to the blue emission layer included in each of the first and third emission parts, the emission peaks of the blue emission layers are shown as two emission peaks at 440 nm to 480 nm, or the emission peaks of the blue emission layers are shown as two different emission peaks at 440 nm to 480 nm. Accordingly, four emission peaks are shown.

Furthermore, since emission intensity is shown at 510 nm to 570 nm which is an emission peak of an emission area of the green emission layer, only green having a short-wavelength range is realized, and thus, color purity is further enhanced than yellow-green. In comparison with the comparative example, in the graph illustrated as the green color layer, the embodiment 4 is close to a wavelength range where a transmittance of the green color layer is the maximum, and thus, green is expressed without being mixed with another color. Accordingly, an emission efficiency of the green emission layer is high at a wavelength where a transmittance of the green color layer is the maximum, and thus, green efficiency increases.

Moreover, a color purity of each of red and green increases, and thus, DCI coverage increases. Accordingly, a large-size television (TV) for displaying a sharper and realistic image is provided. Here, the DCI coverage may be referred to as a DCI color space satisfaction level.

Moreover, in the embodiment 4, it can be seen that an emission intensity of the red emission layer increases. In the graph illustrated as the red color layer, it can be seen that an emission intensity of the embodiment 4 further increases in a region of the red color layer than the comparative example.

Therefore, in the embodiment 4, it can be seen that an emission intensity of each of red and green increases, and thus, red efficiency and green efficiency increase.

Moreover, in the embodiment 4, red, green, and blue wavelengths corresponding to three emission peaks are shown in three emission parts, and thus, at least one of red efficiency, green efficiency, and blue efficiency is enhanced, and color purity and a color reproduction rate or a color viewing angle are enhanced. Also, the red, green, and blue wavelengths corresponding to the three emission peaks are shown in the three emission parts, and thus, at least one of red efficiency, green efficiency, and blue efficiency is enhanced, and color purity and a color reproduction rate or a color viewing angle are enhanced. Here, due to the blue emission layer included in each of the first and third emission parts, the emission peaks of the blue emission layers are shown as two emission peaks at 440 nm to 480 nm, or the emission peaks of the blue emission layers are shown as two different emission peaks at 440 nm to 480 nm. Accordingly, four emission peaks are shown.

Figure 11:
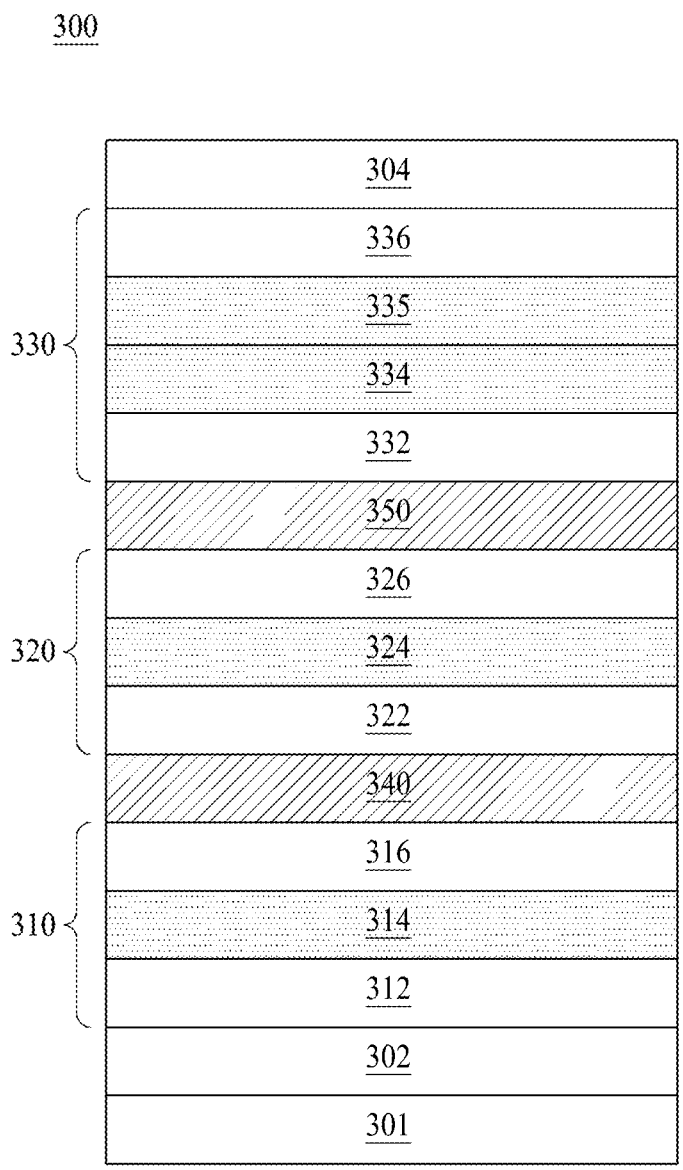
FIG. 11 is a diagram illustrating a white organic light emitting device according to a fifth embodiment of the present invention.

FIG. 11 is a diagram illustrating a white organic light emitting device 300 according to a fifth embodiment of the present invention. In describing the present embodiment, descriptions on elements which are the same as or correspond to the elements according to the preceding embodiment are not repeated.

The white organic light emitting device 300 illustrated in FIG. 11 includes a substrate 301, first and second electrodes 302 and 304, and first to third emission parts 310, 320 and 330 disposed between the first and second electrodes 302 and 304.

The first EML 314 of the first emission part 310 may be formed as a blue emission layer. The first EML 314 may be formed as a deep blue emission layer or a sky blue emission layer in addition to the blue emission layer. An emission peak of an emission area of the first EML 314 may be within a range of 440 nm to 480 nm. Alternatively, the first EML 314 may be formed as a green emission layer. In this case, an emission peak of an emission area of the first EML 314 may be within a range of 510 nm to 570 nm.

The first EML 324 of the second emission part 320 may be formed as a green emission layer. An emission peak of an emission area of the first EML 324 may be within a range of 510 nm to 570 nm.

When the green emission layer is applied, a green wavelength range having a short wavelength may be realized unlike a yellow-green emission layer, and thus, colors are prevented from being mixed due to an overlap between a red wavelength range and a yellow-green wavelength range, a color purity of each of red and green is prevented from being reduced due to color mixing.

Alternatively, the first EML 324 may be formed as a blue emission layer. The first EML 324 may be formed as a deep blue emission layer or a sky blue emission layer in addition to the blue emission layer. In this case, an emission peak of an emission area of the first EML 324 may be within a range of 440 nm to 480 nm.

When the first EML 314 of the first emission part 310 is formed as a blue emission layer, the first EML 324 of the second emission part 320 may be formed as a green emission layer. In this case, the first emission part 310 may have an emission peak which is within a range of 440 nm to 480 nm, and the second emission part 320 may have an emission peak which is within a range of 510 nm to 570 nm.

The first EML 334 of the third emission part 330 may be formed as a red emission layer, and the second EML 335 may be formed as a blue emission layer. As described above with reference to FIGS. 2 to 7, the red emission layer which is further included in the third emission part 330 may be disposed on the blue emission layer. Therefore, the blue emission layer which is the second EML 335 may be disposed closer to the second electrode 304 than the red emission layer which is the first EML 334, and thus, a color viewing angle and at least one among red efficiency, green efficiency, and blue efficiency are enhanced.

The second EML 335 of the third emission part 330 may be formed as a deep blue emission layer or a sky blue emission layer in addition to the blue emission layer.

An emission peak of an emission area of the red emission layer which is the first EML 334 may be within a range of 600 nm to 650 nm. Also, an emission peak of an emission area of the blue emission layer which is the second EML 335 may be within a range of 440 nm to 480 nm. Therefore, an emission peak of an emission area of the third emission part 330 may be within a range of 440 nm to 650 nm.

Therefore, the white organic light emitting device according to the fifth embodiment of the present invention has a structure, showing three emission peaks, where the first emission part may be configured with a blue emission layer, the second emission part may be configured with a green emission layer so as to improve an efficiency of the green emission layer, and the third emission part may be configured with a red emission layer so as to improve an efficiency of the red emission layer. That is, the white organic light emitting device has the TER-TEP structure which is a structure which has three emission peaks based on the three emission parts. Accordingly, according to the present embodiment, emission efficiency, color purity, and a color reproduction rate or a color viewing angle are enhanced by applying the TER-TEP structure. Also, most luminance of an organic light emitting display apparatus is obtained from green, and thus, when the second EML is configured with one emission layer (i.e., a green emission layer), a luminance of the organic light emitting display apparatus is further enhanced.

Here, since the first emission part is configured with a blue emission layer, an emission peak of an emission area of the blue emission layer is within a range of 440 nm to 480 nm. Also, since the second emission part is configured with a green emission layer, an emission peak of an emission area of the green emission layer is within a range of 510 nm to 570 nm. Also, since the third emission part is configured with a red emission layer and a blue emission layer, an emission peak of an emission area of the red emission layer is within a range of 600 nm to 650 nm, and an emission peak of an emission area of the blue emission layer is within a range of 440 nm to 480 nm. Therefore, since each of the first and third emission parts is configured with the blue emission layer, the emission peaks of the blue emission layers are shown as one emission peak at 440 nm to 480 nm, and thus, the TER-TEP structure having three emission peaks is provided due to the first to third emission parts.

Alternatively, since the first emission part is configured with a green emission layer, an emission peak of an emission area of the green emission layer is within a range of 510 nm to 570 nm. Also, since the second emission part is configured with a blue emission layer, an emission peak of an emission area of the blue emission layer is within a range of 440 nm to 480 nm. Also, since the third emission part is configured with a red emission layer and a blue emission layer, an emission peak of an emission area of the red emission layer is within a range of 600 nm to 650 nm, and an emission peak of an emission area of the blue emission layer is within a range of 440 nm to 480 nm. Therefore, since each of the second and third emission parts is configured with the blue emission layer, the emission peaks of the blue emission layers are shown as one emission peak at 440 nm to 480 nm, and thus, the TER-TEP structure having three emission peaks is provided due to the first to third emission parts.

Alternatively, since the first emission part is configured with a blue emission layer, an emission peak of an emission area of the blue emission layer is within a range of 440 nm to 480 nm. Also, since the second emission part is configured with a green emission layer, an emission peak of an emission area of the green emission layer is within a range of 510 nm to 570 nm. Also, since the third emission part is configured with a red emission layer and a blue emission layer, an emission peak of an emission area of the red emission layer is within a range of 600 nm to 650 nm, and an emission peak of an emission area of the blue emission layer is within a range of 440 nm to 480 nm. Therefore, since each of the first and third emission parts is configured with the blue emission layer, the emission peaks of the blue emission layers are shown as two emission peaks at 440 nm to 480 nm, or the emission peaks of the blue emission layers are shown as two different emission peaks at 440 nm to 480 nm. Accordingly, four emission peaks are provided due to the first to third emission parts. That is, due to the three emission parts, the TER-TEP structure includes a structure having four emission peaks.

Alternatively, since the first emission part is configured with a green emission layer, an emission peak of an emission area of the green emission layer is within a range of 510 nm to 570 nm. Also, since the second emission part is configured with a blue emission layer, an emission peak of an emission area of the blue emission layer is within a range of 440 nm to 480 nm. Also, since the third emission part is configured with a red emission layer and a blue emission layer, an emission peak of an emission area of the red emission layer is within a range of 600 nm to 650 nm, and an emission peak of an emission area of the blue emission layer is within a range of 440 nm to 480 nm. Therefore, since each of the second and third emission parts is configured with the blue emission layer, the emission peaks of the blue emission layers are shown as two emission peaks at 440 nm to 480 nm, or the emission peaks of the blue emission layers are shown as two different emission peaks at 440 nm to 480 nm. Accordingly, four emission peaks are provided due to the first to third emission parts. That is, due to the three emission parts, the TER-TEP structure includes a structure having four emission peaks.

The white organic light emitting device according to the fifth embodiment of the present invention may be applied to a bottom emission type, but is not limited thereto. The white organic light emitting device according to the fourth embodiment of the present invention may be applied to a top emission type or a dual emission type. In the top emission type or the dual emission type, positions of emission layers may be changed based on a characteristic or a structure of a device. As described above, when two emission layers including a red emission layer are provided, an emission intensity or a color viewing angle change rate of an emission layer is affected by a position of the red emission layer. Therefore, in the white organic light emitting device, the position of the red emission layer may be set based on an emission intensity or a color viewing angle change rate of an emission layer so as to enhance a color viewing angle and at least one of red efficiency, green efficiency, and blue efficiency.

In an organic light emitting display apparatus including the white organic light emitting device according to the fifth embodiment of the present invention, a plurality of gate lines and a plurality of data lines which respectively define a plurality of pixel areas by intersections therebetween and a plurality of power lines which extend in parallel with the gate lines or the data lines may be disposed on the substrate 301, a switching thin film transistor (TFT) which is connected to a corresponding gate line and a corresponding data line and a driving TFT connected to the switching TFT may be disposed in each of the plurality of pixel areas. The driving TFT may be connected to the first electrode 302.

Figure 12:
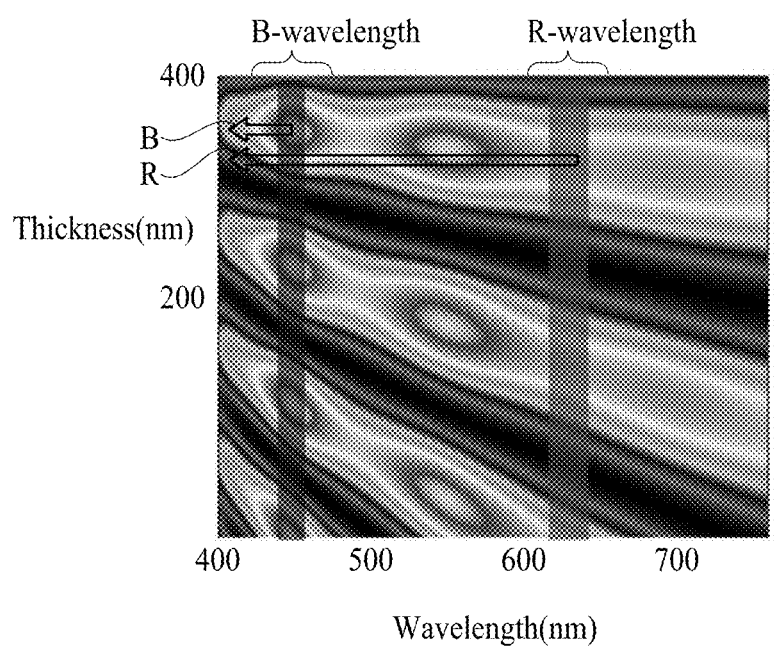
FIG. 12 is a diagram illustrating an emission position of an emission layer according to a fifth embodiment of the present invention.

FIG. 12 is a diagram illustrating an emission position of an emission layer according to a fifth embodiment of the present invention.

In FIG. 12, the abscissa axis indicates a wavelength range (nm) of light, and the ordinate axis indicates a thickness (nm) of organic layers configuring an emission part. The thickness does not limit the scope of the present invention. Also, FIG. 12 may be referred to as a contour map.

FIG. 12 illustrates a red emission layer which is disposed under a blue emission layer when the third emission part 330 is configured with the red emission layer. In FIG. 12, the blue emission layer is referred to by B, and the red emission layer is referred to by R. The third emission part 330 may be configured with a deep blue emission layer or a sky blue emission layer in addition to the blue emission layer.

As illustrated in FIG. 12, when light is emitted at 440 nm to 480 nm (B-wavelength) which is an emission peak of an emission area of the blue emission layer and at 600 nm to 650 nm (R-wavelength) which is an emission peak of an emission area of the red emission layer, maximum efficiency is obtained in a white area of the contour map. Therefore, it can be seen that when the red emission layer is disposed under the blue emission layer, light is emitted at the B-wavelength and the R-wavelength which are emission peaks of desired emission areas.

Figure 13:
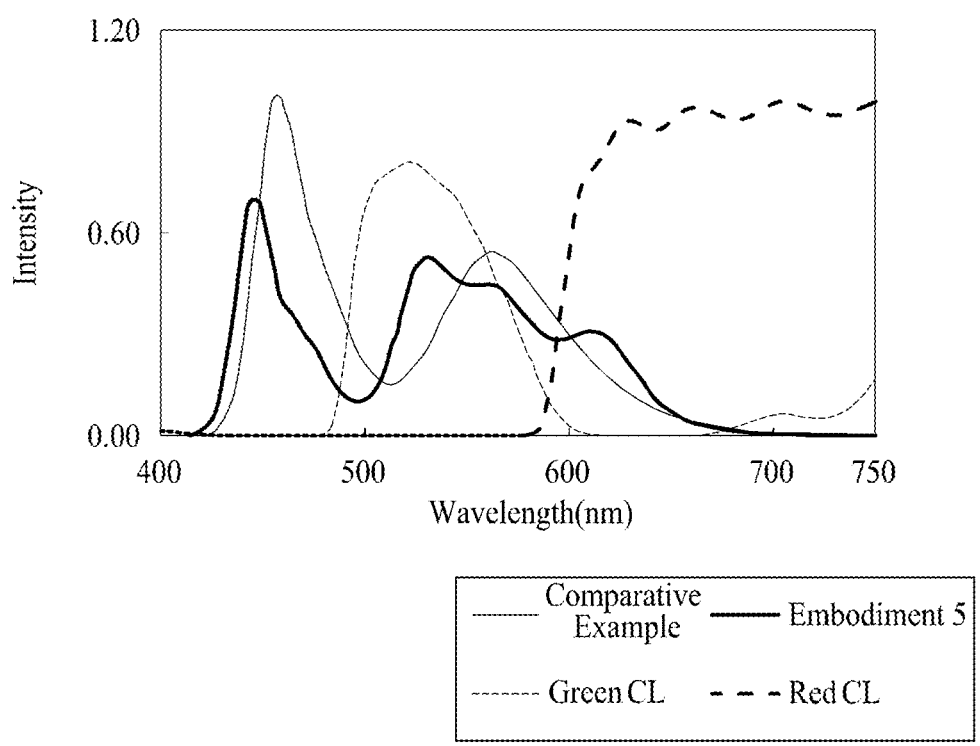
FIG. 13 is a diagram illustrating emission intensities the white organic light emitting device according to the fifth embodiment of the present invention and a comparative example.

FIG. 13 is a diagram illustrating emission intensities of the white organic light emitting device according to the fifth embodiment of the present invention and a comparative example.

In FIG. 13, the abscissa axis indicates a wavelength range (nm) of light, and the ordinate axis indicates emission intensity. The emission intensity may be a numerical value which is expressed as a relative value with respect to a maximum value of the EL spectrum.

In FIG. 13, the comparative example is illustrated as a thin solid line, and an embodiment 5 is illustrated as a thick solid line. Also, a graph illustrated as a green color layer (CL) shows a wavelength where a transmittance of the green color layer is the maximum, and a graph illustrated as a red color layer (CL) shows a wavelength where a transmittance of the red color layer is the maximum.

In FIG. 13, in the comparative example, a first EML of a first emission part may be configured with a blue emission layer, a first EML of a second emission part may be configured with a yellow-green emission layer, and a first EML of a third emission part may be configured with a blue emission layer.

In the embodiment 5, as illustrated in FIG. 11, the first EML 314 of the first emission part 310 may be configured with a blue emission layer, and the first EML 324 of the second emission part 320 may be configured with a green emission layer. The first emission part 310 may include the first EML 314 which is configured with a deep blue emission layer or a sky blue emission layer in addition to the blue emission layer.

A red emission layer which is the first EML 334 of the third emission part 330 and a blue emission layer which is the second EML 335 may be provided, and the blue emission layer may be disposed on the red emission layer. The second EML 335 may be formed as a deep blue emission layer or a sky blue emission layer in addition to the blue emission layer.

As illustrated in FIG. 13, in the comparative example, it can be seen that emission intensity is shown at 440 nm to 480 nm which is an emission peak of an emission area of a blue emission layer, and emission intensity is shown at 540 nm to 580 nm which is an emission peak of an emission area of a yellow-green emission layer. In the comparative example, a wavelength where a transmittance of the green color layer is the maximum does not match a wavelength of an emission peak of an emission area of the yellow-green emission layer. Therefore, red efficiency and green efficiency are reduced. Also, it can be seen that emission intensity is reduced in a wavelength range representing a transmittance of the green color layer in comparison with the embodiment 5.

Therefore, in the comparative example, colors are mixed because a yellow-green wavelength range overlaps a red wavelength range, and thus, it is difficult to realize desired green and red. For this reason, it is difficult to implement a desired white organic light emitting device. Also, in the comparative example, it can be seen that an emission intensity of a red emission layer is low, and thus, an efficiency of the red emission layer is low.

Moreover, in the comparative example, only yellow-green and blue corresponding to two emission peaks are shown in three emission parts, and yellow-green should realize red and green, causing a reduction in a color purity of each of red and green. For this reason, it is difficult to implement a desired white organic light emitting device.

In the embodiment 5, it can be seen that emission intensity is shown at 440 nm to 480 nm which is an emission peak of an emission area of a blue emission layer, emission intensity is shown at 510 nm to 570 nm which is an emission peak of an emission area of a green emission layer, and emission intensity is shown at 600 nm to 650 nm which is an emission peak of an emission area of a red emission layer. That is, it can be seen that three emission peaks are shown. Also, since the red emission layer is further provided, an emission intensity of the red emission layer increases, and thus, red efficiency and a color purity of red are enhanced. Here, due to the blue emission layer included in each of the first and third emission parts, the emission peaks of the blue emission layers are shown as two emission peaks at 440 nm to 480 nm, or the emission peaks of the blue emission layers are shown as two different emission peaks at 440 nm to 480 nm. Accordingly, four emission peaks are shown.

Furthermore, since emission intensity is shown at 510 nm to 570 nm which is an emission peak of an emission area of the green emission layer, only green having a short-wavelength range is realized, and thus, color purity is further enhanced than yellow-green. In comparison with the comparative example, in the graph illustrated as the green color layer, the embodiment 5 is close to a wavelength range where a transmittance of the green color layer is the maximum, and thus, green is expressed without being mixed with another color. Accordingly, an emission efficiency of the green emission layer is high at a wavelength where a transmittance of the green color layer is the maximum, and thus, green efficiency increases.

Moreover, a color purity of each of red and green increases, and thus, DCI coverage increases. Accordingly, a large-size TV for displaying a sharper and realistic image is provided. Here, the DCI coverage may be referred to as a DCI color space satisfaction level.

Moreover, in the embodiment 5, it can be seen that an emission intensity of the red emission layer increases. In the graph illustrated as the red color layer, it can be seen that an emission intensity of the embodiment 5 further increases in a region of the red color layer than the comparative example. Therefore, in the embodiment 5, it can be seen that an emission intensity of each of red and green increases, and thus, red efficiency and green efficiency increase.

Moreover, in the embodiment 5, red, green, and blue wavelengths corresponding to three emission peaks are shown in three emission parts, and thus, at least one of red efficiency, green efficiency, and blue efficiency is enhanced, and color purity and a color reproduction rate or a color viewing angle are enhanced. Also, the red, green, and blue wavelengths corresponding to the three emission peaks are shown in the three emission parts, and thus, at least one among red efficiency, green efficiency, and blue efficiency is enhanced, and color purity and a color reproduction rate or a color viewing angle are enhanced. Here, due to the blue emission layer included in each of the first and third emission parts, the emission peaks of the blue emission layers are shown as two emission peaks at 440 nm to 480 nm, or the emission peaks of the blue emission layers are shown as two different emission peaks at 440 nm to 480 nm. Accordingly, four emission peaks are shown due to the first to third emission parts.

The above-described red efficiency, green efficiency, color coordinates, and DCI coverage will be described below in detail with reference to Tables 1 and 2 and FIGS. 14A, 14B, 15A, and 15B.

Here, the DCI coverage may be referred to as a DCI color space satisfaction level. TVs which are being developed at present are required to satisfy a DCI P3 color gamut which is expanded by about 130% of the existing sRGB, for displaying a sharper and realistic image. DCI P3 may be an RGB color space and may be referred to as a color reproduction rate representing a color space which is broader than sRGB. However, DCI P3 is not limited thereto. The color reproduction rate may be referred to as a color space, a color area, a color reproduction area, a color reproduction range, or a color gamut. Also, depending on requirements of consumers and development of a product, the color reproduction rate may be changed in range and may be used as various terms. Also, coverage may be referred to as a range where DCI overlaps a color space of a display apparatus.

The following Table 1 shows efficiencies, color coordinates, and DCI color space satisfaction levels (DCI coverages) of the comparative example, the embodiment 4, and the embodiment 5.

In the comparative example, a first EML of a first emission part may be configured with a blue emission layer, a first EML of a second emission part may be configured with a yellow-green emission layer, and a first EML of a third emission part may be configured with a blue emission layer.

TABLE 1

| | G Efficiency (%) | Color Coordinates | | R Efficiency (%) | Color Coordinates | | DCI Coverage (%) |
|---|---|---|---|---|---|---|---|
| | | X | Y | | X | Y | |
| Comparative Example | 100 | 0.310 | 0.639 | 100 | 0.660 | 0.335 | 87.6 |
| Embodiment 4 | 113 | 0.277 | 0.682 | 124 | 0.669 | 0.327 | 95.7 |
| Embodiment 5 | 111 | 0.281 | 0.681 | 127 | 0.668 | 0.328 | 94.9 |

As shown in Table 1, it can be seen that when a green efficiency of the comparative example is 100%, green efficiencies of the embodiment 4 and the embodiment 5 increase by about 11% to about 13%.

Moreover, color coordinates of green have been measured as (0.310, 0.639) in the comparative example, and in the embodiment 4, the color coordinates of green have been measured as (0.277, 0.682). Also, in the embodiment 5, the color coordinates of green have been measured as (0.281, 0.681). Therefore, it can be seen that the color coordinates of green of the embodiment 4 and the embodiment 5 are further broadened than those of the comparative example.

Moreover, it can be seen that when a red efficiency of the comparative example is 100%, red efficiencies of the embodiment 4 and the embodiment 5 increase by about 24% to about 27%. Through this, it can be seen that since a red emission layer is further provided in one emission part, red efficiency increases.

Moreover, color coordinates of red have been measured as (0.660, 0.335) in the comparative example, and in the embodiment 4, the color coordinates of red have been measured as (0.669, 0.327). Also, in the embodiment 5, the color coordinates of red have been measured as (0.668, 0.328). Therefore, it can be seen that the color coordinates of red of the embodiment 4 and the embodiment 5 are further broadened than those of the comparative example.

Moreover, when the DCI color space satisfaction level (or the DCI coverage) is 100%, the sharpest image quality is provided. As shown in Table 1, it can be seen that the DCI color space satisfaction level of the comparative example is 87.6%, the DCI color space satisfaction level of the embodiment 4 is 95.7%, and the DCI color space satisfaction level of the embodiment 5 is 94.9%. It can be seen that the DCI color space satisfaction levels of the embodiment 4 and the embodiment 5 are further broadened than that of the comparative example. This is because as a color purity of each of red and green increases, the DCI color space satisfaction level increases. Therefore, it can be seen that the DCI color space satisfaction level is about 94.9% to about 95.7% by applying the structure according to the embodiments of the present invention. That is, it can be seen that an organic light emitting display apparatus which realizes sharper image quality than the comparative example is provided.

The following Table 2 shows efficiencies, color coordinates, and DCI color space satisfaction levels (DCI coverages) of the comparative example, the embodiment 4, and the embodiment 5 when a color layer is changed.

TABLE 2

|  | G Efficiency (%) | Color Coordinates | | R Efficiency (%) | Color Coordinates | | DCI Coverage (%) |
| --- | --- | --- | --- | --- | --- | --- | --- |
|  |  | X | Y |  | X | Y |  |
| Comparative Example | 100 | 0.268 | 0.661 | 100 | 0.670 | 0.325 | 96.7 |
| Embodiment 4 | 120 | 0.240 | 0.707 | 132 | 0.677 | 0.320 | 99.3 |
| Embodiment 5 | 118 | 0.243 | 0.707 | 134 | 0.676 | 0.321 | 99.3 |

As shown in Table 2, it can be seen that when a green efficiency of the comparative example is 100%, green efficiencies of the embodiment 4 and the embodiment 5 increase by about 18% to about 20%.

Moreover, color coordinates of green have been measured as (0.268, 0.661) in the comparative example, and in the embodiment 4, the color coordinates of green have been measured as (0.240, 0.707). Also, in the embodiment 5, the color coordinates of green have been measured as (0.243, 0.707). Therefore, it can be seen that the color coordinates of green of the embodiment 4 and the embodiment 5 are further broadened than those of the comparative example.

Moreover, it can be seen that when a red efficiency of the comparative example is 100%, red efficiencies of the embodiment 4 and the embodiment 5 increase by about 32% to about 34%. Through this, it can be seen that since a red emission layer is further provided in one emission part, red efficiency increases.

Moreover, color coordinates of red have been measured as (0.670, 0.325) in the comparative example, and in the embodiment 4, the color coordinates of red have been measured as (0.677, 0.320). Also, in the embodiment 5, the color coordinates of red have been measured as (0.676, 0.321). Therefore, it can be seen that the color coordinates of red of the embodiment 4 and the embodiment 5 are further broadened than those of the comparative example.

As shown in Table 2, it can be seen that the DCI color space satisfaction level of the comparative example is 96.7%, the DCI color space satisfaction level of the embodiment 4 is 99.3%, and the DCI color space satisfaction level of the embodiment 5 is 99.3%. It can be seen that the DCI color space satisfaction levels of the embodiment 4 and the embodiment 5 are further broadened than that of the comparative example. This is because as a color purity of each of red and green increases, the DCI color space satisfaction level increases. Therefore, it can be seen that the DCI color space satisfaction level is about 99.3% by applying the structure according to the embodiments of the present invention.

Figure 14A:
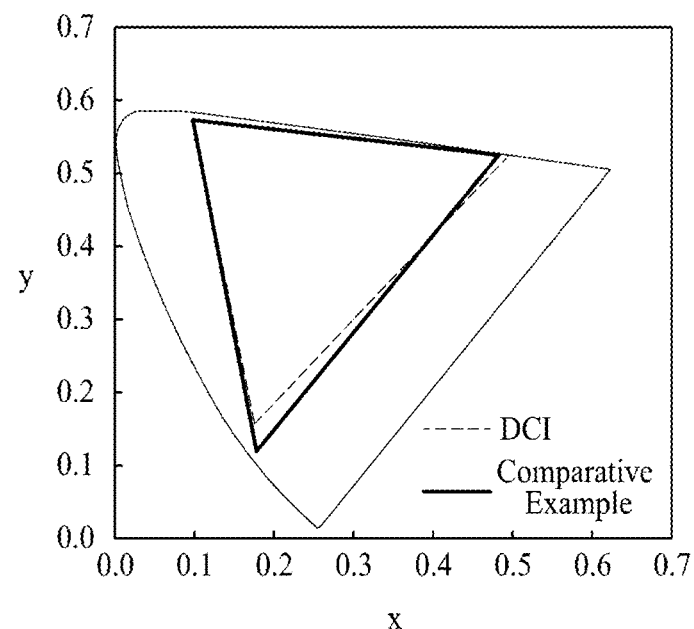
FIGS. 14A and 14B are diagrams illustrating digital cinema initiatives (DCI) according to a fourth embodiment of the present invention and a comparative example.
Figure 14B:
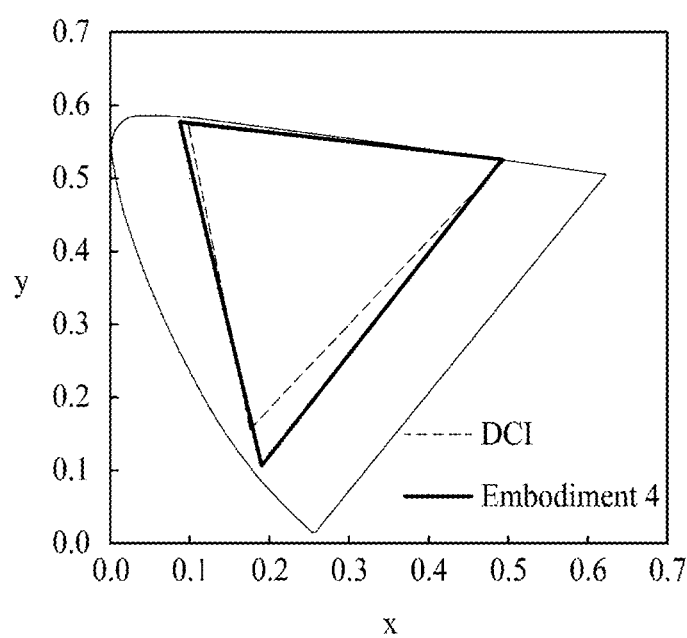
Figure 15A:
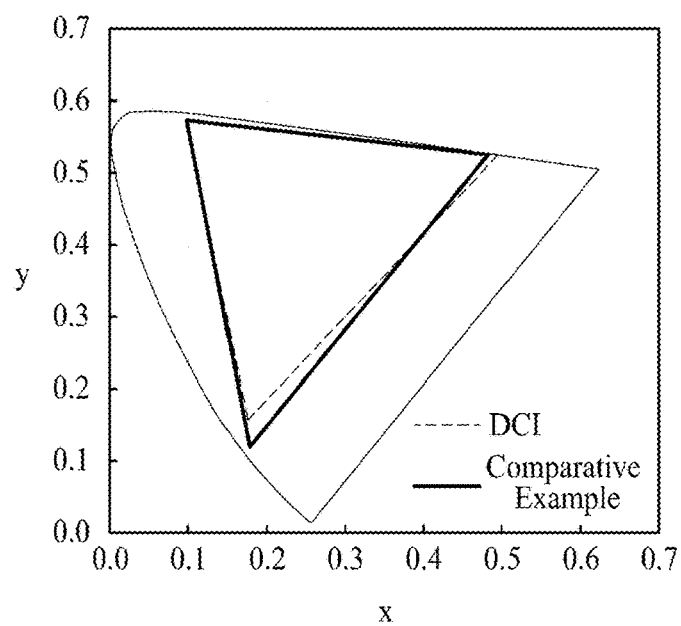
FIGS. 15A and 15B are diagrams illustrating DCI according to a fifth embodiment of the present invention and a comparative example.
Figure 15B:
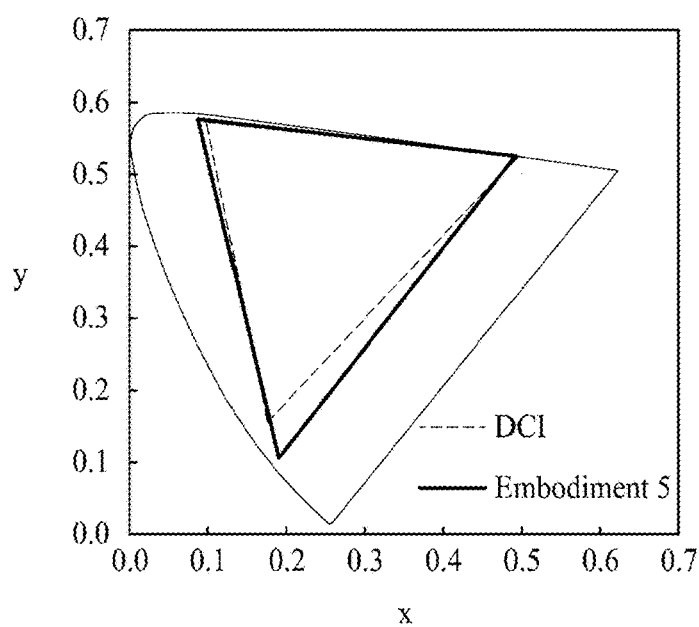

FIGS. 14A and 14B are diagrams illustrating DCI according to a fourth embodiment of the present invention and a comparative example, and FIGS. 15A and 15B are diagrams illustrating DCI according to a fifth embodiment of the present invention and a comparative example. Here, the DCI color space satisfaction level is illustrated as CIE 1976.

FIG. 14A illustrates the comparative example and a DCI color space satisfaction level, and FIG. 14B illustrates the fourth embodiment of the present invention and a DCI color space satisfaction level. As illustrated in FIG. 14A, the comparative example is illustrated as a solid line, and DCI is illustrated as a dotted line. In comparison with DCI it can be seen that in the comparative example, a DCI color space satisfaction level of green is similar to DCI, but a DCI color space satisfaction level of red is reduced.

Moreover, as illustrated in FIG. 14B, the embodiment 4 is illustrated as a solid line, and DCI is illustrated as a dotted line. In comparison with DCI it can be seen that in the embodiment 4, a DCI color space satisfaction level of green increases, and a DCI color space satisfaction level of red also increases. This is because as a color purity of each of red and green increases, the DCI color space satisfaction level increases. Therefore, it can be seen that the DCI color space satisfaction level is about 99% by applying the structure according to the embodiments of the present invention. That is, it can be seen that an organic light emitting display apparatus which realizes sharper image quality than the comparative example is provided.

FIG. 15A illustrates the comparative example and a DCI color space satisfaction level, and FIG. 15B illustrates the fifth embodiment of the present invention and a DCI color space satisfaction level. As illustrated in FIG. 15A, the comparative example is illustrated as a solid line, and DCI is illustrated as a dotted line. In comparison with DCI, it can be seen that in the comparative example, a DCI color space satisfaction level of green is similar to DCI, but a DCI color space satisfaction level of red is reduced.

Moreover, as illustrated in FIG. 15B, the embodiment 5 is illustrated as a solid line, and DCI is illustrated as a dotted line. In comparison with DCI it can be seen that in the embodiment 5, a DCI color space satisfaction level of green increases, and a DCI color space satisfaction level of red also increases. This is because as a color purity of each of red and green increases, the DCI color space satisfaction level increases. Therefore, it can be seen that the DCI color space satisfaction level is about 99% by applying the structure according to the embodiments of the present invention. That is, it can be seen that an organic light emitting display apparatus which realizes sharper image quality than the comparative example is provided.

Figure 16:
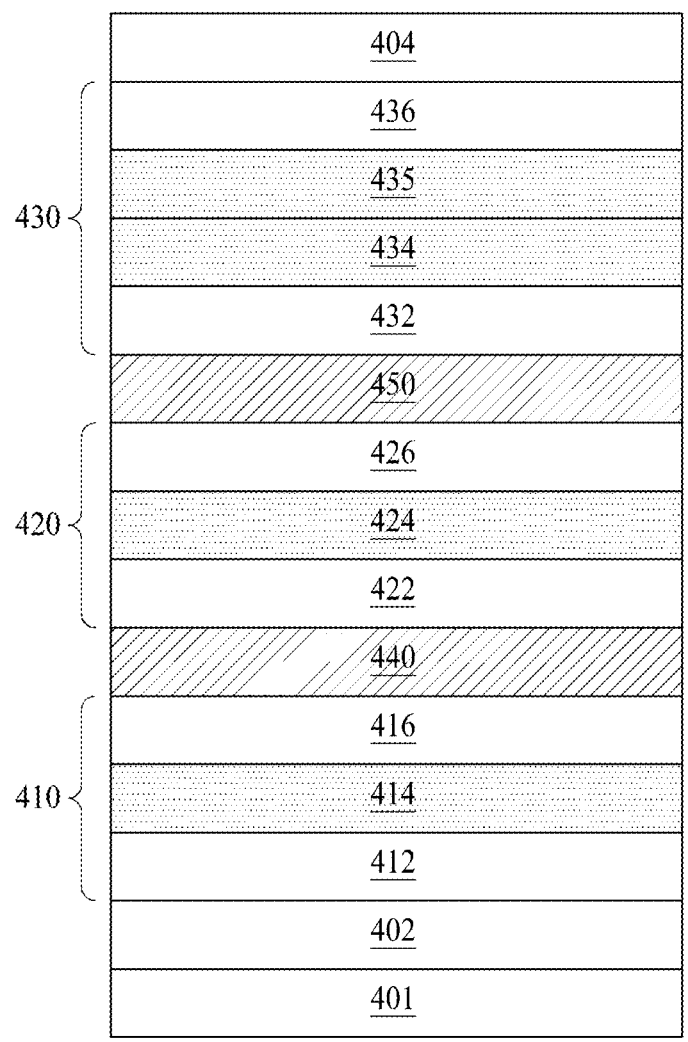
FIG. 16 is a diagram illustrating a white organic light emitting device according to a sixth embodiment of the present invention.

FIG. 16 is a diagram illustrating a white organic light emitting device 400 according to a sixth embodiment of the present invention. In describing the present embodiment, descriptions on elements which are the same as or correspond to the elements according to the preceding embodiment are not repeated.

The white organic light emitting device 400 illustrated in FIG. 16 includes a substrate 401, first and second electrodes 402 and 404, and first to third emission parts 410, 420 and 430 disposed between the first and second electrodes 402 and 404.

The first EML 414 of the first emission part 410 may be formed as a blue emission layer. The first EML 414 may be formed as a deep blue emission layer or a sky blue emission layer in addition to the blue emission layer. An emission peak of an emission area of the first EML 414 may be within a range of 440 nm to 480 nm.

The first EML 414 of the first emission part 410 may be formed as a yellow-green emission layer or a green emission layer. In this case, an emission peak of an emission area of the first EML 414 may be within a range of 510 nm to 570 nm. When the first EML 414 of the first emission part 410 is formed as the yellow-green emission layer or the green emission layer, the first EML 424 of the second emission part 420 may be formed as a blue emission layer. In this case, the first emission part 410 may have an emission peak which is within a range of 510 nm to 580 nm, and the second emission part 420 may have an emission peak which is within a range of 440 nm to 480 nm.

The first EML 424 of the second emission part 420 may be formed as a yellow-green emission layer. An emission peak of an emission area of the first EML 424 may be within a range of 540 nm to 580 nm.

The first EML 424 of the second emission part 420 may be formed as a blue emission layer. The first EML 424 may be formed as a deep blue emission layer or a sky blue emission layer in addition to the blue emission layer. An emission peak of an emission area of the first EML 424 may be within a range of 440 nm to 480 nm. When the first EML 414 of the first emission part 410 is formed as a blue emission layer, the first EML 424 of the second emission part 420 may be formed as a yellow-green emission layer or a green emission layer. In this case, the first emission part 410 may have an emission peak which is within a range of 440 nm to 480 nm, and the second emission part 420 may have an emission peak which is within a range of 510 nm to 580 nm.

The first EML 434 of the third emission part 430 may be formed as a red emission layer, and the second EML 435 may be formed as a blue emission layer. As described above with reference to FIGS. 2 to 7, the red emission layer which is further included in the third emission part 430 may be disposed under the blue emission layer. Also, the blue emission layer which is the second EML 435 may be disposed closer to the second electrode 404 than the red emission layer which is the first EML 434, and thus, a color viewing angle and at least one of red efficiency, green efficiency, and blue efficiency are enhanced.

The second EML 435 of the third emission part 430 may be formed as a deep blue emission layer or a sky blue emission layer in addition to the blue emission layer.

An emission peak of an emission area of the red emission layer which is the first EML 434 may be within a range of 600 nm to 650 nm. Also, an emission peak of an emission area of the blue emission layer which is the second EML 435 may be within a range of 440 nm to 480 nm. Therefore, an emission peak of an emission area of the third emission part 430 may be within a range of 440 nm to 650 nm.

Therefore, the white organic light emitting device according to the sixth embodiment of the present invention has a structure, showing three emission peaks, where the first emission part may be configured with a blue emission layer, the second emission part may be configured with a yellow-green emission layer so as to improve an efficiency of a green emission layer, and the third emission part may be configured with a red emission layer so as to improve an efficiency of the red emission layer. That is, the present invention may apply a structure which has three emission peaks based on the three emission parts. Accordingly, according to the present embodiment, emission efficiency, color purity, and a color reproduction rate or a color viewing angle are enhanced by applying the TER-TEP structure. Also, the lifetime of an organic light emitting device increases more in a case of using the yellow-green emission layer than a case of using the green emission layer.

Here, since the first emission part is configured with a blue emission layer, an emission peak of an emission area of the blue emission layer is within a range of 440 nm to 480 nm. Also, since the second emission part is configured with a yellow-green emission layer, an emission peak of an emission area of the yellow-green emission layer is within a range of 540 nm to 580 nm. Also, since the third emission part is configured with a red emission layer and a blue emission layer, an emission peak of an emission area of the red emission layer is within a range of 600 nm to 650 nm, and an emission peak of an emission area of the blue emission layer is within a range of 440 nm to 480 nm. Therefore, since each of the first and third emission parts is configured with the blue emission layer, the emission peaks of the blue emission layers are shown as one emission peak at 440 nm to 480 nm, and thus, the TER-TEP structure having three emission peaks is provided due to the first to third emission parts.

Alternatively, since the first emission part is configured with a yellow-green emission layer, an emission peak of an emission area of the yellow-green emission layer is within a range of 540 nm to 580 nm. Also, since the second emission part is configured with a blue emission layer, an emission peak of an emission area of the blue emission layer is within a range of 440 nm to 480 nm. Also, since the third emission part is configured with a red emission layer and a blue emission layer, an emission peak of an emission area of the red emission layer is within a range of 600 nm to 650 nm, and an emission peak of an emission area of the blue emission layer is within a range of 440 nm to 480 nm. Therefore, since each of the second and third emission parts is configured with the blue emission layer, the emission peaks of the blue emission layers are shown as one emission peak at 440 nm to 480 nm, and thus, the TER-TEP structure having three emission peaks is provided due to the first to third emission parts.

Alternatively, since the first emission part is configured with a blue emission layer, an emission peak of an emission area of the blue emission layer is within a range of 440 nm to 480 nm. Also, since the second emission part is configured with a yellow-green emission layer, an emission peak of an emission area of the yellow-green emission layer is within a range of 540 nm to 580 nm. Also, since the third emission part is configured with a red emission layer and a blue emission layer, an emission peak of an emission area of the red emission layer is within a range of 600 nm to 650 nm, and an emission peak of an emission area of the blue emission layer is within a range of 440 nm to 480 nm. Therefore, since each of the first and third emission parts is configured with the blue emission layer, the emission peaks of the blue emission layers are shown as two emission peaks at 440 nm to 480 nm, or the emission peaks of the blue emission layers are shown as two different emission peaks at 440 nm to 480 nm. Accordingly, four emission peaks are provided due to the first to third emission parts. That is, due to the three emission parts, the TER-TEP structure includes a structure having four emission peaks.

Alternatively, since the first emission part is configured with a yellow-green emission layer, an emission peak of an emission area of the yellow-green emission layer is within a range of 540 nm to 580 nm. Also, since the second emission part is configured with a blue emission layer, an emission peak of an emission area of the blue emission layer is within a range of 440 nm to 480 nm. Also, since the third emission part is configured with a red emission layer and a blue emission layer, an emission peak of an emission area of the red emission layer is within a range of 600 nm to 650 nm, and an emission peak of an emission area of the blue emission layer is within a range of 440 nm to 480 nm. Therefore, since each of the second and third emission parts is configured with the blue emission layer, the emission peaks of the blue emission layers are shown as two emission peaks at 440 nm to 480 nm, or the emission peaks of the blue emission layers are shown as two different emission peaks at 440 nm to 480 nm. Accordingly, four emission peaks are provided due to the first to third emission parts. That is, due to the three emission parts, the TER-TEP structure includes a structure having four emission peaks.

The white organic light emitting device according to the sixth embodiment of the present invention has been described above as the third emission part being configured with the red emission layer and the blue emission layer, but as described above with reference to FIG. 8, the first emission part may include the red emission layer and the blue emission layer. In this case, the second emission part may be configured with a yellow-green emission layer, and the third emission part may be configured with a blue emission layer. Therefore, the first emission part may have two emission peaks which respectively are within a range of 440 nm to 480 nm and within a range of 600 nm to 650 nm, the second emission part may have an emission peak which is within a range of 510 nm to 580 nm, and the third emission part may have an emission peak which is within a range of 440 nm to 480 nm. That is, the TER-TEP structure may be provided due to the above-described three emission parts.

Alternatively, the first emission part may be configured with a red emission layer and a blue emission layer, the second emission part may be configured with a blue emission layer, and the third emission part may be configured with a yellow-green emission layer. Therefore, the first emission part may have two emission peaks which respectively are within a range of 440 nm to 480 nm and within a range of 600 nm to 650 nm, the second emission part may have an emission peak which is within a range of 440 nm to 480 nm, and the third emission part may have an emission peak which is within a range of 510 nm to 580 nm. That is, the TER-TEP structure may be provided due to the above-described three emission parts.

The white organic light emitting device according to the sixth embodiment of the present invention may be applied to a bottom emission type, but is not limited thereto. The white organic light emitting device according to the fourth embodiment of the present invention may be applied to a top emission type or a dual emission type. In the top emission type or the dual emission type, positions of emission layers may be changed based on a characteristic or a structure of a device. As described above, when two emission layers including a red emission layer are provided, an emission intensity or a color viewing angle change rate of an emission layer is affected by a position of the red emission layer. Therefore, in the white organic light emitting device, the position of the red emission layer may be set based on an emission intensity or a color viewing angle change rate of an emission layer so as to enhance a color viewing angle and at least one of red efficiency, green efficiency, and blue efficiency.

In an organic light emitting display apparatus including the white organic light emitting device according to the sixth embodiment of the present invention, a plurality of gate lines and a plurality of data lines which respectively define a plurality of pixel areas by intersections therebetween and a plurality of power lines which extend in parallel with the gate lines or the data lines may be disposed on the substrate 401, and a switching thin film transistor (TFT) which is connected to a corresponding gate line and a corresponding data line and a driving TFT connected to the switching TFT may be disposed in each of the plurality of pixel areas. The driving TFT may be connected to the first electrode 402.

Figure 17:
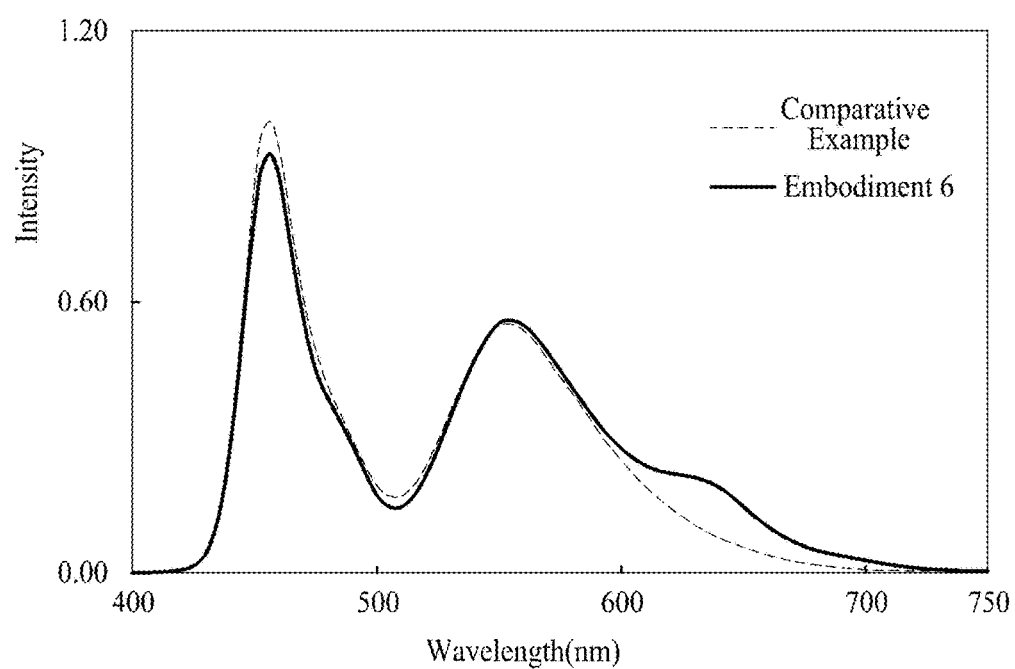
FIG. 17 is a diagram illustrating emission intensities of the white organic light emitting device according to the sixth embodiment of the present invention and a comparative example.

FIG. 17 is a diagram illustrating emission intensities of the white organic light emitting device according to the sixth embodiment of the present invention and a comparative example.

In FIG. 17, the abscissa axis indicates a wavelength range (nm) of light, and the ordinate axis indicates emission intensity. The emission intensity may be a numerical value which is expressed as a relative value with respect to a maximum value of the EL spectrum.

In FIG. 17, the comparative example is illustrated as a dotted line, and an embodiment 6 is illustrated as a solid line.

In FIG. 17, in the comparative example, a first EML of a first emission part may be configured with a blue emission layer, a first EML of a second emission part may be configured with a yellow-green emission layer, and a first EML of a third emission part may be configured with a blue emission layer.

In the embodiment 6, as illustrated in FIG. 16, the first EML 414 of the first emission part 410 may be configured with a blue emission layer, and the first EML 424 of the second emission part 420 may be configured with a yellow-green emission layer. The first emission part 410 may include the first EML 214 which is configured with a deep blue emission layer or a sky blue emission layer in addition to the blue emission layer.

A red emission layer which is the first EML 434 of the third emission part 430 and a blue emission layer which is the second EML 435 may be provided, and the blue emission layer may be disposed on the red emission layer. The second EML 435 may be formed as a deep blue emission layer or a sky blue emission layer in addition to the blue emission layer.

As illustrated in FIG. 17, in the comparative example, it can be seen that emission intensity is shown at 440 nm to 480 nm which is an emission peak of an emission area of a blue emission layer, and emission intensity is shown at 540 nm to 580 nm which is an emission peak of an emission area of a yellow-green emission layer.

Therefore, in the comparative example, colors are mixed because a yellow-green wavelength range overlaps a red wavelength range, and thus, it is difficult to realize desired green and red. For this reason, it is difficult to implement a desired white organic light emitting device. Also, in the comparative example, it can be seen that an emission intensity of a red emission layer is low, and thus, an efficiency of the red emission layer is low.

Moreover, in the comparative example, only yellow-green and blue corresponding to two emission peaks are shown in three emission parts, and yellow-green should realize red and green, causing a reduction in a color purity of each of red and green. For this reason, it is difficult to implement a desired white organic light emitting device.

In the embodiment 6, it can be seen that emission intensity is shown at 440 nm to 480 nm which is an emission peak of an emission area of a blue emission layer, emission intensity is shown at 540 nm to 580 nm which is an emission peak of an emission area of a yellow-green emission layer, and emission intensity is shown at 600 nm to 650 nm which is an emission peak of an emission area of a red emission layer. That is, it can be seen that three emission peaks are shown. Also, since the red emission layer is further provided, an emission intensity of the red emission layer increases, and thus, red efficiency and a color purity of red are enhanced. Here, due to the blue emission layer included in each of the first and third emission parts, the emission peaks of the blue emission layers are shown as two emission peaks at 440 nm to 480 nm, or the emission peaks of the blue emission layers are shown as two different emission peaks at 440 nm to 480 nm. Accordingly, four emission peaks are shown.

Moreover, a color purity of each of red and green increases, and thus, DCI coverage increases. Accordingly, a large-size TV for displaying a sharper and realistic image is provided. Here, the DCI coverage may be referred to as a DCI color space satisfaction level.

Moreover, in the embodiment 6, red, green, and blue wavelengths corresponding to three emission peaks are shown in three emission parts, and thus, at least one among red efficiency, green efficiency, and blue efficiency is enhanced, and color purity and a color reproduction rate or a color viewing angle are enhanced. Also, the red, green, and blue wavelengths corresponding to the three emission peaks are shown in the three emission parts, and thus, at least one of red efficiency, green efficiency, and blue efficiency is enhanced, and color purity and a color reproduction rate or a color viewing angle are enhanced. Here, due to the blue emission layer included in each of the first and third emission parts, the emission peaks of the blue emission layers are shown as two emission peaks at 440 nm to 480 nm, or the emission peaks of the blue emission layers are shown as two different emission peaks at 440 nm to 480 nm. Accordingly, four emission peaks are shown due to the first to third emission parts.

The above-described red efficiency, color coordinates, and DCI coverage will be described below in detail with reference to Table 3 and FIGS. 18A and 18B.

Here, the DCI coverage may be referred to as a DCI color space satisfaction level. TVs which are being developed at present are required to satisfy a DCI P3 color gamut which is expanded by about 130% of the existing sRGB, for displaying a sharper and realistic image. DCI P3 may be an RGB color space and may be referred to as a color reproduction rate representing a color space which is broader than sRGB. However, DCI P3 is not limited thereto. The color reproduction rate may be referred to as a color space, a color area, a color reproduction area, a color reproduction range, or a color gamut. Also, depending on requirements of consumers and development of a product, the color reproduction rate may be changed in range and may be used as various terms. Also, coverage may be referred to as a range where DCI overlaps a color space of a display apparatus.

The following Table 3 shows efficiencies, color coordinates, and DCI coverages of the comparative example and the embodiment 6. The following Table 3 may be obtained by applying the same color layer as the color layer of Table 2 and performing measurement In the comparative example, a first EML of a first emission part may be configured with a blue emission layer, a first EML of a second emission part may be configured with a yellow-green emission layer, and a first EML of a third emission part may be configured with a blue emission layer.

TABLE 3

|  | G Efficiency (%) | Color Coordinates | | R Efficiency (%) | Color Coordinates | | DCI Coverage (%) |
| --- | --- | --- | --- | --- | --- | --- | --- |
|  |  | X | Y |  | X | Y |  |
| Comparative Example | 100 | 0.268 | 0.661 | 100 | 0.670 | 0.325 | 96.7 |
| Embodiment 6 | 98 | 0.274 | 0.659 | 148 | 0.681 | 0.317 | 98.0 |

As shown in Table 3, it can be seen that when a green efficiency of the comparative example is 100%, a green efficiency of the embodiment 6 decrease by about 2%. Also, it can be seen that when a red efficiency of the comparative example is 100%, a red efficiency of the embodiment 6 increase by about 48%. Through this, it can be seen that since a red emission layer is further provided in one emission part, red efficiency increases.

Moreover, color coordinates of green have been measured as (0.268, 0.661) in the comparative example, and in the embodiment 6, the color coordinates of green have been measured as (0.274, 0.659). Also, color coordinates of red have been measured as (0.670, 0.325) in the comparative example, and in the embodiment 6, the color coordinates of red have been measured as (0.681, 0.317). Therefore, it can be seen that the color coordinates of red of the embodiment 6 are further broadened than those of the comparative example.

Moreover, when the DCI color space satisfaction level (or the DCI coverage) is 100%, the sharpest image quality is provided. As shown in Table 3, it can be seen that the DCI color space satisfaction level of the comparative example is 96.7%, and the DCI color space satisfaction level of the embodiment 6 is 98.0%. It can be seen that the DCI color space satisfaction level of the embodiment 6 is further broadened than that of the comparative example. This is because as a color purity of each of red and green increases, the DCI color space satisfaction level increases. Therefore, it can be seen that the DCI color space satisfaction level is about 98.0% by applying the structure according to the embodiments of the present invention. That is, it can be seen that an organic light emitting display apparatus which realizes sharper image quality than the comparative example is provided.

Figure 18A:
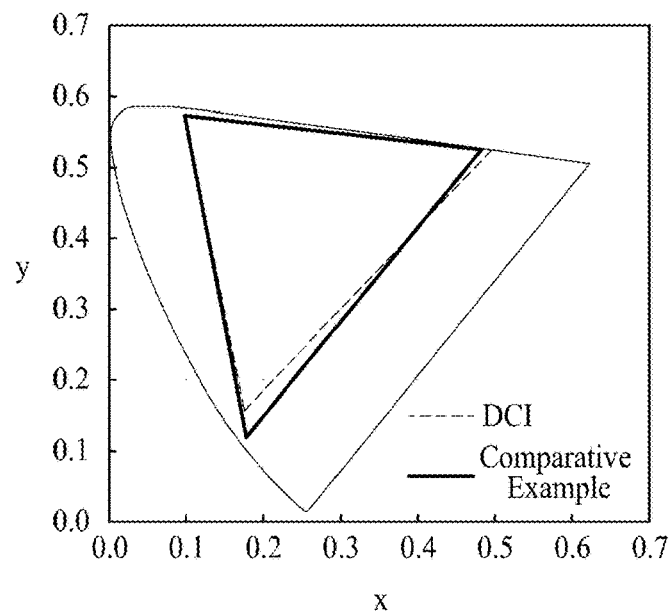
FIGS. 18A and 18B are diagrams illustrating DCI according to a sixth embodiment of the present invention and a comparative example.
Figure 18B:
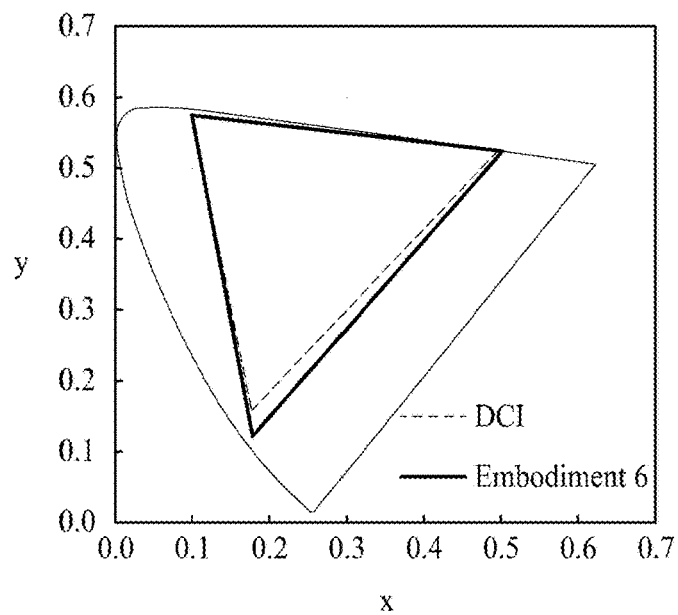

FIGS. 18A and 18B are diagrams illustrating DCI according to a sixth embodiment of the present invention and a comparative example. Here, the DCI color space satisfaction level is illustrated as CIE 1976.

FIG. 18A illustrates the comparative example and a DCI color space satisfaction level, and FIG. 18B illustrates the sixth embodiment of the present invention and a DCI color space satisfaction level. As illustrated in FIG. 18A, the comparative example is illustrated as a solid line, and DCI is illustrated as a dotted line. In comparison with DCI it can be seen that in the comparative example, a DCI color space satisfaction level of green is similar to DCI, but a DCI color space satisfaction level of red is reduced.

Moreover, as illustrated in FIG. 18B, the embodiment 6 is illustrated as a solid line, and DCI is illustrated as a dotted line. In comparison with DCI, it can be seen that in the embodiment 6, a DCI color space satisfaction level of green is almost similar to DCI, and a DCI color space satisfaction level of red also increases. This is because as a color purity of each of red and green increases, the DCI color space satisfaction level increases. Therefore, it can be seen that the DCI color space satisfaction level is about 98.0% by applying the structure according to the embodiments of the present invention. That is, it can be seen that an organic light emitting display apparatus which realizes sharper image quality than the comparative example is provided.

As described above, according to the embodiments of the present invention, at least one of three emission parts is configured with two emission layers including a red emission layer, and a position of the red emission layer is set, thereby enhancing a color viewing angle and at least one of red efficiency, green efficiency, and blue efficiency.

Moreover, according to the embodiments of the present invention, a red emission layer is added into one emission part, and thus, an emission intensity of the red emission layer increases, thereby enhancing an emission efficiency of the red emission layer.

Moreover, according to the embodiments of the present invention, one emission part is configured with two emission layers (for example, a blue emission layer and a red emission layer), and the blue emission layer is disposed closer to a first electrode than the red emission layer, thereby enhancing an emission intensity of an emission layer and a color reproduction rate or a color viewing angle.

Moreover, according to the embodiments of the present invention, one emission part is configured with two emission layers (for example, a blue emission layer and a red emission layer), and the blue emission layer is disposed closer to a second electrode than the red emission layer, thereby enhancing an emission intensity of an emission layer and a color reproduction rate or a color viewing angle.

Moreover, according to the embodiments of the present invention, a red emission layer is added into one emission part, and by applying a green emission layer, a color purity of red and a color purity of green increase, and DCI coverage is broadened. Accordingly, televisions (TVs) having a large-size screen provide a sharper image.

Moreover, according to the embodiments of the present invention, by applying a TER-TEP structure having three emission peaks to three emission parts, emission efficiency, color purity, and a color reproduction rate or a color viewing angle are enhanced.

Furthermore, the inventors have recognized a problem when two emission layers including a red emission layer are provided, driving voltage increases, and quantum efficiency is considerably reduced. To solve the problem, the inventors have experimented on various methods for enhancing luminance and a color reproduction rate and lowering the driving voltage when one emission part is configured with a red emission layer and another emission layer.

Figure 19:
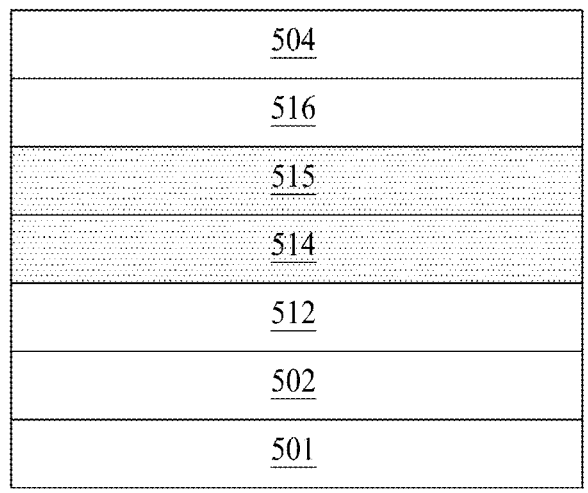
FIG. 19 is a schematic cross-sectional view illustrating a white organic light emitting device according to a seventh embodiment of the present invention.

FIG. 19 is a schematic cross-sectional view illustrating a white organic light emitting device 500 according to a seventh embodiment of the present invention.

In the white organic light emitting device 500 illustrated in FIG. 19, an emission part may be configured with two emission layers, for enhancing a color reproduction rate of a device.

The white organic light emitting device 500 includes a substrate 501, first and second electrodes 502 and 504, and an emission part disposed between the first and second electrodes 502 and 504. Here, the emission part may include a first EML 514 and a second EML 515.

The first electrode 502 is an anode that supplies a hole, and may be formed of indium tin oxide (ITO) or indium zinc oxide (IZO) which is a transparent conductive material such as transparent conductive oxide (TCO). However, the present embodiment is not limited thereto.

The second electrode 504 is a cathode that supplies an electron, and may be formed of gold (Au), silver (Ag), aluminum (Al), molybdenum (Mo), or magnesium (Mg) which is a metal material, or may be formed of an alloy thereof. However, the present embodiment is not limited thereto.

Each of the first electrode 502 and the second electrode 504 may be referred to as an anode or a cathode. Also, the first electrode 502 may be referred to as a semitransmissive electrode, and the second electrode 504 may be referred to as a reflective electrode.

Herein, the bottom emission type will be described.

The emission part may include a first HTL 512, a first EML 514, a second EML 515, and a first ETL 516 which are disposed on the first electrode 502.

The first EML 514 of the emission part may be formed as a blue emission layer, and the second EML 515 may be formed as a red emission layer. The second EML 515 may be provided for improving a color reproduction rate. This will be described with reference to FIGS. 2 to 7. However, when one emission part is configured with two emission layers which include a blue emission layer and a red emission layer, emission intensity decreases, a driving voltage increases due to an increase in a thickness of a device, and quantum efficiency is reduced.

Figure 20:
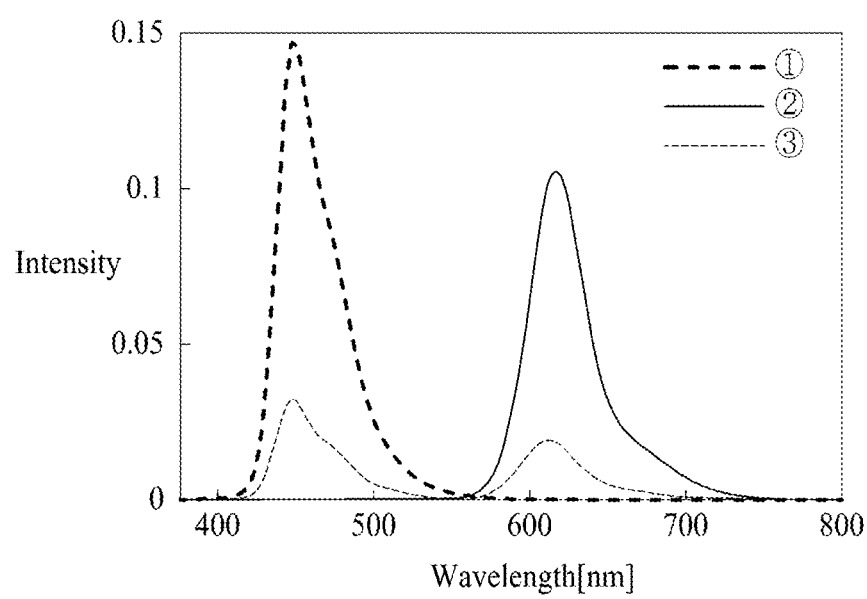
FIG. 20 is a diagram illustrating an emission intensity of an emission layer according to a seventh embodiment of the present invention.

This will be described in detail with reference to 20. FIG. 20 shows emission intensity which has been measured when each of a blue emission layer, a red emission layer, and each of a blue emission layer and red emission layer has a single color.

In FIG. 20, the abscissa axis indicates a wavelength range (nm) of light, and the ordinate axis indicates emission intensity. The emission intensity may be a numerical value which is expressed as a relative value with respect to a maximum value of the EL spectrum.

As illustrated in FIG. 20, when the emission part is configured with a blue emission layer (referred to by ① in FIG. 20), it can be seen that emission intensity increases at 440 nm to 480 nm which is an emission peak of an emission area of the blue emission layer. Also, when the emission part is configured with a red emission layer (referred to by ② in FIG. 20), it can be seen that emission intensity increases at 600 nm to 650 nm which is an emission peak of an emission area of the red emission layer.

On the other hand, when the emission part is configured with two emission layers which include a blue emission layer and a red emission layer (referred to by ③ in FIG. 20), it can be seen that emission intensity is considerably reduced at 440 nm to 480 nm, which is an emission peak of an emission area of the blue emission layer, and at 600 nm to 650 nm which is an emission peak of an emission area of the red emission layer. Therefore, when one emission part is configured with two emission layers, it can be seen that emission intensity is reduced.

A result obtained by measuring the driving voltage and quantum efficiency is shown in the following Table 4.

TABLE 4

| Emission Part | | | |
|---|---|---|---|
| Blue Emission Layer | Red Emission Layer | Volt (V) | EQE (%) |
| ① Host + Dopant | — | 3.7 | 8.9 |
| ② — | Host + Dopant | 3.1 | 9.9 |
| ③ Host + Dopant | Host + Dopant | 4.3 | 3.6 |

As shown in Table 4, it can be seen that a driving voltage of when the emission part is configured with a blue emission layer (referred to by ①) is 3.7 V, and the driving voltage of when the emission part is configured with a red emission layer (referred to by ②) is 3.1 V. Also, it can be seen that a driving voltage of when the emission part is configured with a blue emission layer and a red emission layer (referred to by ③) is 4.3 V. Therefore, it can be seen that the driving voltage increases more in a case, where the emission part is configured with the blue emission layer and the red emission layer (referred to by ③), than a case where the emission part is configured with the blue emission layer (referred to by ①) or the red emission layer (referred to by ②).

In Table 4, EQE is external quantum efficiency and denotes an emission efficiency of when light is transferred to outside an organic light emitting device. A quantum efficiency (EQE) of the blue emission layer (referred to by ①) may be 8.9%, and a quantum efficiency (EQE) of the red emission layer (referred to by ②) may be 9.9%. Also, when the emission part is configured with the blue emission layer and the red emission layer (referred to by ③), quantum efficiency (EQE) is predicted as about 9.0% which is an intermediate value, but it can be seen that quantum efficiency (EQE) is considerably reduced by 3.6% which is about 40% of 9.0% which is the intermediate value. That is, it can be seen that quantum efficiency (EQE) is far more reduced in a case, where the emission part is configured with the blue emission layer and the red emission layer, than a case where the emission part is configured with a single layer (for example, the blue emission layer or the red emission layer).

Therefore, when one emission part is configured with a blue emission layer and a red emission layer, the driving voltage increases, and quantum efficiency is reduced. This is caused by characteristics of emission layers and will be described in detail with reference to FIG. 21.

Figure 21:
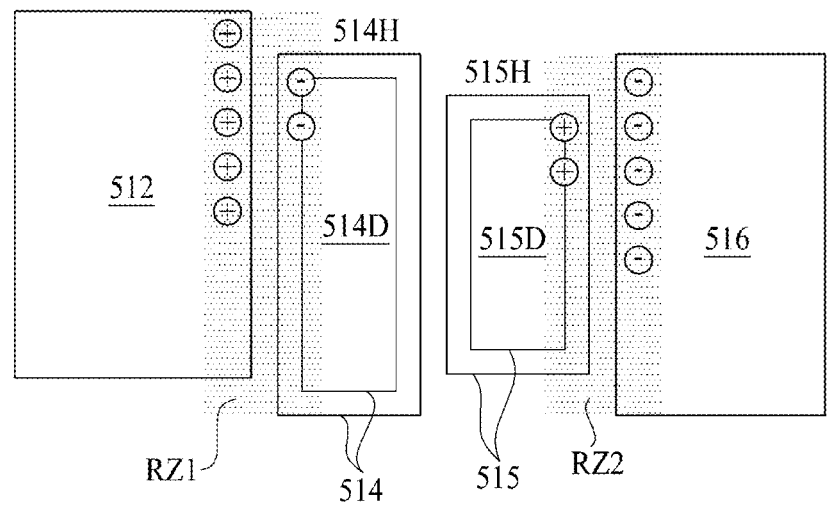
FIG. 21 illustrates an energy band diagram of the emission layer according to the seventh embodiment of the present invention.

FIG. 21 illustrates an energy band diagram of the emission layer according to the seventh embodiment of the present invention.

In FIG. 21, each of the blue emission layer 514 and the red emission layer 515 may include a host and a dopant. A host 514H of the blue emission layer 514 may include anthracene derivatives, and for example, may use TBSA (9,10-bis[(2″,7″-di-t-butyl)-9′,9″-spirobifluorenyl]anthracene) or 1-ADN (9,10-di(2-naphyhyl)anthracene). However, the present embodiment is not limited thereto. Also, a dopant 514D of the blue emission layer 514 may include anthracene derivatives, perylene derivatives, or pyrene derivatives, but is not limited thereto. On the other hand, the dopant 514D may be formed of a fluorescent material having at least one among spiro-DPVBi, spiro-6P, distyryl-benzene (DSB), distyryl arylene (DSA), PFO-based polymer, and PPV-based polymer, but is not limited thereto.

A host 515H of the red emission layer 515 may include anthracene derivatives, and for example, may use MADN (2-methyl-9,10-di(2-naphthyl) anthracene). A dopant 515D of the red emission layer 515 may be formed of a fluorescent material containing pyran derivatives, for example, DCJTB (4-(dicyanomethylene)-2-tert-butyl-6-(1,1,7,7-tetramethyl-julolidyl-9-enyl)-4H-pyran), boron derivatives, or perylene derivatives, but is not limited thereto.

The host 514H of the blue emission layer 514 may be strong in electron transfer characteristic, and the dopant 514D may be strong in hole trap characteristic. Also, the host 515H of the red emission layer 515 may be weak in electron transfer characteristic, and the dopant 515D may be strong in hole trap characteristic.

Therefore, the blue emission layer 514 may be fast in electron mobility, and the red emission layer 515 may be fast in hole mobility. Thus, it is difficult to transfer carriers, received by the HTL 512 or the ETL 516, from the inside of the blue emission layer 514 to the red emission layer 515 subsequent thereto, and for this reason, the driving voltage increases. Alternatively, it is difficult to transfer the carriers, received by the HTL 512 or the ETL 516, from the inside of the red emission layer 515 to the blue emission layer 514 subsequent thereto, and for this reason, the driving voltage increases. Therefore, a hole and an electron may be recombined in the blue emission layer 514 or the red emission layer 515, and for this reason, the number of excitons is reduced.

That is, as illustrated in FIG. 21, a recombination zone RZ1 of the blue emission layer 514 may be provided between the blue emission layer 514 and the HTL 512, and a recombination zone RZ2 of the red emission layer 515 may be provided between the red emission layer 515 and the ETL 516. Therefore, the recombination zone RZ1 of the blue emission layer 514 and the recombination zone RZ2 of the red emission layer 515 may be small, and for this reason, emission efficiency of each of the blue emission layer 514 and the red emission layer 515 is reduced.

Moreover, excitons which are combined in the blue emission layer 514 may emit light from the red emission layer 515 where energy is relatively low, and for this reason, the blue emission layer 514 is more difficult to emit light.

Therefore, the inventors have recognized that in a case where one emission part is configured with a blue emission layer and a red emission layer so as to enhance a luminance and a color reproduction rate of a white organic light emitting device, an emission efficiency of each of the blue emission layer and the red emission layer is reduced, and for this reason, the case is not suitable for device characteristic.

To solve such a problem, the inventors have invented a white organic light emitting device having a new structure where when one emission part is configured with a blue emission layer and a red emission layer, an emission efficiency of each of the blue emission layer and the red emission layer is improved.

Therefore, the inventors have invented a white organic light emitting device having a new structure for solving a problem, where the driving voltage increases or quantum efficiency decreases when one emission part is configured with two emission layers, and enhancing luminance and a color reproduction rate.

According to the embodiments of the present invention, in an organic light emitting device including at least two emission parts, one of the at least two emission parts may include a blue emission layer and a red emission layer, and the blue emission layer may be disposed close to the first electrode. Therefore, each of the blue emission layer and the red emission layer may emit light at an emission peak of a desired emission area, and thus, an emission intensity and a color reproduction rate of each of the blue emission layer and the red emission layer are enhanced. Also, an emission efficiency of each of the blue emission layer and the red emission layer is enhanced by adjusting an energy gap between a dopant and a host which are included in the red emission layer.

The inventors have confirmed that as the energy gap between the dopant and the host included in the red emission layer increases, it is difficult to transfer energy from the host to the dopant. This will be described in detail with reference to Table 5.

TABLE 5

| Red Emission Layer | ΔEg (H − D) (eV) | Volt (V) | EQE (%) |
|---|---|---|---|
| Embodiment 8-1 | 0.4 | 3.1 | 9.9 |
| Embodiment 8-2 | 0.8 | 3.3 | 7.0 |
| Embodiment 8-3 | 1.0 | 3.6 | 5.3 |

In Table 5, an embodiment 8-1 may consist of a red host and a red dopant. The red host and the red dopant may be formed of at least one of the above-described materials, but are not limited thereto.

An embodiment 8-2 may consist of a green host and a red dopant. The green host may include anthracene derivatives, and for example, may be formed of a material containing TBSA (9,10-bis[(2″,7″-di-t-butyl)-9′,9″-spirobifluorenyl]anthracene) or 1-ADN (9,10-di(2-naphyhyl)anthracene), but is not limited thereto. Also, the red dopant may be formed of at least one of the above-described materials, but is not limited thereto.

An embodiment 8-3 may consist of a blue host and a red dopant. The blue host and the red dopant may be formed of at least one of the above-described materials, but are not limited thereto.

As shown in Table 5, it can be seen that in an energy gap "ΔEg(H-D)" between the dopant and the host which are included in the red emission layer, the embodiment 8-1 is 0.4 eV, the embodiment 8-2 is 0.8 eV, and an embodiment 8-3 is 1.0 eV. Also, it can be seen that in the driving voltage "Volt", the embodiment 8-1 is 3.1 V, the embodiment 8-2 is 3.3 V, and the embodiment 8-3 is 3.6 V. Also, it can be seen that in quantum efficiency "EQE", the embodiment 8-1 is 9.9%, the embodiment 8-2 is 7.0%, and the embodiment 8-3 is 5.3%.

Therefore, in the embodiment 8-2 or 8-3 where the energy gap "ΔEg(H-D)" between the dopant and the host included in the red emission layer is large, it can be seen that the driving voltage increases, and the quantum efficiency "EQE" is reduced.

Figure 22:
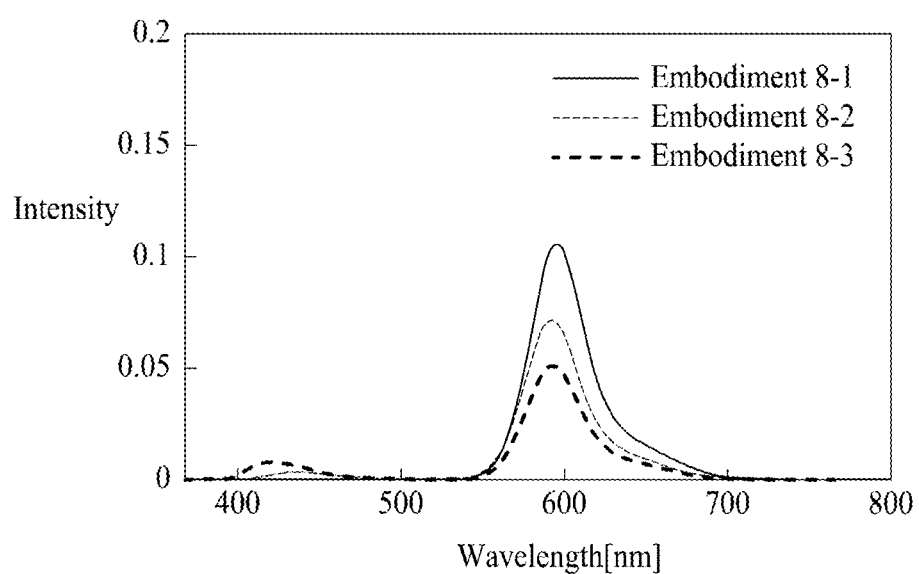
FIG. 22 is a diagram illustrating an emission intensity of a red emission layer according to an eighth embodiment of the present invention.

FIG. 22 is a diagram illustrating an emission intensity of the red emission layer shown in Table 5. In FIG. 22, it can be seen that as the energy gap between the dopant and the host included in the red emission layer increases, emission intensity is lowered. Therefore, it can be seen that when the energy gap between the dopant and the host in the embodiment 8-2 or 8-3 is greater than 0.4 eV, emission intensity at 600 nm to 650 nm which is an emission peak of the red emission layer is lower than that of the embodiment 8-1 where the energy gap between the dopant and the host is small.

Moreover, a result is obtained by measuring light which is emitted from a host at an emission peak of 400 nm to 500 nm, whether emission of light from a dopant is suppressed due to an energy gap difference between the host and the dopant. That is, in the embodiment 8-1, it can be seen that the host does not emit light at 400 nm to 500 nm, and thus, red light is emitted from both the host and the dopant. On the other hand, in the embodiment 8-2 or 8-3, it can be seen that since the host emits light at 400 nm to 500 nm, blue light in addition to red light is emitted, and energy is not transferred from the host to the dopant. Therefore, it can be seen that in a case where an emission layer where an energy gap between the dopant and the host is large is provided as a single layer, since it is difficult to transfer energy from the host to the dopant, an emission efficiency of the emission layer is reduced, the driving voltage increases, and emission intensity is reduced.

Based on the result, the red emission layer of the embodiment 8-1 where the energy gap between the dopant and the host is small is provided along with a blue emission layer, and the inventors have performed various experiments for device characteristic. However, in a case where the red emission layer of the embodiment 8-1 is provided along with the blue emission layer, the inventors have recognized that an emission intensity of the red emission layer increases, an emission intensity of the blue emission layer is considerably reduced, and the case is not suitable for device characteristic.

Moreover, in a case where the red emission layer of the embodiment 8-2 or 8-3 where the energy gap between the dopant and the host is large is provided along with the blue emission layer, the inventors have recognized that emission of light from the red emission layer is suppressed, and the blue emission layer emits light. That is, the inventors have recognized that an emission efficiency of the red emission layer is maintained, and an emission efficiency of the blue emission layer is improved.

This will be described in detail with reference to Table 6 and FIG. 23.

The following Table 6 may show a driving voltage and an external quantum efficiency of each of a blue emission layer and a red emission layer when one emission part is configured with the blue emission layer and the red emission layer.

TABLE 6

| Red Emission Layer | ΔEg (H − D) (eV) | Blue Emission Layer | Volt (V) | EQE (%) |
|---|---|---|---|---|
| Embodiment 9-1 | 0.4 | Host + Dopant | 4.3 | 3.6 |
| Embodiment 9-2 | 0.8 | | 3.6 | 6.9 |
| Embodiment 9-3 | 1.0 | | 3.7 | 7.5 |

In Table 6, structures of embodiments 9-1, 9-2, and 9-3 of the red emission layer are the same as those of Table 5, and thus, their detailed descriptions are not provided.

In Table 6, a host of the blue emission layer may include anthracene derivatives, and for example, may be formed of a material containing TBSA (9,10-bis[(2",7"-di-t-butyl)-9',9"-spirobifluorenyl]anthracene) or 1-ADN (9,10-di(2-napyhyl)anthracene), but is not limited thereto. Also, a dopant of the blue emission layer may include anthracene derivatives, perylene derivatives, or pyrene derivatives, but is not limited thereto.

As shown in Table 6, it can be seen that in a driving voltage "Volt", the embodiment 9-1 is 4.3 V, the embodiment 9-2 is 3.6 V, and the embodiment 9-3 is 3.7 V. Also, it can be seen that in external quantum efficiency "EQE", the embodiment 9-1 is 3.6%, the embodiment 9-2 is 6.9%, and the embodiment 9-3 is 7.5%.

Therefore, in the embodiments 9-2 and 9-3 where an energy gap between a dopant and a host included in the red emission layer is large, it can be seen that the driving voltage is low, and the quantum efficiency "EQE" increases. This is because when the red emission layer where the energy gap between the dopant and the host is large is applied, an exciton is generated from the dopant of the blue emission layer instead of the red emission layer, and thus, an emission efficiency of the blue emission layer increases.

Therefore, it can be seen from the result of Table 6 that when the energy gap between the dopant and the host included in the red emission layer is 0.4 eV, the driving voltage is high, and the external quantum efficiency is reduced. On the other hand, it can be seen that in the red emission layer where the energy gap between the dopant and the host is greater than 0.4 eV, the driving voltage is low, and the external quantum efficiency increases.

Moreover, a case where an emission part is configured with only the red emission layer of Table 5 and a case where an emission part is configured with the red emission layer and blue emission layer of Table 6 will be described below through comparison.

It can be seen that the driving voltage of the embodiment 8-1 in Table 5 is 3.1 V, and in Table 6, the driving voltage of the embodiment 9-1 is 4.3 V. Also, the quantum efficiency "EQE" of the embodiment 8-1 in Table 5 is 9.9%, and the quantum efficiency "EQE" of the embodiment 9-1 in Table 6 is 3.6%. In the embodiment 9-1 where one emission part is configured with two emission layers, it can be seen that the quantum efficiency "EQE" is considerably reduced.

Therefore, based on a result of the embodiment 9-1 in Table 6, it can be seen that when the red emission layer where the energy gap between the dopant and the host is small is provided along with the blue emission layer, the driving voltage increases, and the quantum efficiency is reduced.

On the other hand, it can be seen that the driving voltage of the embodiment 8-2 in Table 5 is 3.3 V, and in Table 6, the driving voltage of the embodiment 9-2 is 3.6 V. Also, the quantum efficiency "EQE" of the embodiment 8-2 in Table 5 is 7.0%, and the quantum efficiency "EQE" of the embodiment 9-2 in Table 6 is 6.9%. Also, it can be seen that the driving voltage of the embodiment 8-3 in Table 5 is 3.6 V, and in Table 6, the driving voltage of the embodiment 9-3 is 3.7 V. Also, the quantum efficiency "EQE" of the embodiment 8-3 in Table 5 is 5.3%, and the quantum efficiency "EQE" of the embodiment 9-3 in Table 6 is 7.5%.

Therefore, based on results of the embodiments 9-1 and 9-3 in Table 6, it can be seen that when the red emission layer where the energy gap between the dopant and the host is large is provided along with the blue emission layer, the driving voltage decreases, and the quantum efficiency increases or is almost maintained.

Based on the result, it can be seen that in a case where the energy gap between the dopant and the host of the red emission layer is 0.4 eV or less than 0.4 eV, the driving voltage increases, and the quantum efficiency is considerably reduced, whereby the case is not suitable for device characteristic. That is, it can be seen that in a case where the energy gap between the dopant and the host of the red emission layer is greater than 0.4 eV, characteristics such as a low driving voltage and quantum efficiency are good, and thus, the case is suitable for device characteristic. Alternatively, it can be seen that in a case where the energy gap between the dopant and the host of the red emission layer is greater than 0.4 eV and equal to or less than 1.2 eV, characteristics such as a low driving voltage and quantum efficiency are good, and thus, the case is suitable for device characteristic.

Therefore, through experiments, the inventors have confirmed that when one emission part is configured with two emission layers including a red emission layer, a red emission layer where an energy gap between a dopant and a host is large does not affect device characteristic such as a driving voltage or emission efficiency.

Figure 23:
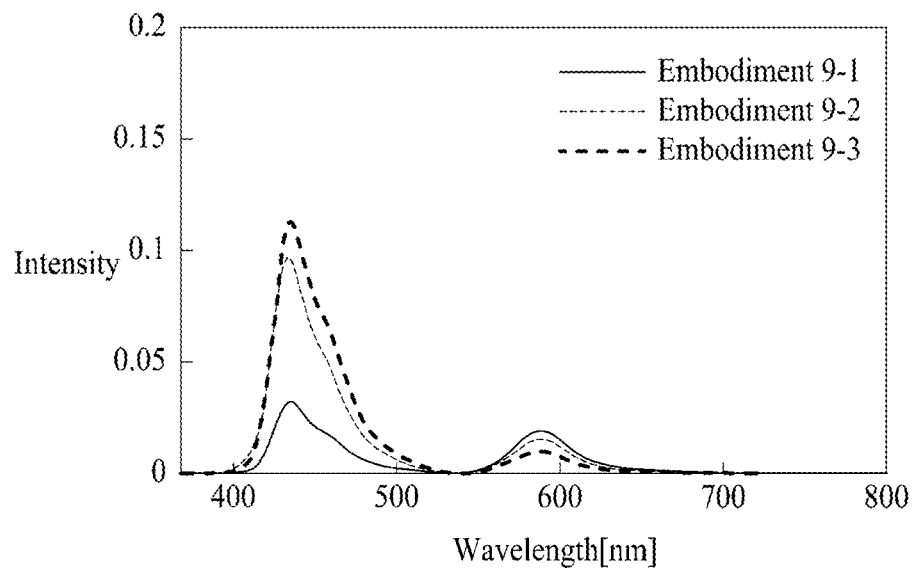
FIG. 23 is a diagram illustrating emission intensities of a blue emission layer and a red emission layer according to a ninth embodiment of the present invention.

FIG. 23 is a diagram illustrating emission intensities of a blue emission layer and a red emission layer according to a ninth embodiment of the present invention. That is, FIG. 23 shows emission intensity when the energy gap between the host and the dopant of the red emission layer in Table 6 differs from an energy gap between the host and the dopant of the blue emission layer.

As illustrated in FIG. 23, in the embodiment 9-3 where the energy gap between the dopant and the host of the red emission layer is large, it can be seen that emission intensity increases at 440 nm to 480 nm which is an emission peak of an emission area of the blue emission layer. Also, it can be seen that emission intensity is shown at 600 nm to 650 nm which is an emission peak of an emission area of the red emission layer. Therefore, it can be seen that when one emission part is configured with a blue emission layer and a red emission layer where an energy gap between a dopant and a host is large, an emission intensity of the red emission layer is slightly reduced, and an emission intensity of the blue emission layer increases greatly.

Therefore, in the present embodiment, since an energy gap between a dopant and a host of a red emission layer and an energy gap between a dopant and a host of a blue emission layer are differently set, an emission efficiency of each of the blue emission layer and the red emission layer is improved, a driving voltage is reduced, and an emission intensity of the blue emission layer increases considerably. Also, in the present embodiment, since the energy gap between the dopant and the host of the red emission layer is set greater than the energy gap between the dopant and the host of the blue emission layer, an emission efficiency of each of the blue emission layer and the red emission layer is improved, the driving voltage is reduced, and an emission intensity of the blue emission layer increases considerably. Also, since the host included in the red emission layer uses a green or blue host which has a shorter wavelength than that of red, emission of red light by an exciton is suppressed, and emission of blue light is induced, whereby the driving voltage is reduced and an emission intensity of the blue emission layer increases considerably.

Figure 24:
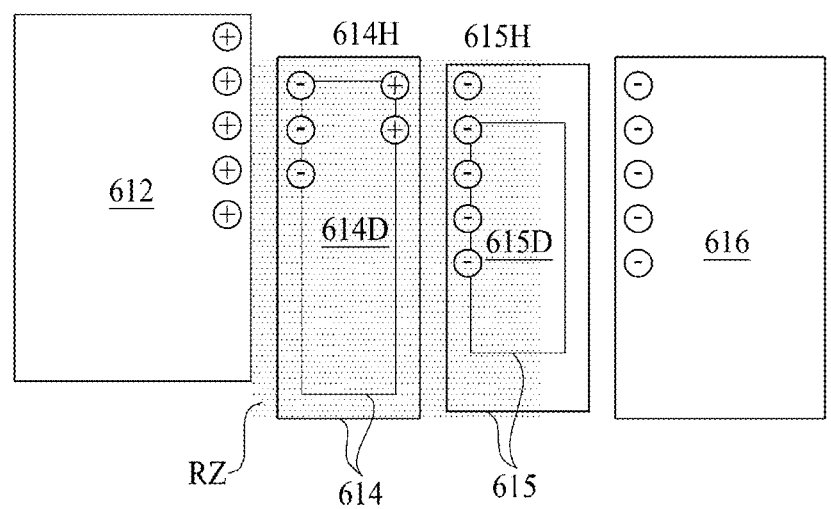
FIG. 24 illustrates an energy band diagram of an emission layer according to a ninth embodiment of the present invention.

FIG. 24 illustrates an energy band diagram of an emission layer according to a ninth embodiment of the present invention.

As illustrated in FIG. 24, since an energy gap between a dopant and a host of a red emission layer and an energy gap between a dopant and a host of a blue emission layer may be differently set, and thus, a recombination zone RZ where an exciton is generated by combining an electron with a hole may be provided between a blue emission 614 and a red emission layer 615. Therefore, the recombination zone RZ may be broader provided than the recombination zone of FIG. 21, and thus, the blue emission layer is easy to emit light, and an emission efficiency of each of the blue emission layer and the red emission layer increases.

As described above, a host 615H of the red emission layer 615 is weaker in electron characteristic than hole characteristic, and thus, electron mobility should be greater than hole mobility in order for an electron to be well transferred to an ETL 616. Therefore, an electron mobility of the host 615H may be set to $10^{-5}$ cm$^2$/Vs, and a hole mobility of the host 615H may be set to $10^{-10}$-$10^{-11}$ cm$^2$/Vs. Accordingly, the recombination zone RZ becomes broader provided than the recombination zone of FIG. 21, and the blue emission layer and the red emission layer smoothly emit light.

Moreover, an energy gap of the host 615H of the red emission layer 615 may be set to 2.6 eV to 3.0 eV, and an energy gap of a dopant 615D may be set to 1.8 eV to 2.2 eV. Therefore, an energy gap between the host 615H and the dopant 615D of the red emission layer 615 may be set greater than 0.4 eV. Alternatively, the energy gap between the host 615H and the dopant 615D of the red emission layer 615 may be set greater than 0.4 eV and 1.2 eV or less.

Moreover, an energy gap between a host 614H and a dopant 614D of the blue emission layer 614 should be less than the energy gap between the host 615H and the dopant 615D of the red emission layer 615. An energy gap of the host 614H of the blue emission layer 614 may be set to 2.8 eV to 3.2 eV, and an energy gap of the host 614H may be set to 2.6 eV to 3.0 eV. Therefore, in order for energy to be easily transferred from the host 614H to the dopant 614D of the blue emission layer 614, the energy gap between the host 614H and the dopant 614D of the blue emission layer 614 may be set to 0.4 eV or less.

That is, since the energy gap between the host 615H and the dopant 615D included in the red emission layer 615 is set greater than the energy gap between the host 614H and the dopant 614D included in the blue emission layer 614, excitons which are combined in the red emission layer 615 emit light in the dopant 614D of the blue emission layer 614, thereby preventing an emission efficiency of the blue emission layer 614 from being reduced. Also, since the energy gap between the host 615H and the dopant 615D included in the red emission layer 615 is set greater than the energy gap between the host 614H and the dopant 614D included in the blue emission layer 614, emission of light from the red emission layer is suppressed, and emission of light from the blue emission layer increases, thereby increasing an emission efficiency of the blue emission layer.

Moreover, by applying a host material of blue or green which has a relatively broader wavelength than that of red or has a short wavelength, emission of light from a red emission layer is suppressed, and emission of light from a blue emission adjacent to the red emission layer is improved.

A thickness of the blue emission layer 614 may be set to 100 Å to 250 Å. Also, the blue emission layer 614 is weaker in hole characteristic than electron characteristic, and thus, HTL materials may be mixed at a rate of 0% to 50% in the blue emission layer 614. Also, a doping concentration of the dopant 614D included in the blue emission layer 614 may be set to 2.0% to 8.0%.

A thickness of the red emission layer 615 may be set to 30 Å to 100 Å. Also, the red emission layer 615 is weaker in electron characteristic than hole characteristic, and thus, ETL materials may be mixed at a rate of 0% to 50% in the red emission layer 615. Also, a doping concentration of the dopant 615D included in the red emission layer 615 may be set to 0.5% to 2.0%.

Figure 25:
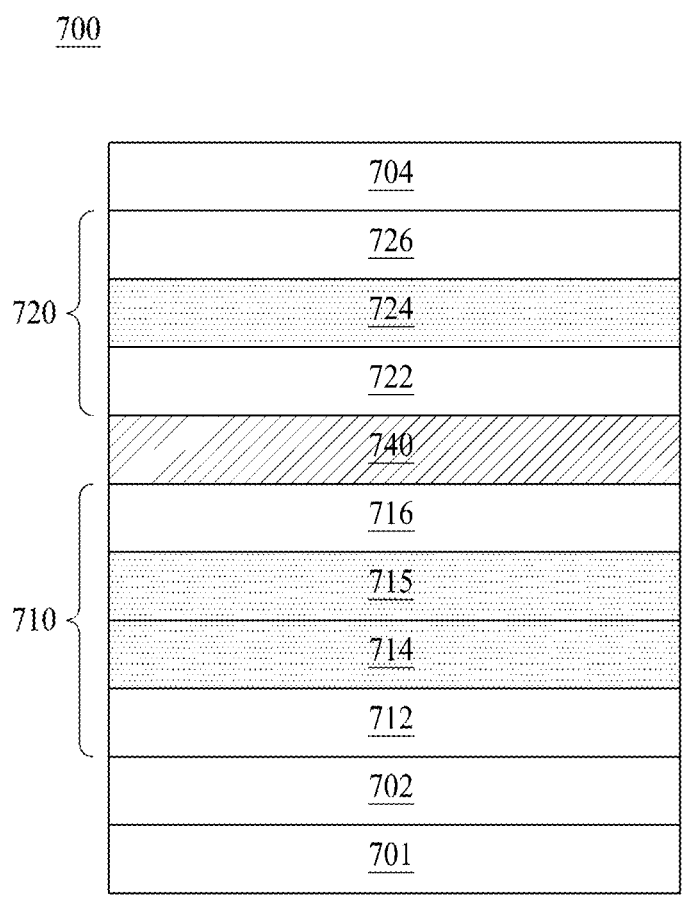
FIG. 25 is a schematic cross-sectional view illustrating a white organic light emitting device according to a tenth embodiment of the present invention.

FIG. 25 is a schematic cross-sectional view illustrating a white organic light emitting device 700 according to a tenth embodiment of the present invention. In describing the present embodiment, descriptions on elements which are the same as or correspond to the elements according to the preceding embodiment are not repeated.

The white organic light emitting device 700 illustrated in FIG. 25 includes a substrate 701, first and second electrodes 702 and 704, and first and second emission parts 710 and 720 disposed between the first and second electrodes 702 and 704.

A case, where three emission parts are provided and a first emission part is configured with two emission layers including a red emission layer, has been described above as an example of the fourth embodiment of the present invention. A case, where a first emission part is configured with two emission layers including a red emission layer as described above with reference o FIGS. 2 to 7, may be applied to a case where two emission parts are provided. That is, a position of a red emission layer may be set so as to enhance a color viewing angle change rate and at least one of red efficiency, green efficiency, and blue efficiency. Therefore, in the present embodiment, the first emission part disposed between the first electrode and the second electrode and the second emission part disposed on the first emission part may be provided, at least one of the first and second emission parts may be configured with at least two emission layers including a red emission layer, and a position of the red emission layer may be set so as to enhance a color reproduction rate and at least one of red efficiency, green efficiency, and blue efficiency. Also, according to the present embodiment, emission efficiency, color purity, and a color reproduction rate or a color viewing angle are enhanced by applying a TER-TEP structure having three emission peaks to two emission parts.

The substrate 701 may be formed of an insulating material or a material having flexibility. The substrate 701 may be formed of glass, metal, or plastic, but is not limited thereto. When an organic light emitting display apparatus is a flexible organic light emitting display apparatus, the substrate 701 may be formed of a flexible material such as plastic.

The first electrode 702 is an anode that supplies a hole, and may be formed of indium tin oxide (ITO) or indium zinc oxide (IZO) which is a transparent conductive material such as transparent conductive oxide (TCO). However, the present embodiment is not limited thereto.

The second electrode 704 is a cathode that supplies an electron, and may be formed of gold (Au), silver (Ag), aluminum (Al), molybdenum (Mo), or magnesium (Mg) which is a metal material, or may be formed of an alloy thereof. However, the present embodiment is not limited thereto.

Each of the first electrode 702 and the second electrode 704 may be referred to as an anode or a cathode.

The first emission part 710 may include a first HTL 712, a first EML 714, a second EML 715, and a first ETL 716 which are disposed on the first electrode 702.

Although not shown, an HIL may be further formed on the first electrode 702.

A hole supplied through the first HIL 712 and an electron supplied through the first ETL 716 may be recombined in the first and second EMLs 714 and 715 to emit light.

The first HTL 712 may be formed of two or more layers or two or more materials.

The first ETL 716 may be formed of two or more layers or two or more materials.

An HBL may be further formed on the second EML 715. The first ETL 716 and the HBL may be provided as one layer or single layer.

An EBL may be further formed under the first EML 714. The first HTL 712 and the EBL may be provided as one layer or single layer.

The second emission part 720 may include a second HTL 722, a first EML 724, and a second ETL 726.

Although not shown, in the second emission part 720, an EIL may be further formed on the second ETL 726. Also, the second emission part 720 may further include an HIL.

The second HTL 722 may be formed of the same material as that of the first HTL 712, but is not limited thereto.

The second HTL 722 may be formed of two or more layers or two or more materials.

The second ETL 726 may be formed of the same material as that of the first ETL 716, but is not limited thereto.

The second ETL 726 may be formed of two or more layers or two or more materials.

An HBL may be further formed on the first EML 724. The second ETL 726 and the HBL may be provided as one layer or single layer.

An EBL may be further formed under the first EML 724. The second HTL 722 and the EBL may be provided as one layer or single layer.

A CGL 740 may be further formed between the first emission part 710 and the second emission part 720. The CGL 740 may adjust a balance of electrical charges between the first emission part 710 and the second emission part 720. The CGL 740 may include an N-type CGL and a P-type CGL.

The N-type CGL may be formed as an organic layer on which alkali metal such as lithium (Li), sodium (Na), potassium (K), or cesium (Cs) or alkali earth metal such as magnesium (Mg), strontium (Sr), barium (Ba), or radium (Ra) is doped, but is not limited thereto.

The P-type CGL may be formed as an organic layer including a P-type dopant, but is not limited thereto.

The CGL 740 may be formed of a single layer.

The first EML 714 of the first emission part 710 may be formed as a blue emission layer, and the second EML 715 may be formed as a red emission layer. Therefore, a blue emission layer which is the first EML 714 may be disposed closer to the first electrode 702 than a red emission layer which is the second EML 715, and thus, a color viewing angle and at least one of red efficiency, green efficiency, and blue efficiency are enhanced. When light is emitted at 440 nm to 480 nm which is an emission peak of an emission area of the blue emission layer and at 600 nm to 650 nm which is an emission peak of an emission area of the red emission layer, maximum efficiency is obtained in a white area of the contour map. When the blue emission layer is disposed closer to the first electrode 702 than the red emission layer, light is emitted at an emission peak of a desired emission area. Due to such a structure, an emission intensity and a color reproduction rate of each of the blue emission layer and the red emission layer increase.

Moreover, the first EML 714 of the first emission part 710 may be formed as a deep blue emission layer or a sky blue emission layer in addition to the blue emission layer. The second EML 715 of the first emission part 710 may be formed as a red emission layer. Therefore, an emission peak of an emission area of the first emission part 710 may be within a range of 440 nm to 650 nm.

The first EML 724 of the second emission part 720 may be formed as a yellow-green emission layer or a green emission layer. An emission peak of an emission area of the first EML 724 may be within a range of 510 nm to 580 nm.

Therefore, the white organic light emitting device according to the tenth embodiment of the present invention has a structure, showing three emission peaks, where the first emission part may be configured with a red emission layer and a blue emission layer so as to improve an efficiency of the red emission layer, and the second emission part may be configured with a green emission layer so as to improve an efficiency of the green emission layer. That is, the present invention may apply a structure which has three emission peaks based on the two emission parts. Accordingly, according to the present embodiment, emission efficiency, color purity, and a color reproduction rate or a color viewing angle are enhanced by applying the TER-TEP structure.

Here, since the first emission part is configured with a blue emission layer and a red emission layer, an emission peak of an emission area of the blue emission layer is within a range of 440 nm to 480 nm, and an emission peak of an emission area of the red emission layer is within a range of 600 nm to 650 nm. Also, since the second emission part is configured with a yellow-green emission layer, an emission peak of an emission area of the yellow-green emission layer is within a range of 540 nm to 580 nm. Therefore, the TER-TEP structure may be a structure which has three emission peaks based on the first and second emission parts. That is, the TER-TEP structure may include a structure which has three emission peaks based on two emission parts.

Therefore, in the white organic light emitting device according to the tenth embodiment of the present invention, the first emission part may be configured with a blue emission layer and a red emission layer. Also, an energy gap of the red emission layer may be set greater than an energy gap of the blue emission layer, and thus, an emission efficiency of each of the blue emission layer and the red emission layer is improved, and a driving voltage is reduced. Also, a host included in the red emission layer may use a host having a shorter wavelength than that of red so that an emission efficiency of each of the blue emission layer and the red emission layer is enhanced and a driving voltage is reduced. A short-wavelength host may be a blue or green host.

The white organic light emitting device according to the tenth embodiment of the present invention may be applied to a bottom emission type, but is not limited thereto. The white organic light emitting device according to the tenth embodiment of the present invention may be applied to a top emission type or a dual emission type. In the top emission type or the dual emission type, positions of emission layers may be changed based on a characteristic or a structure of a device. As described above, when two emission layers including a red emission layer are provided, an emission intensity or a color viewing angle change rate of an emission layer is affected by a position of the red emission layer. Therefore, in the white organic light emitting device, the position of the red emission layer may be set based on an emission intensity or a color viewing angle change rate of an emission layer so as to enhance a color viewing angle and at least one of red efficiency, green efficiency, and blue efficiency. Also, an organic light emitting device may be implemented by adjusting an energy gap between a host and a dopant included in the red emission layer and an energy gap between a host and a dopant included in the blue emission layer, so that an emission efficiency of each of the blue emission layer and the red emission layer is enhanced and a driving voltage is reduced.

In an organic light emitting display apparatus including the white organic light emitting device according to the tenth embodiment of the present invention, a plurality of gate lines and a plurality of data lines which respectively define a plurality of pixel areas by intersections therebetween and a plurality of power lines which extend in parallel with the gate lines or the data lines may be disposed on the substrate 701, a switching thin film transistor (TFT) which is connected to a corresponding gate line and a corresponding data line and a driving TFT connected to the switching TFT may be disposed in each of the plurality of pixel areas. The driving TFT may be connected to the first electrode 702.

Figure 26:
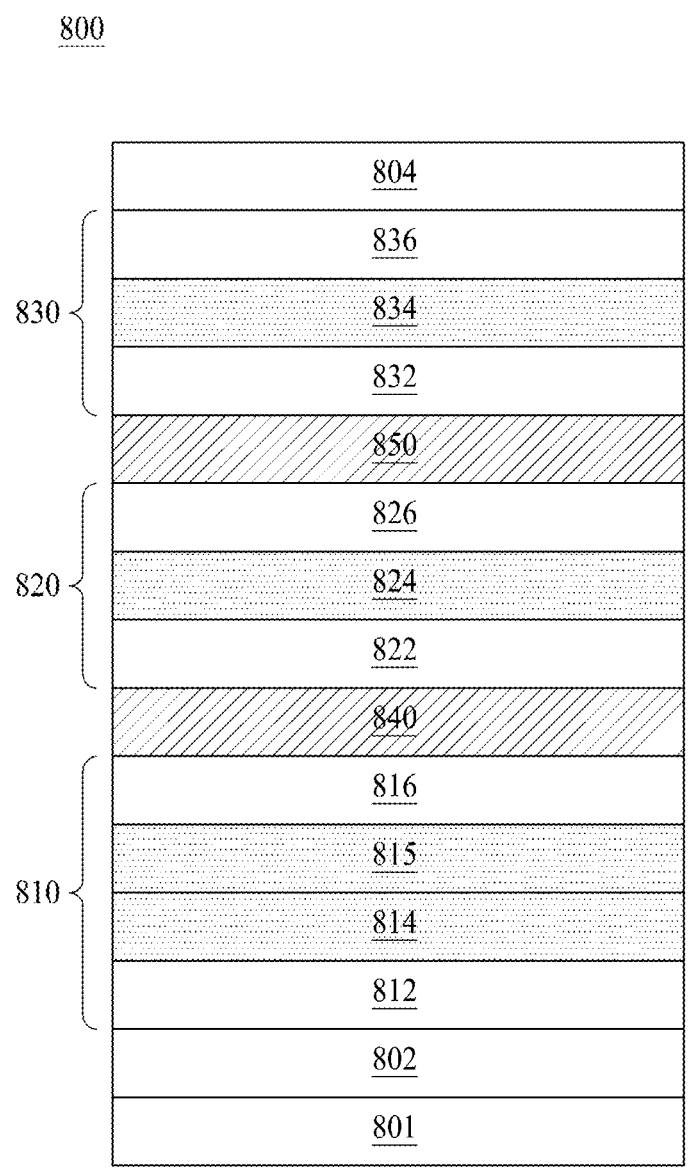
FIG. 26 is a schematic cross-sectional view illustrating a white organic light emitting device according to an eleventh embodiment of the present invention.

FIG. 26 is a schematic cross-sectional view illustrating a white organic light emitting device 800 according to an eleventh embodiment of the present invention. In describing the present embodiment, descriptions on elements which are the same as or correspond to the elements according to the preceding embodiment are not repeated.

The white organic light emitting device 800 illustrated in FIG. 26 includes a substrate 801, first and second electrodes 802 and 804, and first to third emission parts 810, 820 and 830 disposed between the first and second electrodes 802 and 804.

The substrate 801 may be formed of an insulating material or a material having flexibility. The substrate 801 may be formed of glass, metal, or plastic, but is not limited thereto. When an organic light emitting display apparatus is a flexible organic light emitting display apparatus, the substrate 801 may be formed of a flexible material such as plastic.

The first electrode 802 is an anode that supplies a hole, and the second electrode 804 is a cathode that supplies an electron. Each of the first electrode 702 and the second electrode 704 may be referred to as an anode or a cathode.

The first emission part 810 may include a first HTL 812, a first EML 814, a second EML 815, and a first ETL 816 which are disposed on the first electrode 802.

Although not shown, an HIL may be further formed on the first electrode 802.

The first HTL 812 may be formed of two or more layers or two or more materials.

The first ETL 816 may be formed of two or more layers or two or more materials.

An HBL may be further formed on the second EML 815. The first ETL 816 and the HBL may be provided as one layer or single layer.

An EBL may be further formed under the first EML 814. The first HTL 812 and the EBL may be provided as one layer or single layer.

The first EML 814 of the first emission part 810 may be formed as a blue emission layer, and the second EML 815 may be formed as a red emission layer. Therefore, a blue emission layer which is the first EML 814 may be disposed closer to the first electrode 802 than a red emission layer which is the second EML 815, and thus, a color viewing angle and at least one of red efficiency, green efficiency, and blue efficiency are enhanced. When light is emitted at 440 nm to 480 nm which is an emission peak of an emission area of the blue emission layer 814 and at 600 nm to 650 nm which is an emission peak of an emission area of the red emission layer 815, maximum efficiency is obtained in a white area of the contour map. When the blue emission layer 814 is disposed closer to the first electrode 802 than the red emission layer 815, light is emitted at an emission peak of a desired emission area. Due to such a structure, an emission intensity and a color reproduction rate of each of the blue emission layer and the red emission layer increase.

Moreover, the first EML 814 of the first emission part 810 may be formed as a deep blue emission layer or a sky blue emission layer in addition to the blue emission layer. An emission peak of an emission area of the first emission part 810 may be within a range of 440 nm to 480 nm.

The second emission part 820 may include a second HTL 822, a first EML 824, and a second ETL 826.

Although not shown, in the second emission part 820, an EIL may be further formed on the second ETL 826. Also, the second emission part 820 may further include an HIL.

The second HTL 822 may be formed of the same material as that of the first HTL 812, but is not limited thereto.

The second HTL 822 may be formed of two or more layers or two or more materials.

The second ETL 826 may be formed of the same material as that of the first ETL 816, but is not limited thereto.

The second ETL 826 may be formed of two or more layers or two or more materials.

An HBL may be further formed on the first EML 824. The second ETL 826 and the HBL may be provided as one layer or single layer.

An EBL may be further formed under the first EML 824. The second HTL 822 and the EBL may be provided as one layer or single layer.

The first EML 824 of the second emission part 820 may be formed as a yellow-green emission layer or a green emission layer. An emission peak of an emission area of the first EML 824 may be within a range of 510 nm to 580 nm.

Moreover, the second EML 824 of the second emission part 820 may be formed as a blue emission layer. The first EML 824 may be formed as a deep blue emission layer or a sky blue emission layer in addition to the blue emission layer. An emission peak of an emission area of the first EML 824 may be within a range of 440 nm to 480 nm.

A first CGL 840 may be further formed between the first emission part 810 and the second emission part 820. The first CGL 840 may adjust a balance of charges between the first emission part 810 and the second emission part 820. The first CGL 840 may include an N-type CGL and a P-type CGL.

The N-type CGL may be formed as an organic layer on which alkali metal such as lithium (Li), sodium (Na), potassium (K), or cesium (Cs) or alkali earth metal such as magnesium (Mg), strontium (Sr), barium (Ba), or radium (Ra) is doped, but is not limited thereto.

The P-type CGL may be formed as an organic layer including a P-type dopant, but is not limited thereto.

The first CGL 840 may be formed of a single layer.

The third emission part 830 may include a third ETL 836, a third EML 834, and a third HTL 832 which are disposed under the second electrode 804.

Although not shown, the third emission part may further include an EIL which is disposed on the third ETL 836. Also, an HIL may be further formed.

The third HTL 832 may be formed of TPD(N,N-bis(3-methylphenyl)-N,N'-bis(phenyl)-benzidine) or NPB(N,N'-bis(naphthalen-1-yl)-N,N'-bis(phenyl)-benzidine), but is not limited thereto.

The third HTL 832 may be formed of two or more layers or two or more materials.

The third ETL 836 may be formed of oxadiazole, phenanthroline, benzoxazole, or benzthiazole, but is not limited thereto.

The third ETL 836 may be formed of two or more layers or two or more materials.

A second CGL 850 may be further formed between the second emission part 820 and the third emission part 830. The second CGL 850 may adjust a balance of electrical charges between the second emission part 820 and the third emission part 830. The second CGL 850 may include an N-type CGL and a P-type CGL.

The N-type CGL may inject an electron into the second emission part 820, and the P-type CGL may inject a hole into the third emission part 830.

The N-type CGL may be formed as an organic layer on which alkali metal such as lithium (Li), sodium (Na), potassium (K), or cesium (Cs) or alkali earth metal such as magnesium (Mg), strontium (Sr), barium (Ba), or radium (Ra) is doped, but is not limited thereto.

The P-type CGL may be formed as an organic layer including a P-type dopant, but is not limited thereto. The first CGL 840 may be formed of the same material as that of the N-CGL and the P-CGL of the second CGL 850, but is not limited thereto. The second CGL 850 may be formed of a single layer.

The first EML 834 of the third emission part 830 may be formed as a blue emission layer. The first EML 834 may be formed as a deep blue emission layer or a sky blue emission layer in addition to the blue emission layer. An emission peak of an emission area of the first EML 834 may be within a range of 440 nm to 480 nm. When the first EML 834 of the third emission part 830 is formed as a blue emission layer, the first EML 824 of the second emission part 820 may be formed as a yellow-green emission layer or a green emission layer. In this case, the second emission part 820 may have an emission peak which is within a range of 510 nm to 580 nm, and the third emission part 830 may have an emission peak which is within a range of 440 nm to 480 nm.

Moreover, the first EML 834 of the third emission part 830 may be formed as a yellow-green emission layer or a green emission layer. An emission peak of an emission area of the first EML 834 may be within a range of 510 nm to 580 nm. When the first EML 834 of the third emission part 830 is formed as a yellow-green emission layer or a green emission layer, the first EML 824 of the second emission part 820 may be formed as a blue emission layer. In this case, the second emission part 820 may have an emission peak which is within a range of 440 nm to 480 nm, and the third emission part 830 may have an emission peak which is within a range of 510 nm to 580 nm.

Here, since the first emission part is configured with a red emission layer and a blue emission layer, an emission peak of an emission area of the red emission layer is within a range of 600 nm to 650 nm, and an emission peak of an emission area of the blue emission layer is within a range of 440 nm to 480 nm. Also, since the second emission part is configured with a yellow-green emission layer or a green emission layer, an emission peak of an emission area of the yellow-green emission layer or the green emission layer is within a range of 510 nm to 580 nm. Also, since the third emission part is configured with a blue emission layer, an emission peak of an emission area of the blue emission layer is within a range of 440 nm to 480 nm. Therefore, since each of the first and third emission parts is configured with the blue emission layer, the emission peaks of the blue emission layers are shown as one emission peak at 440 nm to 480 nm, and thus, the TER-TEP structure having three emission peaks is provided due to the first to third emission parts.

Alternatively, since the first emission part is configured with a red emission layer and a blue emission layer, an emission peak of an emission area of the red emission layer is within a range of 600 nm to 650 nm, and an emission peak of an emission area of the blue emission layer is within a range of 440 nm to 480 nm. Also, since the second emission part is configured with a blue emission layer, an emission peak of an emission area of the blue emission layer is within a range of 440 nm to 480 nm. Also, since the third emission part is configured with a yellow-green emission layer or a green emission layer, an emission peak of an emission area of the yellow-green emission layer or the green emission layer is within a range of 510 nm to 580 nm. Therefore, since each of the first and second emission parts is configured with the blue emission layer, the emission peaks of the blue emission layers are shown as one emission peak at 440 nm to 480 nm, and thus, the TER-TEP structure having three emission peaks is provided due to the first to third emission parts.

Alternatively, since the first emission part is configured with a red emission layer and a blue emission layer, an emission peak of an emission area of the red emission layer is within a range of 600 nm to 650 nm, and an emission peak of an emission area of the blue emission layer is within a range of 440 nm to 480 nm. Also, since the second emission part is configured with a yellow-green emission layer or a green emission layer, an emission peak of an emission area of the yellow-green emission layer or the green emission layer is within a range of 510 nm to 580 nm. Also, since the third emission part is configured with a blue emission layer, an emission peak of an emission area of the blue emission layer is within a range of 440 nm to 480 nm. Therefore, since each of the first and third emission parts is configured with the blue emission layer, the emission peaks of the blue emission layers are shown as two emission peaks at 440 nm to 480 nm, or the emission peaks of the blue emission layers are shown as two different emission peaks at 440 nm to 480 nm. Accordingly, four emission peaks are provided due to the first to third emission parts. That is, due to the three emission parts, the TER-TEP structure includes a structure having four emission peaks.

Alternatively, since the first emission part is configured with a red emission layer and a blue emission layer, an emission peak of an emission area of the red emission layer is within a range of 600 nm to 650 nm, and an emission peak of an emission area of the blue emission layer is within a range of 440 nm to 480 nm. Also, since the second emission part is configured with a blue emission layer, an emission peak of an emission area of the blue emission layer is within a range of 440 nm to 480 nm. Also, since the third emission part is configured with a yellow-green emission layer or a green emission layer, an emission peak of an emission area of the yellow-green emission layer or the green emission layer is within a range of 510 nm to 580 nm. Therefore, since each of the first and second emission parts is configured with the blue emission layer, the emission peaks of the blue emission layers are shown as two emission peaks at 440 nm to 480 nm, or the emission peaks of the blue emission layers are shown as two different emission peaks at 440 nm to 480 nm. Accordingly, four emission peaks are provided due to the first to third emission parts. That is, due to the three emission parts, the TER-TEP structure includes a structure having four emission peaks.

Therefore, in the white organic light emitting device according to the eleventh embodiment of the present invention, the first emission part may be configured with a blue emission layer and a red emission layer. Also, an energy gap between a host and a dopant included in the red emission layer may be set greater than an energy gap between a host and a dopant included in the blue emission layer, and thus, an emission efficiency of each of the blue emission layer and the red emission layer is improved, and a driving voltage is reduced. Also, the host included in the red emission layer may use a host having a shorter wavelength than that of red so that an emission efficiency of each of the blue emission layer and the red emission layer is enhanced and a driving voltage is reduced. A short-wavelength host may be a blue or green host.

The white organic light emitting device according to the eleventh embodiment of the present invention may be applied to a bottom emission type, but is not limited thereto. The white organic light emitting device according to the eleventh embodiment of the present invention may be applied to a top emission type or a dual emission type. In the top emission type or the dual emission type, positions of emission layers may be changed based on a characteristic or a structure of a device. As described above, when two emission layers including a red emission layer are provided, an emission intensity or a color viewing angle change rate of an emission layer is affected by a position of the red emission layer. Therefore, in the white organic light emitting device, the position of the red emission layer may be set based on an emission intensity or a color viewing angle change rate of an emission layer so as to enhance a color viewing angle and at least one of red efficiency, green efficiency, and blue efficiency. Also, an organic light emitting device may be implemented by adjusting the energy gap between the host and the dopant included in the red emission layer and the energy gap between the host and the dopant included in the blue emission layer, so that an emission efficiency of each of the blue emission layer and the red emission layer is enhanced and a driving voltage is reduced.

In an organic light emitting display apparatus including the white organic light emitting device according to the eleventh embodiment of the present invention, a plurality of gate lines and a plurality of data lines which respectively define a plurality of pixel areas by intersections therebetween and a plurality of power lines which extend in parallel with the gate lines or the data lines may be disposed on the substrate 801, and a switching thin film transistor (TFT) which is connected to a corresponding gate line and a corresponding data line and a driving TFT connected to the switching TFT may be disposed in each of the plurality of pixel areas. The driving TFT may be connected to the first electrode 802.

A result obtained by measuring a device characteristic of the white organic light emitting device of FIG. 26 will be described in detail with reference to Tables 7 and 8 and FIG. 27.

When a red emission layer and a blue emission layer according to the embodiments of the present invention are provided as described above with reference to Table 6 and FIG. 23, it can be seen that an emission efficiency of the red emission layer is maintained, and an emission efficiency of the blue emission layer is improved. As a result of this case, Tables 7 and 8 and FIG. 27 show a white organic light emitting device which is suitable for device characteristic because an emission efficiency of the red emission layer is not reduced and an emission intensity of each of the red emission layer and the blue emission layer increases.

The following Table 7 shows red efficiency and red color coordinates.

TABLE 7

| Structure | Red Efficiency | Red Coordinates |
|---|---|---|
| Comparative Example | 100% | 0.660, 0.336 |
| Embodiment 10 | 122% | 0.668, 0.329 |
| Embodiment 11 | 116% | 0.665, 0.331 |

In the comparative example of Table 7, an emission layer of a first emission part is formed as a blue emission layer, an emission layer of a second emission part is formed as a yellow-green emission layer, and an emission layer of a third emission part is formed as a blue emission layer.

In the embodiment 10, a first emission layer of the first emission part is a blue emission layer, and a second emission layer of the first emission part is a red emission layer which includes the green host and the red dopant of the embodiment 8-2 and the embodiment 9-2 respectively described above with reference to Tables 5 and 6. Also, the emission layer of the second emission part is formed as a yellow-green emission layer, and the emission layer of the third emission part is formed as a blue emission layer.

In the embodiment 11, the first emission layer of the first emission part is a blue emission layer, and the second emission layer of the first emission part is a red emission layer which includes the blue host and the red dopant of the embodiment 8-2 and the embodiment 9-2 respectively described above with reference to Tables 5 and 6. Also, the emission layer of the second emission part is formed as a yellow-green emission layer, and the emission layer of the third emission part is formed as a blue emission layer.

As shown in Table 7, when a red efficiency of the comparative example is 100%, a red efficiency of the embodiment 10 is 122%. It can be seen that a red efficiency of the embodiment 10 increases by about 22% compared to the comparative example. Also, referring to the red color coordinates, the comparative example has been measured as (0.660, 0.336), and the embodiment 10 has been measured as (0.668, 0.329). Therefore, it can be seen that the red color coordinates of the embodiment 10 are broadened compared to the comparative example.

Moreover, it can be seen that a red efficiency of the embodiment 11 increases by about 16% compared to the comparative example. Also, referring to the red color coordinates, the comparative example has been measured as (0.660, 0.336), and the embodiment 11 has been measured as (0.665, 0.331). Therefore, it can be seen that the red color coordinates of the embodiment 11 are broadened compared to the comparative example.

Therefore, when one emission part which is configured with a red emission layer and a blue emission layer is applied to a white organic light emitting device, the inventors have confirmed that an emission efficiency of the red emission layer and color coordinates are enhanced.

Figure 27:
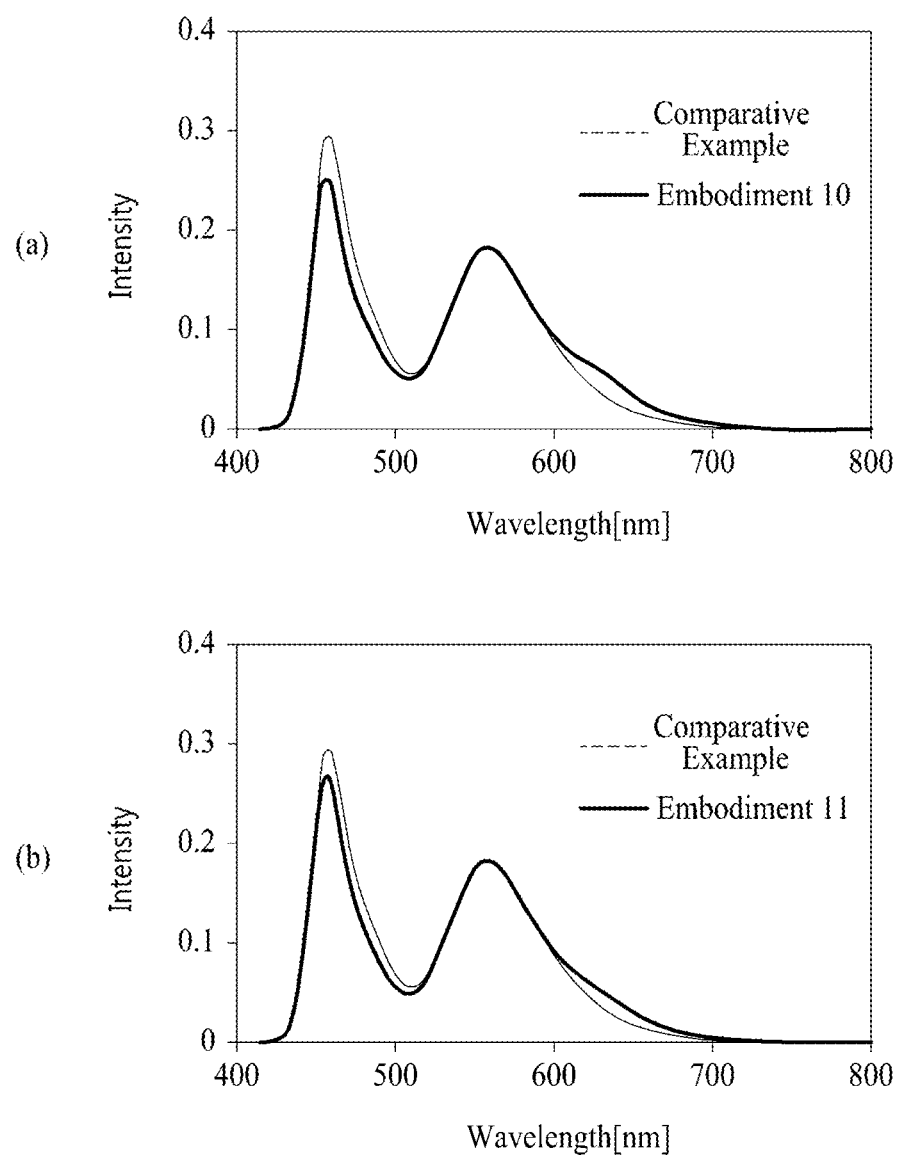
FIG. 27 is a diagram illustrating emission intensities of the white organic light emitting device according to the tenth embodiment of the present invention, the eleventh embodiment of the present invention and a comparative example.

FIG. 27 is a diagram showing an emission intensity of a white organic light emitting device. In FIG. 27, the abscissa axis indicates a wavelength range (nm) of light, and the ordinate axis indicates emission intensity. The emission intensity may be a numerical value which is expressed as a relative value with respect to a maximum value of the EL spectrum.

FIG. 27(a) shows an emission intensity of each of a comparative example and an embodiment 10, and FIG. 27(b) shows an emission intensity of each of the comparative example and an embodiment 11. In FIG. 27, the comparative example, the embodiment 10, and the embodiment 11 respectively have the same structures as those of Table 7, and thus, their detailed descriptions are not provided.

As shown in FIGS. 27(a) and 27(b), it can be seen that emission intensities of the embodiments 10 and 11 are slightly reduced at 440 nm to 480 nm, which is an emission peak of an emission area of a blue emission layer, in comparison with the comparative example. Also, it can be seen that emission intensities of the embodiments 10 and 11 are almost similar to that of the comparative example at 510 nm to 580 nm which is an emission peak of an emission area of a yellow-green emission layer. Also, it can be seen that emission intensities of the embodiments 10 and 11 increase at 600 nm to 650 nm, which is an emission peak of an emission area of a red emission layer, in comparison with the comparative example.

Accordingly, when the blue emission layer and the red emission layer are applied to a white organic light emitting device, it can be seen that an emission intensity of the blue emission layer and an emission intensity of the red emission layer increase.

Table 8 shows a result obtained by measuring quantum efficiencies, DCI color reproduction rates (DCI color space satisfaction levels or DCI coverages), and luminance of a comparative example and an embodiment of a white organic light emitting device.

Here, a DCI color reproduction rate may be referred to as a DCI color space satisfaction level. TVs which are being developed at present are required to satisfy a DCI P3 color gamut which is expanded by about 130% of the existing sRGB, for displaying a sharper and realistic image. DCI P3 may be an RGB color space and may be referred to as a color reproduction rate representing a color space which is broader than sRGB. However, DCI P3 is not limited thereto. The color reproduction rate may be referred to as a color space, a color area, a color reproduction area, a color reproduction range, or a color gamut. Also, depending on requirements of consumers and development of a product, the color reproduction rate may be changed in range and may be used as various terms. Also, coverage may be referred to as a range where DCI overlaps a color space of a display apparatus.

TABLE 8

| Structure | EQE (%) | DCI Color Reproduction Rate (%) | Luminance (%) |
|---|---|---|---|
| Comparative Example | 34.7 | 88% | 100% |

TABLE 8-continued

| Structure | EQE (%) | DCI Color Reproduction Rate (%) | Luminance (%) |
|---|---|---|---|
| Embodiment 10 | 34.6 | 92% | 111% |
| Embodiment 11 | 34.5 | 91% | 118% |

As shown in Table 8, it can be seen that in external quantum efficiency "EQE", the comparative example is 34.7%, the embodiment 10 is 34.6%, and the embodiment 11 is 34.5%. Therefore, it can be seen that the external quantum efficiency "EQE" of each of the embodiments 10 and 11 is maintained almost identically to that of the comparative example. Therefore, it can be seen that the external quantum efficiency "EQE" is not reduced even when one emission part is configured with two emission layers, and thus, an organic light emitting device where quantum efficiency is not reduced is implemented.

Moreover, when a DCI color reproduction rate (a DCI color space satisfaction level or DCI coverage) is 100%, the sharpest image quality is provided. As shown in Table 8, it can be seen that in the DCI color reproduction rate, the comparative example is 88%, the embodiment 10 is 92%, and the embodiment 11 is 91%. It can be seen that the DCI color reproduction rates of the embodiments 10 and 11 are further enhanced than that of the comparative example. This is because as a color purity of each of red and green increases, the DCI color reproduction rate increases. Therefore, it can be seen that the DCI color reproduction rate is not reduced even when one emission part is configured with two emission layers, and thus, an organic light emitting device with enhanced DCI color reproduction rate is implemented. Also, it can be seen that the DCI color reproduction rate is about 91% to about 92% by applying the structure according to the embodiments of the present invention. That is, it can be seen that an organic light emitting display apparatus which realizes sharper image quality than the comparative example is provided.

As a result of luminance comparison, it can be seen that luminance of the embodiments 10 and 11 is improved by about 11% to about 18% in comparison with the comparative example. Therefore, it can be seen that luminance is not reduced even when one emission part is configured with two emission layers, and thus, an organic light emitting device with enhanced luminance is implemented.

As described above, according to the embodiments of the present invention, at least one of two emission parts is configured with two emission layers including a red emission layer, and a position of the red emission layer is set, thereby enhancing a color viewing angle and at least one of red efficiency, green efficiency, and blue efficiency.

Moreover, according to the embodiments of the present invention, at least one of three emission parts is configured with two emission layers including a red emission layer, and a position of the red emission layer is set, thereby enhancing a color viewing angle and at least one of red efficiency, green efficiency, and blue efficiency.

Moreover, according to the embodiments of the present invention, a red emission layer is added into one emission part, and thus, an emission intensity of the red emission layer increases, thereby enhancing an emission efficiency of the red emission layer.

Moreover, according to the embodiments of the present invention, one emission part is configured with two emission layers (for example, a blue emission layer and a red emission layer), and the blue emission layer is disposed closer to a first electrode than the red emission layer, thereby enhancing an emission intensity of an emission layer and a color reproduction rate or a color viewing angle.

Moreover, according to the embodiments of the present invention, since a red emission layer is added into one emission part, a color purity of red increases, and DCI coverage is broadened. Accordingly, TVs having a large-size screen provide a sharper image.

Moreover, according to the embodiments of the present invention, two emission layers are included in one emission part, and an energy gap between a host and a dopant which are included in the two emission layers is adjusted, thereby enhancing a luminance and a color reproduction rate of an organic light emitting device.

Moreover, according to the embodiments of the present invention, two emission layers are included in one emission part, and an energy gap between a host and a dopant which are included in the two emission layers is adjusted. Accordingly, when two emission layers are included in one emission part, an emission efficiency of each of a blue emission layer and a red emission layer is enhanced, and a driving voltage is reduced.

Moreover, according to the embodiments of the present invention, provided is an organic light emitting device where despite one emission part being configured with two emission layers, a driving voltage does not increase, and quantum efficiency is not reduced.

Moreover, according to the embodiments of the present invention, by applying a TER-TEP structure having three emission peaks to three emission parts, emission efficiency, color purity, and a color reproduction rate or a color viewing angle are enhanced.

Figure 28:
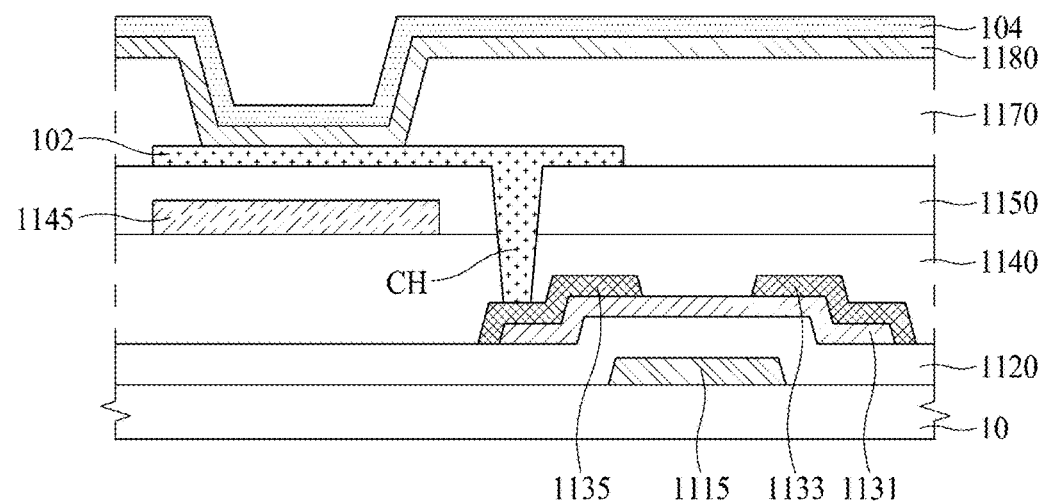
FIG. 28 is a diagram illustrating an organic light emitting display apparatus according to an embodiment of the present invention.

FIG. 28 is a cross-sectional view illustrating an organic light emitting device 1000 according to an embodiment of the present invention, and uses the above-described organic light emitting device according to the second to eleventh embodiments of the present invention.

As illustrated in FIG. 28, the organic light emitting device 1000 according to an embodiment of the present invention includes a substrate 10, a thin film transistor TFT, an overcoating layer 1150, a first electrode 102, an emission part 1180, and a second electrode 104. The TFT includes a gate electrode 1115, a gate insulator 1120, a semiconductor layer 1131, a source electrode 1133, and a drain electrode 1135.

In FIG. 28, the thin film transistor TFT is illustrated as having an inverted staggered structure, but may be formed in a coplanar structure.

The substrate 10 may be formed of an insulating material or a material having flexibility. The substrate 10 may be formed of glass, metal, or plastic, but is not limited thereto. When an organic light emitting display apparatus is a flexible organic light emitting display apparatus, the substrate 10 may be formed of a flexible material such as plastic.

The gate electrode 1115 may be formed on the substrate 10 and may be connected to a gate line (not shown). The gate electrode 1115 may include a multilayer formed of at least one among molybdenum (Mo), aluminum (Al), chromium (Cr), gold (Au), titanium (Ti), nickel (Ni), neodymium (Nd), and copper (Cu) or an alloy thereof.

The gate insulator 1120 may be formed on the gate electrode 1115 and may be formed of silicon oxide (SiOx), silicon nitride (SiNx), or a multilayer thereof, but is not limited thereto.

The semiconductor layer 1131 may be formed on the gate insulator 1120, and may be formed of amorphous silicon (a-Si), polycrystalline silicon (poly-Si), oxide semiconductor, or organic semiconductor. When the semiconductor layer 1131 is formed of oxide semiconductor, the semiconductor layer 1131 may be formed of indium tin oxide (ITO), indium zinc oxide (IZO), or indium tin zinc oxide (ITZO), but is not limited thereto. Also, an etch stopper (not shown) may be formed on the semiconductor layer 1131 and may protect the semiconductor layer 1131, but may be omitted depending on a configuration of a device.

The source electrode 1133 and the drain electrode 1135 may be formed on the semiconductor layer 1131. The source electrode 1133 and the drain electrode 1135 may be formed of a single layer or a multilayer, and may be formed of at least one among molybdenum (Mo), aluminum (Al), chromium (Cr), gold (Au), titanium (Ti), nickel (Ni), neodymium (Nd), and copper (Cu) or an alloy thereof.

A passivation layer 1140 may be formed on the source electrode 1133 and the drain electrode 1135, and may be formed of SiOx, SiNx, or a multilayer thereof. Alternatively, the passivation layer 1140 may be formed of an acryl resin or a polyimide resin, but is not limited thereto.

A color layer 1145 may be formed on the passivation layer 1140, and although only one sub-pixel is illustrated in the drawing, the color layer 1145 may be formed in each of a red sub-pixel, a blue sub-pixel, and a green sub-pixel. The color layer 1145 may include a red (R) color filter, a green (G) color filter, and a blue (B) color filter which are patterned and formed in respective sub-pixels. The color layer 1145 transmits light having only a specific wavelength among white lights emitted from the emission part 1180.

The overcoating layer 1150 may be formed on the color layer 1145 and may be formed of an acryl resin, a polyimide resin, SiOx, SiNx, or a multilayer thereof, but is not limited thereto.

The first electrode 102 may be formed on the overcoating layer 1150. The first electrode 102 may be electrically connected to the drain electrode 1135 through a contact hole CH which is formed in a certain area of the passivation layer 1140 and the overcoating layer 1150. In FIG. 28, the drain electrode 1135 is illustrated as being electrically connected to the first electrode 102, but the present embodiment is not limited thereto. As another example, the source electrode 1133 may be electrically connected to the first electrode 102 through the contact hole CH which is formed in the certain area of the passivation layer 1140 and the overcoating layer 1150.

A bank layer 1170 may be formed on the first electrode 102 and may define a pixel area. That is, the bank layer 1170 may be formed in a boundary area between a plurality of pixels, and thus, the pixel area may be defined by the bank layer 1170. The bank layer 1170 may be formed of an organic material such as a benzocyclobutene (BCB) resin, an acryl resin, or a polyimide resin. Alternatively, the bank layer 1170 may be formed of a photosensitive material containing a black pigment, and in this case, the bank layer 1170 may act as a light blocking member.

The emission part 1180 may be formed on the bank layer 1170. As illustrated in the second to eleventh embodiments of the present invention, the emission part 1180 may include a first emission part, a second emission part, and a third emission part which are formed on the first electrode 102. Alternatively, the emission part 1180 may include the first emission part and the second emission part.

The second electrode 104 may be formed on the emission part 1180.

Although not shown in FIG. 28, an encapsulation part may be formed on the second electrode 104. The encapsulation part prevents moisture from penetrating into the emission part 1180. The encapsulation part may include a plurality of layers where different inorganic materials are stacked, or include a plurality of layers where an inorganic material and an organic material are alternately stacked. Also, an encapsulation substrate may be further formed on the encapsulation part. The encapsulation substrate may be formed of glass, plastic, or metal. The encapsulation substrate may be adhered to the encapsulation part by an adhesive.

As described above, according to the embodiments of the present invention, at least one of three emission parts is configured with two emission layers including a red emission layer, and a position of the red emission layer is set, thereby enhancing a color viewing angle and at least one of red efficiency, green efficiency, and blue efficiency.

Moreover, according to the embodiments of the present invention, at least one of two emission parts is configured with two emission layers including a red emission layer, and a position of the red emission layer is set, thereby enhancing a color viewing angle and at least one of red efficiency, green efficiency, and blue efficiency.

Moreover, according to the embodiments of the present invention, a red emission layer is added into one emission part, and thus, an emission intensity of the red emission layer increases, thereby enhancing an emission efficiency of the red emission layer.

Moreover, according to the embodiments of the present invention, one emission part is configured with two emission layers (for example, a blue emission layer and a red emission layer), and the blue emission layer is disposed closer to a first electrode than the red emission layer, thereby enhancing an emission intensity of an emission layer and a color reproduction rate or a color viewing angle.

Moreover, according to the embodiments of the present invention, one emission part is configured with two emission layers (for example, a blue emission layer and a red emission layer), and the blue emission layer is disposed closer to a second electrode than the red emission layer, thereby enhancing an emission intensity of an emission layer and a color reproduction rate or a color viewing angle.

Moreover, according to the embodiments of the present invention, a red emission layer is added into one emission part, and by applying a green emission layer, a color purity of red and a color purity of green increase, and a digital cinema initiatives (DCI) coverage is broadened. Accordingly, televisions (TVs) having a large-size screen provide a sharper image.

Moreover, according to the embodiments of the present invention, two emission layers are included in one emission part, and an energy gap between a host and a dopant which are included in the two emission layers is adjusted, thereby enhancing a luminance and a color reproduction rate of an organic light emitting device.

Moreover, according to the embodiments of the present invention, two emission layers are included in one emission part, and an energy gap between a host and a dopant which are included in the two emission layers is adjusted. Accordingly, when two emission layers are included in one emission part, an emission efficiency of each of a blue emission layer and a red emission layer is enhanced, and a driving voltage is reduced.

Moreover, according to the embodiments of the present invention, provided is an organic light emitting device where despite one emission part being configured with two emission layers, a driving voltage does not increase, and quantum efficiency is not reduced.

Moreover, according to the embodiments of the present invention, by applying a three emission region-three emission peak (TER-TEP) structure having three emission peaks to three emission parts, emission efficiency, color purity, and a color reproduction rate or a color viewing angle are enhanced.

In a two-stack structure, each of first and second emission parts may have one or more emission parts, and thus, two or more emission peaks are overall provided. Also, in a three-stack structure, each of first to third emission parts may have one or more emission parts, and thus, three or more emission peaks are overall provided.

The effects of the present invention are not limited to the aforesaid, but other effects not described herein will be clearly understood by those skilled in the art from descriptions below.

The details of the present invention described in technical problem, technical solution, and advantageous effects do not specify essential features of claims, and thus, the scope of claims is not limited by the details described in detailed description of the invention.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A white organic light emitting device comprising:
   a first emission part between a first electrode and a second electrode, wherein the first electrode is an anode and the second electrode is a cathode;
   a second emission part on the first emission part; and
   a third emission part on the second emission part,
   wherein the first emission part includes an emission layer having a red emission layer to enhance an emission efficiency and a color reproduction rate or a color viewing angle, and the first to third emission parts have a three-emission region-three emission peak (TER-TEP) structure having three or more emission peaks, wherein the first emission part comprises the red emission layer and a blue emission layer, wherein the blue emission layer is closer to the first electrode than the red emission layer is to the first electrode.

2. The white organic light emitting device of claim 1, wherein a host in the red emission layer comprises a host having a shorter wavelength range than a wavelength range of red so that an emission efficiency of each of the blue emission layer and the red emission layer is enhanced and a driving voltage is reduced.

3. The white organic light emitting device of claim 1, wherein an energy gap between a host and a dopant in the red emission layer is greater than an energy gap between a host and a dopant in the blue emission layer, so that an emission efficiency of each of the blue emission layer and the red emission layer is enhanced and a driving voltage is reduced.

4. The white organic light emitting device of claim 3, wherein the energy gap of the host in the blue emission layer is 2.8 eV to 3.2 eV, and the energy gap of the dopant in the blue emission layer is 2.6 eV to 3.0 eV.

5. The white organic light emitting device of claim 3, wherein the energy gap of the host in the red emission layer is 2.6 eV to 3.0 eV, and the energy gap of the dopant in the red emission layer is 1.8 eV to 2.2 eV.

6. The white organic light emitting device of claim 3, wherein the energy gap between the host and the dopant in the blue emission layer is equal to or less than 0.4 eV, and the energy gap between the host and the dopant in the red emission layer is greater than 0.4 eV and 1.2 eV or less.

7. The white organic light emitting device of claim 1, wherein the first emission part has two emission peaks, and the two emission peaks are within a range of 440 nm to 480 nm and within a range of 600 nm to 650 nm.

8. The white organic light emitting device of claim 7, wherein the second emission part has an emission peak which is within a range of 510 nm to 580 nm, and the third emission part has an emission peak which is within a range of 440 nm to 480 nm.

9. The white organic light emitting device of claim 7, wherein the second emission part has an emission peak which is within a range of 440 nm to 480 nm, and the third emission part has an emission peak which is within a range of 510 nm to 580 nm.

10. A white organic light emitting device comprising:
    a first emission part between a first electrode and a second electrode;
    a second emission part on the first emission part; and
    a third emission part on the second emission part,
    wherein at least one of the first to third emission parts includes an emission layer having a red emission layer to enhance an emission efficiency and a color reproduction rate or a color viewing angle, and the first to third emission parts have a three-emission region-three emission peak (TER-TEP) structure having three or more emission peaks,
    wherein the third emission part comprises the red emission layer and a blue emission layer, and
    wherein the first emission part has an emission peak which is within a range of 510 nm to 580 nm, and the second emission part has an emission peak which is within a range of 440 nm to 480 nm.

11. The white organic light emitting device of claim 10, wherein an energy gap between a host and a dopant in the red emission layer is greater than an energy gap between a host and a dopant in the blue emission layer.

12. The white organic light emitting device of claim 11, wherein the energy gap of the host in the blue emission layer is 2.8 eV to 3.2 eV, and the energy gap of the dopant in the blue emission layer is 2.6 eV to 3.0 eV.

13. The white organic light emitting device of claim 11, wherein the energy gap of the host in the red emission layer is 2.6 eV to 3.0 eV, and the energy gap of the dopant in the red emission layer is 1.8 eV to 2.2 eV.

14. The white organic light emitting device of claim 11, wherein the energy gap between the host and the dopant in the blue emission layer is equal to or less than 0.4 eV, and the energy gap between the host and the dopant in the red emission layer is greater than 0.4 eV and 1.2 eV or less.

15. The white organic light emitting device of claim 10, wherein the blue emission layer is closer to the second electrode than the red emission layer.

16. A white organic light emitting device comprising:
    a first emission part between a first electrode and a second electrode;
    a second emission part on the first emission part; and
    a third emission part on the second emission part,
    wherein at least one of the first to third emission parts includes at least two emission layers having a red emission layer and a blue emission layer,
    wherein when the first emission part includes the at least two emission layers, the blue emission layer is closer to the first electrode than the red emission layer, or when the third emission part includes the at least two emission layers, the blue emission layer is closer to the second electrode than the red emission layer, and wherein an energy gap between a host and a dopant in the red emission layer is greater than an energy gap between a host and a dopant in the blue emission layer.

17. The white organic light emitting device of claim 16, wherein the energy gap of the host in the blue emission layer is 2.8 eV to 3.2 eV, and the energy gap of the dopant in the blue emission layer is 2.6 eV to 3.0 eV.

18. The white organic light emitting device of claim 16, wherein the energy gap of the host in the red emission layer is 2.6 eV to 3.0 eV, and the energy gap of the dopant in the red emission layer is 1.8 eV to 2.2 eV.

19. The white organic light emitting device of claim 16, wherein the energy gap between the host and the dopant in the blue emission layer is equal to or less than 0.4 eV, and the energy gap between the host and the dopant in the red emission layer is greater than 0.4 eV and 1.2 eV or less.

20. The white organic light emitting device of claim 16, wherein the second emission part has an emission peak which is within a range of 510 nm to 570 nm, or 540 nm to 580 nm.

21. A white organic light emitting device comprising:
a first emission part between a first electrode and a second electrode; and
a second emission part on the first emission part;
wherein a third emission part includes at least two emission layers, and the at least two emission layers comprise a red emission layer and a blue emission layer, and
wherein an energy gap between a host and a dopant in the red emission layer is greater than an energy gap between a host and a dopant in the blue emission layer.

22. The white organic light emitting device of claim 21, wherein the energy gap of the host in the blue emission layer is 2.8 eV to 3.2 eV, and the energy gap of the dopant in the blue emission layer is 2.6 eV to 3.0 eV.

23. The white organic light emitting device of claim 21, wherein the energy gap of the host in the red emission layer is 2.6 eV to 3.0 eV, and the energy gap of the dopant in the red emission layer is 1.8 eV to 2.2 eV.

24. The white organic light emitting device of claim 21, wherein the energy gap between the host and the dopant in the blue emission layer is equal to or less than 0.4 eV, and the energy gap between the host and the dopant in the red emission layer is greater than 0.4 eV and 1.2 eV or less.

25. The white organic light emitting device of claim 21, wherein the blue emission layer is closer to the second electrode than the red emission layer.

26. The white organic light emitting device of claim 21, wherein an emission peak of the second emission part is within a range of 510 nm to 570 nm, or 540 nm to 580 nm.

27. The white organic light emitting device of claim 21, further comprising the third emission part on the second emission part, and an emission peak of the third emission part is within a range of 440 nm to 480 nm.

* * * * *